(12) United States Patent
Hans et al.

(10) Patent No.: US 8,694,703 B2
(45) Date of Patent: *Apr. 8, 2014

(54) HARDWARE-ACCELERATED LOSSLESS DATA COMPRESSION

(75) Inventors: Madhsudan Hans, San Ramon, CA (US); Kung-Ling Ko, Union City, CA (US)

(73) Assignee: Brocade Communications Systems, Inc., San Jose, CA (US)

(*) Notice: Subject to any disclaimer, the term of this patent is extended or adjusted under 35 U.S.C. 154(b) by 973 days.

This patent is subject to a terminal disclaimer.

(21) Appl. No.: 12/796,812

(22) Filed: Jun. 9, 2010

(65) Prior Publication Data

US 2011/0307659 A1    Dec. 15, 2011

(51) Int. Cl.
  *G06F 13/12*    (2006.01)
  *G06F 12/00*    (2006.01)

(52) U.S. Cl.
  USPC ............................................ 710/65; 707/797

(58) Field of Classification Search
  USPC ............................................................ 710/65
  See application file for complete search history.

(56) References Cited

U.S. PATENT DOCUMENTS

| | | | |
|---|---|---|---|
| 4,009,347 A | 2/1977 | Flemming et al. | |
| 4,242,538 A | 12/1980 | Ito et al. | |
| 4,259,549 A | 3/1981 | Stehman | |
| 4,541,076 A | 9/1985 | Bowers et al. | |
| 4,596,010 A | 6/1986 | Beckner et al. | |
| 4,599,490 A | 7/1986 | Cornell et al. | |
| 4,817,089 A | 3/1989 | Paneth et al. | |
| 4,827,499 A | 5/1989 | Warty et al. | |
| 4,875,039 A | 10/1989 | Andros et al. | |
| 4,876,541 A | 10/1989 | Storer | |
| 4,879,740 A | 11/1989 | Nagashima et al. | |
| 4,896,346 A | 1/1990 | Belfield et al. | |
| 4,970,723 A | 11/1990 | Lin | |
| 5,049,881 A | 9/1991 | Gibson et al. | |
| 5,133,001 A | 7/1992 | Bohm | |
| 5,157,660 A | 10/1992 | Kuwahara et al. | |
| 5,210,787 A | 5/1993 | Hayes et al. | |
| 5,278,890 A | 1/1994 | Beeson, Jr. et al. | |

(Continued)

OTHER PUBLICATIONS

"Hitachi's Data De-duplication Appliances Extending Performance and Scalability to the Midrange Market;" A White Paper by ITCentrix; Feb. 2008; pp. 1-15; retrieved from: http://www.hds.com/assets/pdf/hitachis-data-de-duplication-appliances.pdf.

(Continued)

*Primary Examiner* — Titus Wong
(74) *Attorney, Agent, or Firm* — Wong, Cabello, Lutsch, Rutherford & Brucculeri, L.L.P.

(57) ABSTRACT

Systems for hardware-accelerated lossless data compression are described. At least some embodiments include data compression apparatus that includes a plurality of hash memories each associated with a different lane of a plurality of lanes (each lane including data bytes of a data unit being received by the compression apparatus), an array including array elements each including a plurality of validity bits (each validity bit within an array element corresponding to a different lane of the plurality of lanes), control logic that initiates a read of a hash memory entry if a corresponding validity bit indicates that said entry is valid, and an encoder that compresses at least the data bytes for the lane associated with the hash memory comprising the valid entry if said valid entry comprises data that matches the lane data bytes.

19 Claims, 38 Drawing Sheets

(56) References Cited

U.S. PATENT DOCUMENTS

| | | | |
|---|---|---|---|
| 5,278,892 | A | 1/1994 | Bolliger et al. |
| 5,412,660 | A | 5/1995 | Chen et al. |
| 5,485,526 | A * | 1/1996 | Tobin .......................... 382/232 |
| 5,990,810 | A | 11/1999 | Williams |
| 5,999,810 | A | 12/1999 | Fuentes |
| 6,493,825 | B1 | 12/2002 | Blumenau et al. |
| 6,757,767 | B1 | 6/2004 | Kelleher |
| 6,845,387 | B1 | 1/2005 | Prestas et al. |
| 6,934,796 | B1 * | 8/2005 | Pereira et al. ................. 711/108 |
| 8,051,050 | B2 * | 11/2011 | Popovski et al. ............. 707/692 |
| 8,205,065 | B2 * | 6/2012 | Matze ........................... 711/216 |
| 8,321,648 | B2 * | 11/2012 | Condict ........................ 711/170 |
| 8,370,315 | B1 * | 2/2013 | Efstathopoulos et al. .... 707/696 |
| 8,380,688 | B2 * | 2/2013 | Gruhl et al. .................. 707/698 |
| 2003/0018647 | A1 * | 1/2003 | Bialkowski ................... 707/101 |
| 2009/0254609 | A1 | 10/2009 | Wideman |
| 2011/0016152 | A1 | 1/2011 | Popovski et al. |
| 2011/0238635 | A1 | 9/2011 | Leppard |
| 2011/0246741 | A1 | 10/2011 | Raymond et al. |
| 2011/0276744 | A1 | 11/2011 | Sengupta et al. |

OTHER PUBLICATIONS

Russ Fellows; "Data dedupilcation tutorial;" SearchDataBackup. com; Jan. 29, 2009; pp. 1-2; TechTarget The Technology Media ROI Experts.

Rahnema, "Overview of the GSM System and Protocol Architecture" IEEE Communication Magazine, Apr. 1993, 9 pages.

Quantum, StorNext Q-Series Storage, "Configuring and Maintaining a Storage Array Using the CLI", 6-67531-01 Rev A, Dec. 2011, 114 pages.

"Optimizing the performance of HP LTO Ultrium 3, Getting the most from a high-performance tape drive", Hewlett-Packard Development Company, L.P., Developed in Feb. 2005, 51 pages.

Athicha Muthitacharoen, et al., "A Low-bandwidth Network File System," MIT Laboratory for Computer Science and NYU Department of Computer Science, 14 pages.

Udi Manber, "Finding Similar Files in a Large File System," Oct. 1993, TR 93-33, Department of Computer Science, The University of Arizona, Tuscon Arizona, 11 pages.

Andrei Z. Broder, "Some applications of Rabin's fingerprinting method," Published in R. Capocelli, A. De Santis, et al., "Sequences II: Methods in Communications, Security, and Computer Science", Springer-Verlag, 1993, 10 pages.

Sergey Brin, et al., "Copy Detection Mechanisms for Digital Documents," 1995, Department of Computer Science, Stanford University, Stanford, California, 12 pages.

Zhu, et al., "Avoiding the Disk Bottleneck in the Data Domain Deduplication File System," Proceedings of the 6th USENIX Conference 2008, 14 pages.

Aronovich, et al., "The Design of a Similarity Based Deduplication System," SYSTOR'09, May 4-6, Haifa, Israel, 2009, 14 pages.

* cited by examiner

Literal Command

| b34 | b33-b32 | b31-b24 / b23-b16 | b15-b8 / b7-b0 | | |
|---|---|---|---|---|---|
| 0 | L | Byte 3 | Byte 2 | Byte 1 | Byte 0 |

| L Field | Byte 3 | Byte 2 | Byte 1 | Byte 0 |
|---|---|---|---|---|
| 01 | Valid | | | |
| 10 | Valid | Valid | | |
| 11 | Valid | Valid | Valid | |
| 00 | Valid | Valid | Valid | Valid |

Match Command

| b34-b32 | b31 | b30 | b29-b26 | b25-b16 | b15-b12 | b11-b0 |
|---|---|---|---|---|---|---|
| 100 | X | Y | Rsvd | Length | Rsvd | Offset |

X — (Length < 128)
Y — (Length < 9) and (Offset < 2048)

EOF Command

| b34-b33 | b32-b1 | b0 |
|---|---|---|
| 11 | Reserved | E |

FIG. 15A

Literal Records

Rec Type 0x00
(Up to 256 bytes)

N Literal Bytes

Rec Type 0x01 to 0x0F
(4 to 18 bytes)

N+3 Literal Bytes

Match Records

Rec Type 0x20 (Length < 1024; 1 < Offset < 4096)

T Trailing Literal Bytes

Rec Type 0x20 to 0x3F (3 < Length < 128; 1 < Offset < 4096)

T Trailing Literal Bytes

Rec Type 0x40 to 0xFF (2 < Length < 8; 1 < Offset < 2049)

T Trailing Literal Bytes

EOF Record

0x1F

HARDWARE-ACCELERATED LOSSLESS DATA COMPRESSION

BACKGROUND

As the speed and size of networked computer systems have continued to increase, so has the amount of data stored within, and exchanged between, such systems. While a great deal of effort has been focused on developing larger and more dense storage devices, as well as faster networking technologies, the continually increasing demand for storage space and networking bandwidth has resulted in the development of technologies that further optimize the storage space and bandwidth currently available on existing storage devices and networks. One such technology is data compression, wherein the data saved to a storage device, or transmitted across a network, is manipulated by software to reduce the total number of bytes required to represent the data, and thus reduce the storage and bandwidth required to store and/or transmit the data.

Data compression can be divided into two general categories: lossy data compression and lossless data compression. As the terms imply, lossy data compression (sometimes referred to as perceptual coding) allows for some loss of fidelity in the encoded information, while lossless data compression requires that the decompressed data must be an exact copy of the original data, with no alterations or errors. While lossy data compression may be suitable for applications that process audio, image and/or video data, a great many other data processing applications require the fidelity provided by lossless data compression.

Most existing lossless data compression techniques are iterative in nature, and generally are optimized for software implementations. These software-based lossless compression techniques are typically not well suited for use in applications requiring high speed/low latency data throughput, where even small processing delays may be unacceptable. Some hardware-based implementations do exist, but many such implementations process one byte at a time, and are thus limited to the clock frequency at which the hardware can be operated. Other hardware implementations are capable of processing multiple byes at one time, but these implementations do so at the expense of compression efficiency.

While data compression techniques attempt to addresses storage space and bandwidth concerns by reducing the amount of data that is stored on (and transmitted to and from) a storage device, other techniques attempt to address bandwidth concerns by limiting the number of times data is read from and written to the storage devices. One such technique is "caching," wherein a copy of the desired data on the storage device is maintained in memory after an initial read or write, and subsequent accesses to the data are directed to the in-memory copy. While caching works well for data that is stored together in one area of a disk (e.g., within adjacent sectors) or related areas (e.g., different platters but within the same cylinder), wherein the data is retrieved within either a single access or a small number of sequential accesses with minimal repositioning of the read/write head of the storage device, it does not work well with data that is distributed over different areas within a storage device or even different storage devices. Such a distribution can occur in data that is heavily modified after its initial storage, particularly in systems that use "thin provisioning" combined with "sparse mapping."

In systems that combine thin provisioning with sparse mapping, storage is virtualized and appears as being allocated when requested (e.g., by opening a file or creating a directory), but the actual physical storage is only allocated on an "as-needed"basis when the data is actually written to disk (i.e., allocated on an I/O-basis). Further, different files and file systems are "sparsely" distributed (i.e., mapped) over the logical block address space of the virtual disk (i.e., separated by large unused areas within the address space), but are sequentially allocated physically adjacent storage blocks on the physical disk. As a result, adjacent blocks on the physical disk can be associated with different files on the virtual disk. Further, as files are modified and expand, the additional file extents could be allocated anywhere on the physical disk, frequently within unrelated areas that are not anywhere near the originally allocated portions of the file (a condition sometimes referred to as "file fragmentation").

While thin provisioning combined with sparse mapping can result in efficient use of available storage resources which can be expanded as needed, rather than pre-allocated in bulk up front (sometimes referred to as "fat provisioning"), over time thin provisioning can result in significant file fragmentation. This fragmentation can result in the loss of any performance gains achieved by caching, and can even result in a performance penalty, wherein the system performs worse with caching enabled than with caching disabled. Such a performance penalty is due to the overhead associated with updating the cache each time old data is flushed from the cache and new data is read into the cache from the storage device (or written into the cache from a host device writing to the storage device).

SUMMARY

Systems for hardware-accelerated lossless data compression are described herein. At least some example embodiments include a data compression apparatus, that includes a plurality of hash memories each associated with a different lane of a plurality of lanes (each lane including data bytes of a data unit being received by the compression apparatus) and an array including array elements each including a plurality of validity bits (each validity bit within an array element corresponding to a different lane of the plurality of lanes). The data compression apparatus further includes control logic (coupled to the plurality of hash memories and the array) that initiates a read of a hash memory entry if a corresponding validity bit indicates that said entry is valid and an encoder (coupled to the plurality of hash memories and the control logic) that compresses at least the data bytes for the lane associated with the hash memory comprising the valid entry if said valid entry comprises data that matches the lane data bytes.

Other example embodiments include a de-duplication processing systems that includes one or more of the above-described data compression apparatuses. Still other example embodiments include an intelligent storage system that includes one or more of the aforementioned de-duplication processing systems as subsystems, while other example embodiments include a storage area network that includes one or more of the aforementioned intelligent storage systems.

Example embodiments also include a method for data compression performed by a compression engine that includes associating a plurality of hash memories each with a different lane of a plurality of lanes and each lane including data bytes of a data unit being received by the compression apparatus and storing a plurality of validity bits within each a plurality of array elements (each validity bit within an array element corresponding to a different lane of the plurality of lanes). The method further includes initiating a read of a hash memory entry if a corresponding validity bit indicates that said entry is valid and compressing at least the data bytes for the lane associated with the hash memory comprising the valid entry if said valid entry comprises data that matches the lane data bytes.

BRIEF DESCRIPTION OF THE DRAWINGS

For a detailed description of at least some example embodiments, reference will now be made to the accompanying drawings in which:

FIG. 15A shows the format of commands transmitted by the pre-encoder control to the encoder of FIGS. 13A and 17A, in accordance with at least some example embodiments;

DETAILED DESCRIPTION

Functional Overview

Figure 1A:
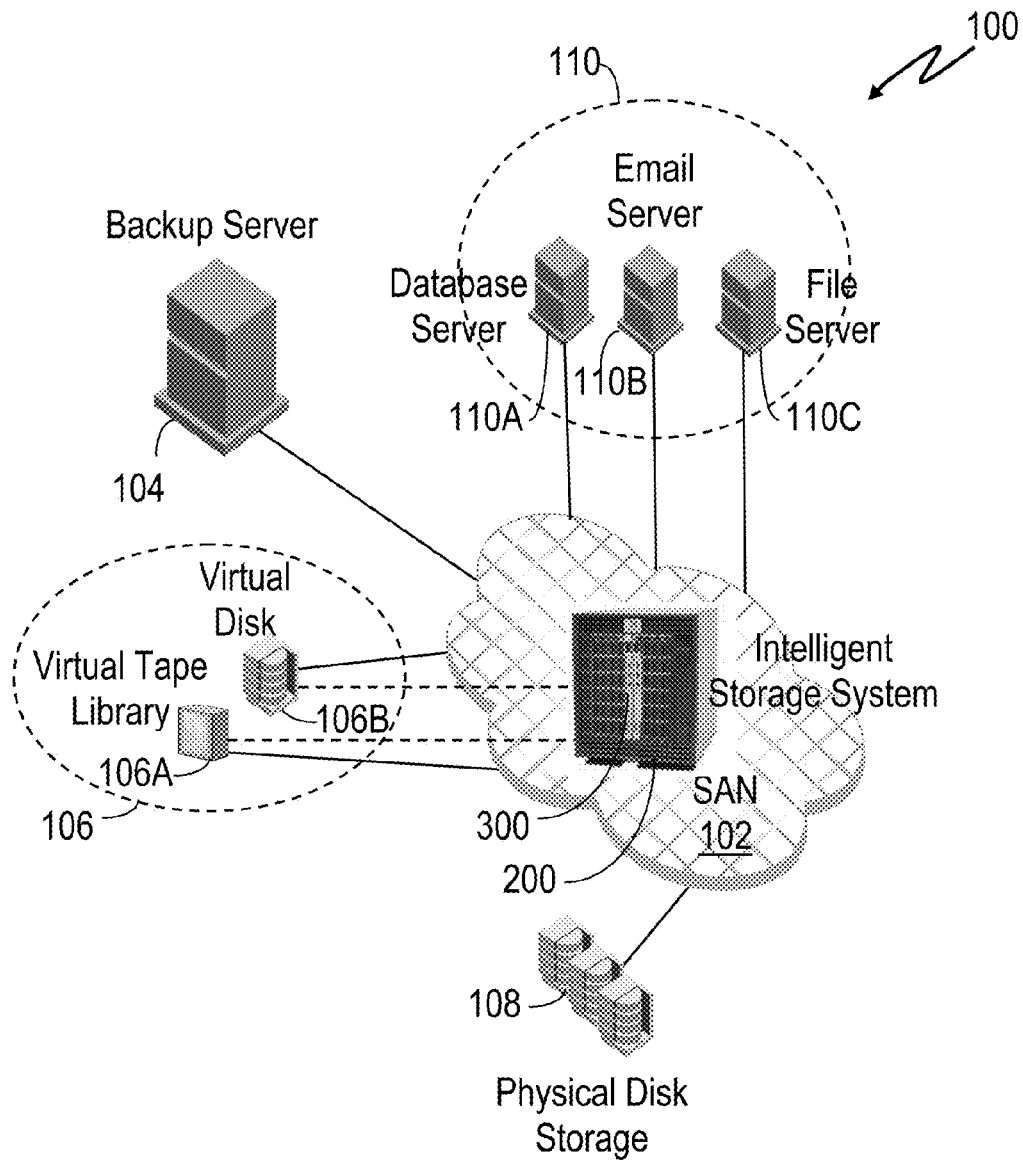
FIG. 1A shows a block diagram of a computer system incorporating lossless data compression implemented as part of director-level switch in accordance with at least some example embodiments.

A block diagram is shown in FIG. 1A that illustrates a computer system 100 incorporating lossless data compression, hierarchal sparse logical block address (LBA) mapping and thin storage provisioning implemented in accordance with at least some example embodiments. An intelligent storage system 200 is shown implemented as a director-level switch that forms storage area network (SAN) 102. SAN 102 interconnects backup server 104, application servers 110 (database server 110A, email server 110B and file server 110C), and physical disk storage 108. Physical disk storage 108 may be accessed directly by any of the servers shown in FIG. 1A, or may alternatively be accessed indirectly through virtual devices 106 (virtual tape library 106A and virtual disk 106B) presented on SAN 102 by intelligent storage system 200. Virtual devices 106 provide an abstraction layer that isolates the servers 104 and 110 from physical disk storage device 108. The isolation provided by this abstraction layer allows the actual configuration of physical disk storage 108 to be relatively independent of the configuration required by the servers 104 and 110. Thus, for example, while database server 110A may be configured to access a single 128 Gbyte hard disk (seen as virtual disk 106B), the actual configuration of the portion of physical disk storage 108 accessed by intelligent storage system 200 to support virtual disk 106B may be an array of four 128 Gbyte disk drives configured for RAID 4 operation. Similarly, backup server 104 may be configured to access virtual tape library 106A, which may in actuality be implemented using physical disk storage 108. In this example, the use of a disk drive to store the backup data, rather than an actual tape library, is transparent to backup server 104.

Figure 1B:
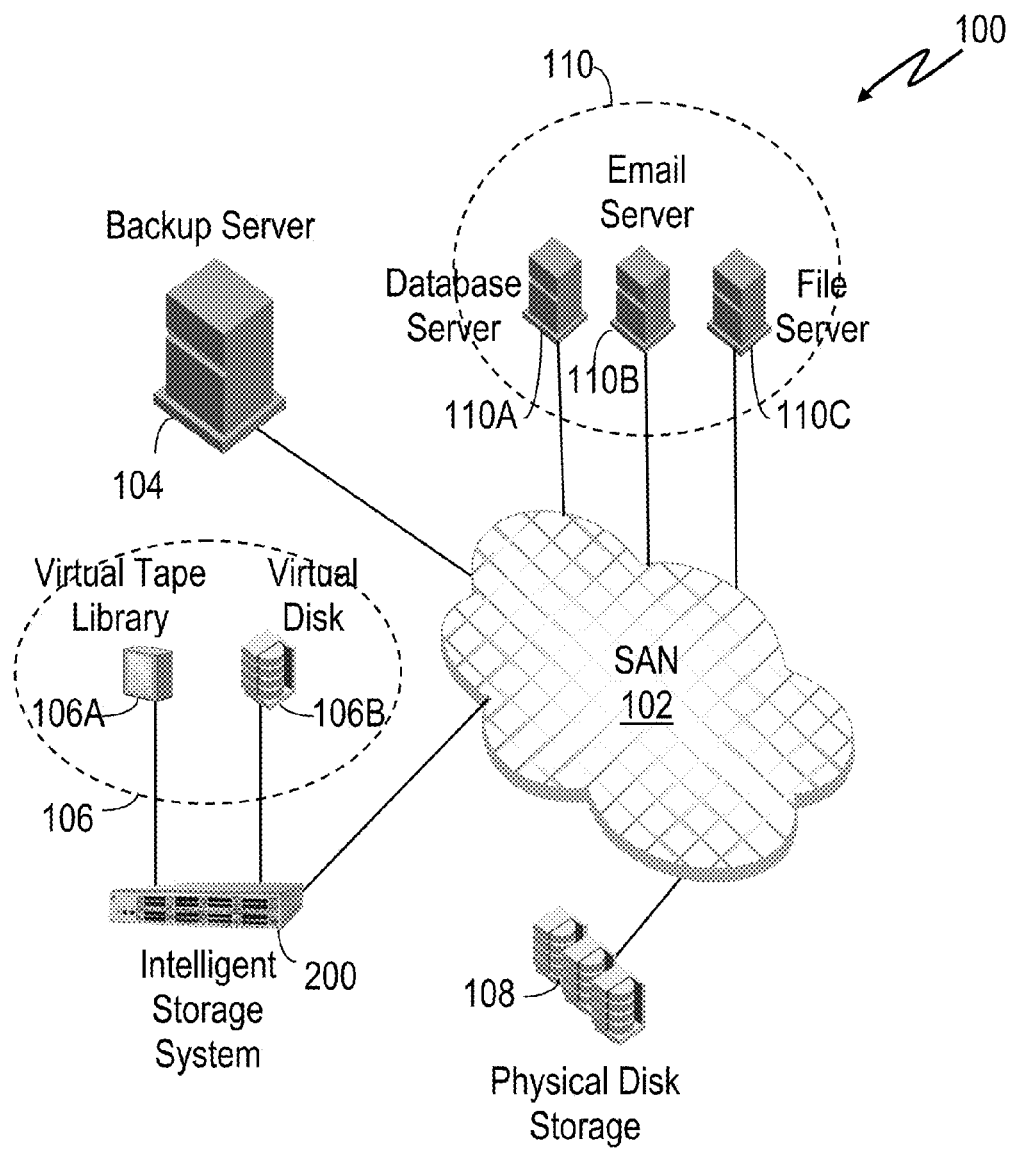
FIG. 1B shows a block diagram of a computer system incorporating lossless data compression implemented as a stand-alone de-duplication system in accordance with at least some example embodiments.

In other example embodiments such as that shown in FIG. 1B, intelligent storage system 200 may be implemented as a stand-alone system that includes the same or similar hardware as the deduplication blade 300 of FIG. 1A. Such an embodiment includes a switch that couples to, and is part of the SAN 102. In all other regards, the intelligent storage system 200 of FIG. 1B operates in the same manner, and provides the same functionality, as the intelligent storage system 200 of FIG. 1A. Although the examples described below are presented within the context of deduplication blade within an intelligent storage system implemented as a director-level storage switch, it is understood that a wide variety of hardware and/or software configurations may be suitable for implementing the data deduplication and/or data compression/decompression functionality described herein, and all such configurations are contemplated by the present disclosure.

In addition to isolating servers from the actual, physical hardware configuration of the storage devices, the abstraction layer created by the device virtualization of intelligent storage system 200 provides a common point in the data flow wherein data being written to or read from physical disk storage 108 may be deduplicated (described below), compressed and decompressed; wherein a variety of different virtual-to-physical LBA mappings can be implemented; and wherein the provisioning of storage space can be controlled and optimized. Because these operations are performed within intelligent storage system 200, such data deduplication, data compression and decompression, LBA mapping, and storage provisioning may be performed in a manner that is transparent to servers 104 and 110. Further, these operations are also transparent to physical disk storage 108, which stores the data as received from intelligent storage system 200.

In at least some embodiments, intelligent storage system 200 can implement lossless data compression at two different levels: 1) between blocks of data, wherein duplicate blocks of data are identified and replaced with a pointer to a single copy of the data block saved on the storage system; and 2) within a block of data, wherein duplicate byte sequences within a single block of data are identified and replaced with a pointer to a single copy of the sequence within the data block. As intelligent storage system 200 receives data to be stored on the storage system, the data is grouped into data blocks referred to as "chunks." If all of the data within a chunk is identified as having already been stored onto the storage system, the descriptor of the object being stored is modified to point to the chunk already stored on the storage system, rather than to point to a new chunk that would needlessly store a duplicate copy of an existing chunk. Such elimination of duplicated chunks is referred to as "deduplication" (also sometimes referred to as "capacity optimization" or "single-instance storage"). Additional structures (described below) keep track of the number of references to the chunk, thus preventing its deletion until the last object referencing the chunk is deleted.

Although the elimination of duplicated blocks and of duplicated data within a block are both considered forms of lossless data compression, different terms are used herein for each in order to distinguish between the two forms of lossless compression. Thus, throughout the remainder of this disclosure the term "deduplication" is used to refer to the elimination of duplicate chunks by storing one instance of a chunk that is referenced by multiple occurrences of the chunk within a virtualized storage device. Further, the term "compression" is used throughout the disclosure to refer to the elimination of duplicate byte sequences within a chunk, and the term "decompression" is used to refer to the reconstruction or regeneration of the original data within a previously "compressed" chunk.

Figure 1C:
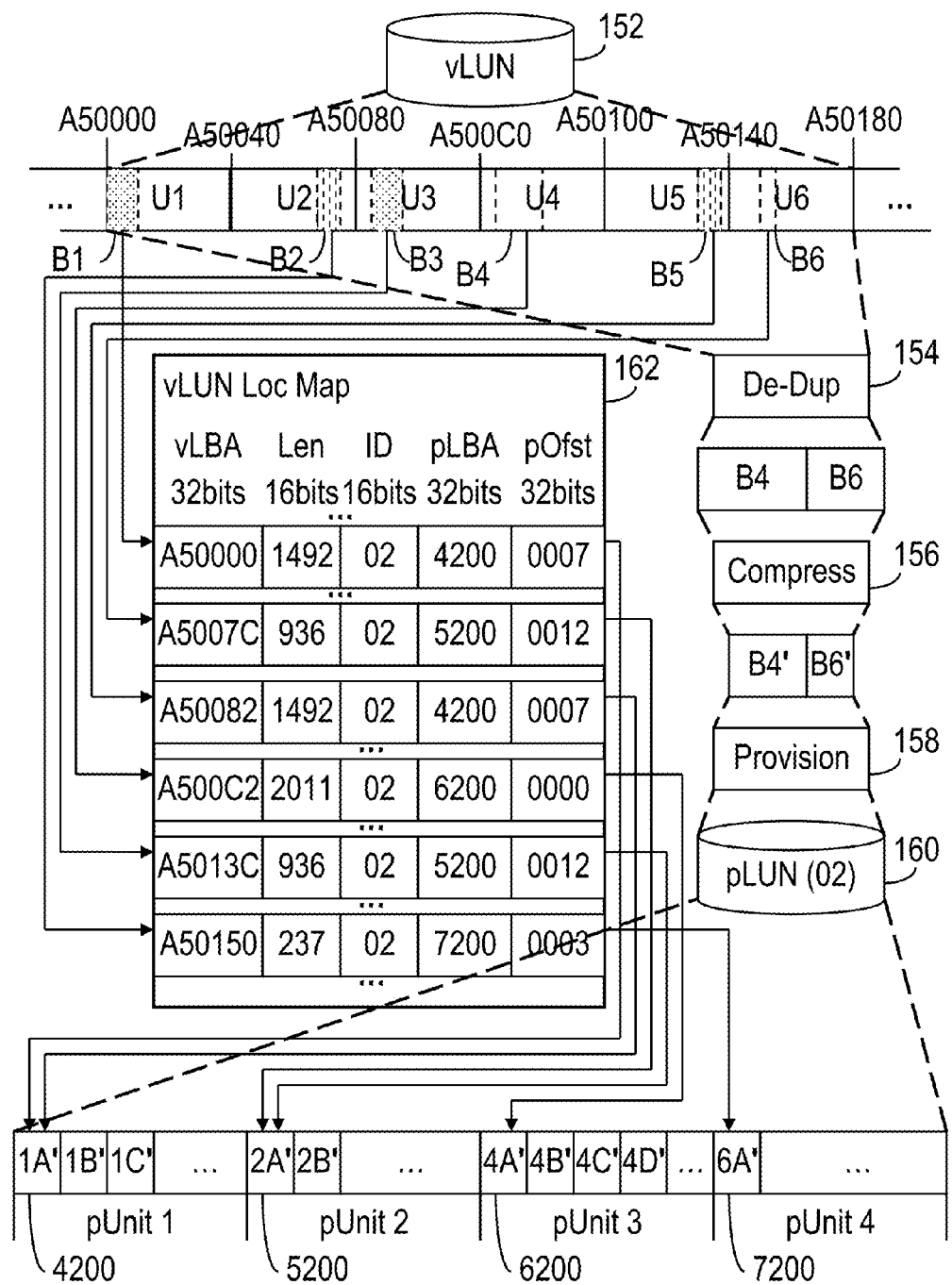
FIG. 1C shows a block diagram that illustrates the operations performed on data that is stored on a physical LUN that is presented on a SAN as a virtual LUN, in accordance with at least some example embodiments.

FIG. 1C shows a block diagram that illustrates an example of how the above-described operations may be performed by intelligent storage system 200 when data is written to a virtual LUN (e.g., vLUN 152), in accordance with at least some embodiments. In the example shown, two virtual LUN data units (U1 and U2 corresponding to pLUN data units pUnit 1 and pUnit 2 respectively) are already allocated on the physical disk, while 4 new data units (U3 through U6) are to be allocated to vLUN 152 (if not already allocated). The existing vLUN data units are assigned vLUN starting LBAs A50000-A5007F, and the new vLUN data units will be assigned vLUN LBAs A50080-A5017F. As indicated by the fill patterns, logical blocks B1 and B3 within data units U1 and U3 contain identical data, as do logical blocks B2 and B5 within data units U2 and U5 respectively. vLUN 152 uses logical blocks or extents that are variable in size, the size of which are each determined by the algorithm that defines the chunks used by deduplication function (De-Dup) 154. Thus, each logical block on the vLUN correlates to a "chunk" of data stored on backend physical LUN (pLUN) 160.

When the four new vLUN logical blocks are processed by deduplication function 154, blocks B3 and B5 are identified as duplicates and not saved again to the storage device. Instead, vLUN location map (vLUN Loc Map) 162, which maps the vLUN LBAs to the corresponding pLUN LBAs and starting LBA offsets, is updated such that the vLUN location map entry corresponding to vLUN LBA A50082 (block B3) maps to the same pLUN LBAs and starting offset (4200-4202 starting at offset 0007) as vLUN LBA A50000 (block B1). Similarly, the vLUN location map entry for vLUN LBA A5013C (block B5) is updated to map to the same pLUN LBAs and starting offset (5200-5201 starting at offset 0012) as vLUN LBA A5007C (block B2). In at least some embodiments, the vLUN location map is implemented as B+ search tree, wherein the vLUN LBA operates as the key of the tree, and the leaves contain the information necessary to access the data stored on the pLUN. In the example embodiment of FIG. 1C, each location map entry is a B+ tree leaf that includes the vLUN LBA, the size of the data stored on the backend pLUN, the storage identifier of the pLUN and the pLUN LBA of the first logical block where the data is stored on the pLUN.

Because blocks B3 and B5 are duplicates of blocks that have already been stored, only new data blocks B4 and B6 are processed further. Blocks B4 and B6 are compressed by compression function 156 to produce compressed blocks B4' and B6'. Provisioning function (Provision) 158 then allocates two pLUN data units worth of storage space (if not already allocated), one pLUN data unit corresponding to virtual data unit U4 (pUnit 3), and the other corresponding to virtual data unit U6 (pUnit 4). This allocation of fixed amounts of storage space in excess of the amount of space required for the requested transaction, wherein the allocation occurs on a "per I/O transaction" basis, implements thin provisioning of the storage space while producing a hierarchal sparse mapping of the vLUN LBA space to the pLUN LBA space (described in more detail below). The compressed data for each virtual logical block (e.g., B4') is stored within a one or more corresponding pLUN data unit logical blocks (e.g., 4A'-4D'). After the new compressed blocks are saved, the vLUN LBA entries within vLUN location map 162 for each of blocks B4 (A500C2) and B6 (A50150) are updated to reflect the backend storage identifier (02). The starting pLUN LBA and offset where the corresponding compressed data units are stored (B4' stored at pLUN LBAs 6200-6203 starting at offset 0000; B6' stored at pLUN LBA 7200 starting at offset 0003), as is the size of the data stored on the pLUN.

Figure 2:
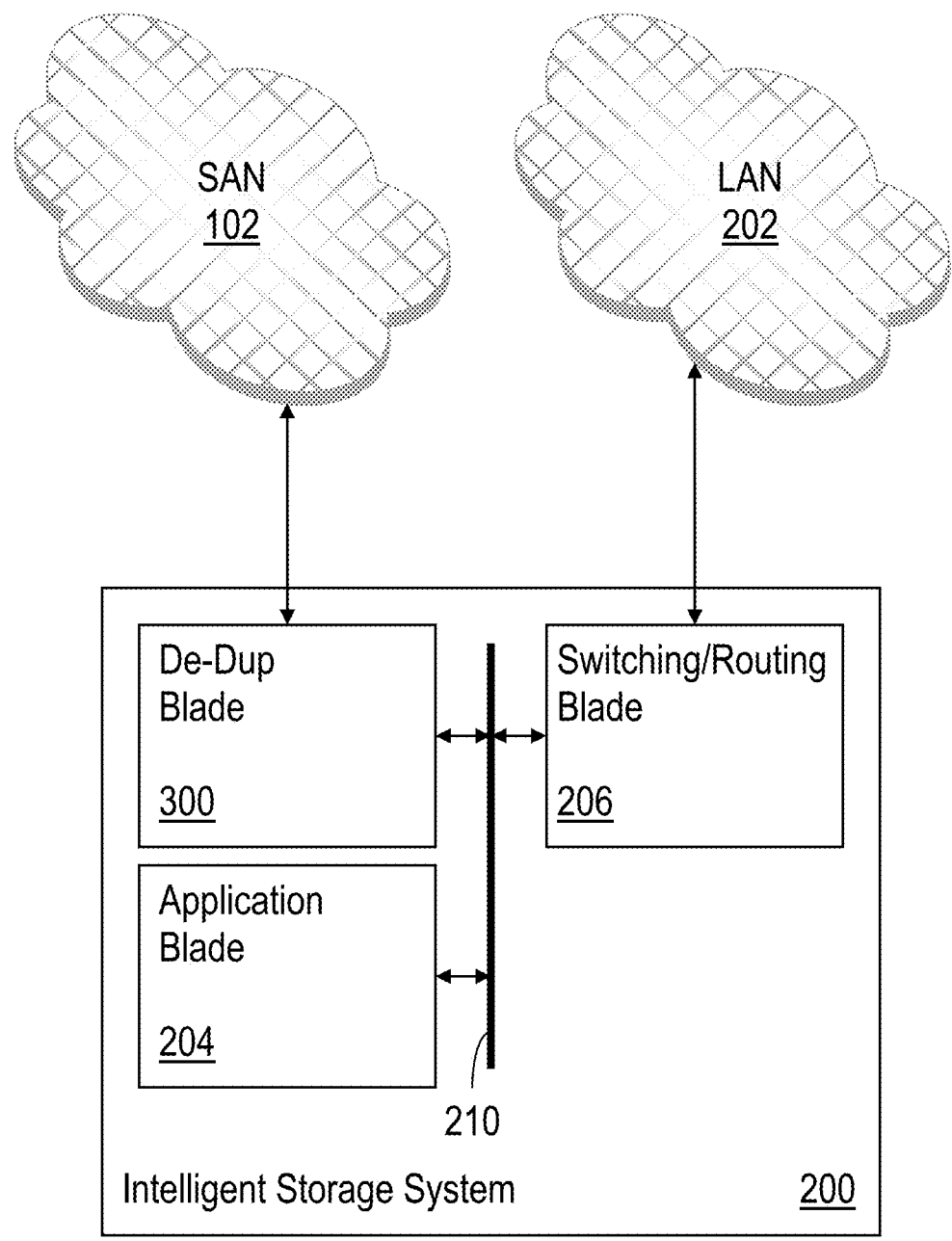
FIG. 2 shows a block diagram of the intelligent storage system shown in FIG. 1A, in accordance with at least some example embodiments.

FIG. 2 shows a block diagram of an intelligent storage system 200 implemented as a director-level switch with a deduplication blade 300 that implements the above-described functions, constructed in accordance with at least some example embodiments. The intelligent storage system 200 includes several blades coupled to each other via backplane bus 210, wherein each blade provides a different function within intelligent storage system 200 and can exchange data with the other blades through the backplane. For example, switching/routing blade 206 provides connectivity between SAN 102 and other networks (e.g., LAN 202), and application blade 204 provides the ability to execute specialized software applications to facilitate the operation and management of SAN 102 and the devices coupled to the SAN (e.g., the Brocade Data Migration Manager software by Brocade Communications Systems, Inc.). Deduplication (De-Dup) blade 300 implements the storage virtualization, data deduplication, data compression and decompression, LBA mapping, and storage allocation performed by intelligent storage system 200, in accordance with at least some example embodiments.

Figure 3:
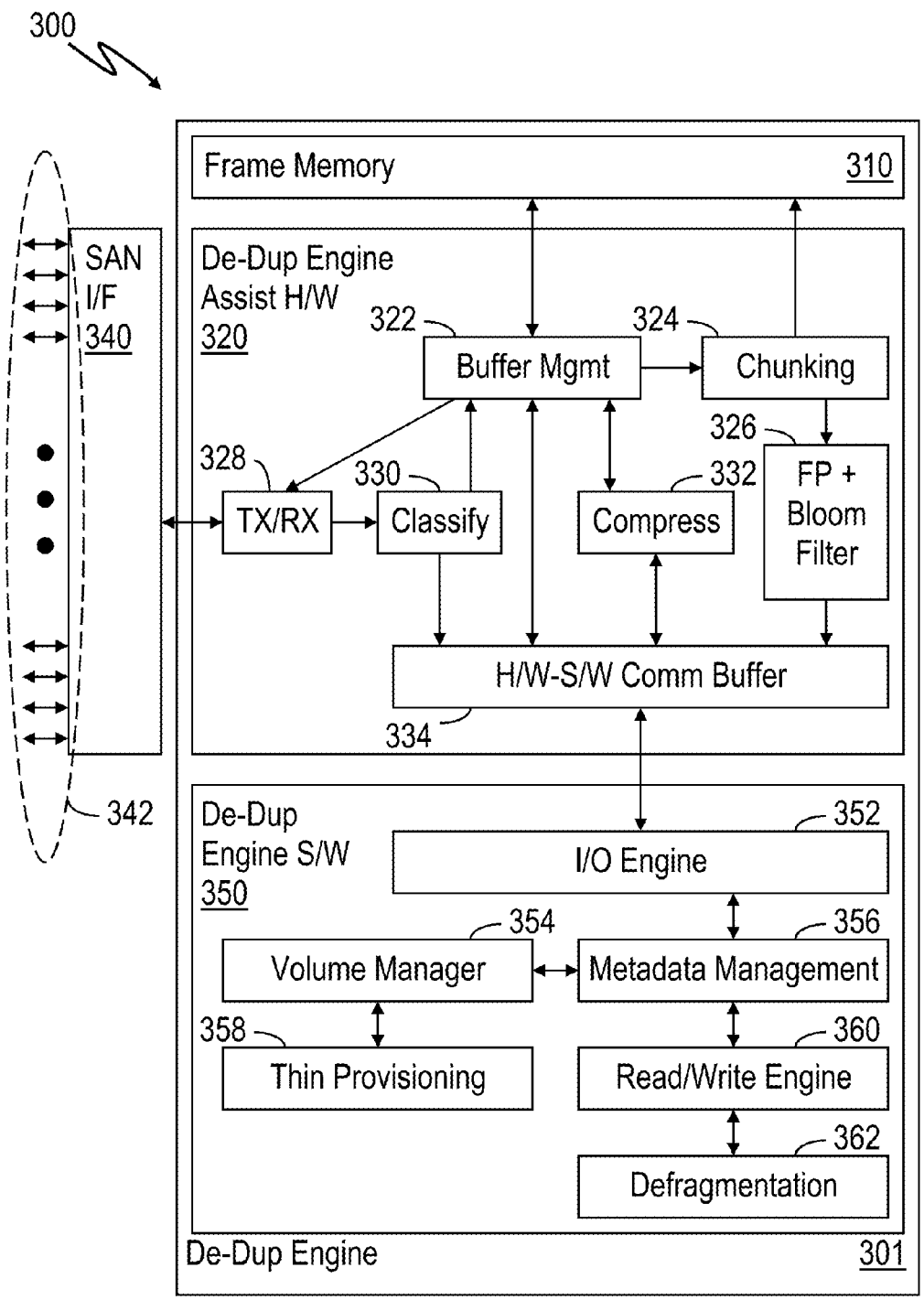
FIG. 3 shows a hardware and software functional block diagram of deduplication blade 300 of FIG. 2, in accordance with at least some example embodiments.

FIG. 3 shows a simplified functional block diagram of deduplication blade 300 that illustrates the functional division between deduplication blade assist hardware (De-Dup Engine Assist H/W) 320, deduplication blade software (De-Dupe Engine S/W) 350 and frame data memory (Frame Memory) 310 of deduplication engine (De-Dup Engine) 301 and storage area network interface (SAN I/F) 340, in accordance with at least some example embodiments. Deduplication engine assist hardware includes transmit/receive logic (TX/RX) 328, classification logic (Classify) 330, buffer management logic (Buffer Mgmt) 322, data compression engine (Compress) 332, chunk generation logic (Chunking) 324, fingerprint and Bloom filter logic (FP & Bloom Filter) 326 and hardware-software communication buffer (H/W-S/W Comm Buffer) 334. Deduplication engine software 350 includes input/output engine (I/O Engine) 352, volume manager 354, metadata management module 356, thin provisioning module 358, read/write engine 360 and defragmentation module 362.

SAN interface 340 couples to transmit/receive logic 328 and includes multiple ports 342 that couple to a SAN (e.g., Fibre Channel ports that couple to SAN 102 of FIG. 2). Transmit/receive logic 328 couples to classification logic 300 and buffer management logic 322, forwarding incoming messages received from SAN interface 340 to classification logic 300 and transferring outgoing messages to SAN interface 340 from frame data memory 310 (via buffer management logic 322, which couples to frame data memory 310). Classification logic 300 couples to buffer management logic 322 and hardware-software communication buffer 334, forwarding the headers of messages received from transmit/receive logic 328 to deduplication engine software 350 (via message buffer 334), and forwarding complete messages (header and data) received from transmit/receive logic 328 to frame data memory 310 (via buffer management logic 322).

Buffer management logic 322, in addition to coupling to transmit/receive logic 328, classification logic 300 and frame data memory 310, also couples to hardware-software communication buffer 334 and data compression engine 332. Buffer management logic 322 sets up and manages frame buffers within frame data memory 310, and routes data between the frame data buffers and the other hardware components to which buffer management logic 322 couples. Hardware-software communication buffer 334, in addition to coupling to buffer management logic 322 and classification logic 330, also couples to data compression engine 332 and fingerprint and Bloom filter logic 326. Hardware-software communication buffer 334 routes messages between deduplication engine software 350 and the various hardware components to which hardware-software communication buffer 334 couples.

Chunk generation logic 324 couples to buffer management logic 322, frame data memory 310 and fingerprint and Bloom filter logic 326. Data to be deduplicated before being written to a storage device is forwarded to chunk generation logic 324 where it is subdivided into variable length blocks or "chunks". The chunks are forwarded to fingerprint and Bloom filter logic 326, where a fingerprint is generated to identify each chunk and is applied to the Bloom filter to determine if the chunk has already been stored onto a corresponding storage device. Fingerprint and Bloom filter logic 326 forwards the resulting list of chunk information to deduplication engine software 350 (via hardware-software communication buffer 334), a list that includes the boundaries, fingerprint and Bloom filter lookup results for each chunk, and the location information for those chunks that already exist. The data is then forwarded by chunk generation logic 324 to data compression engine 332 and the resulting compressed data is stored in frame buffers within frame data memory. Those chunks within frame data memory 310 that are identified by deduplication engine software 350 as new (i.e., not yet stored on the storage device being accessed) are saved onto the storage device, while those that are identified as already on the system are discarded.

Data compression engine 332 provides compression for data being written to a storage device (if compression is enabled), and data decompression for compressed data being read from a storage device. Both the input and output data for both compression and decompression operations is maintained in frame buffers within frame data memory 310, and control and status messages are exchanged between data compression engine 332 and deduplication engine software 350 through hardware-software communication buffer 334.

Continuing to refer to the example embodiment illustrated in FIG. 3, I/O engine 352 operates as the software interface to deduplication engine assist hardware 320, receiving message from and transmitting messages to the various components of deduplication engine assist hardware 320. I/O engine 352 communicates with metadata management module 356, which maintains all metadata associated with the data stored on the storage devices controlled and managed by deduplication engine 301. Metadata management module 356 communicates with volume manager 354 and read/write engine 360. Volume manager 354 maintains all information associated with maintaining and accessing the virtual storage devices that are presented on a storage area network by the deduplication engine (e.g., virtual device type, virtual device capacity, RAID configuration and user access lists and permissions). Read/write engine 360 operates as an abstraction layer that isolates the specific configuration of the physical drives from the other software modules, which operate on a LUN representing a physical drive or a portion of a physical drive (referenced in the present application as a physical LUN or pLUN), rather than on the physical devices directly. Thus details such as, for example, the size, organization and interface type of the physical drives are hidden by read/write engine 360 from the hardware and most of the software within deduplication engine 301.

Read/write engine 360 also communicates with defragmentation module 362, which operates to reallocate the data and corresponding metadata that has become de-localized such that each is more localized for a given file or set of related files. Volume manager 354 communicates with thin provisioning module 362, which maintains and controls how logical blocks on the pLUN are allocated and how the virtual LUN (vLUN) logical blocks map to the physical LUN blocks.

As already noted, the storage virtualization implemented by deduplication engine 301 provides an abstraction layer that operates to hide the type, structure and size of the physical storage devices actually used to store the data, and to hide many of the data manipulation operations that improve the overall performance and efficiency of intelligent storage system 200, such as data deduplication, data compression and decompression, hierarchal sparse mapping and thin provisioning. This abstraction layer is implemented at least in part through the use of the vLUN location map previously described and shown in FIG. 1C (vLUN Loc Map 162). The vLUN location map operates to associate vLUN logical blocks with one or more pLUN logical blocks by using the vLUN logical block address as an entry index into the vLUN location map. Each entry corresponds to the vLUN LBA matching the index value for the entry. An entry includes the pLUN LBA and offset for the first pLUN logical block corresponding to the vLUN logical block. The entry thus operates as a pointer to one or more pLUN LBAs, allowing any given vLUN LBA to be mapped to any pLUN logical block (or set of logical blocks) within the logical block address space of the pLUN.

Figure 4:
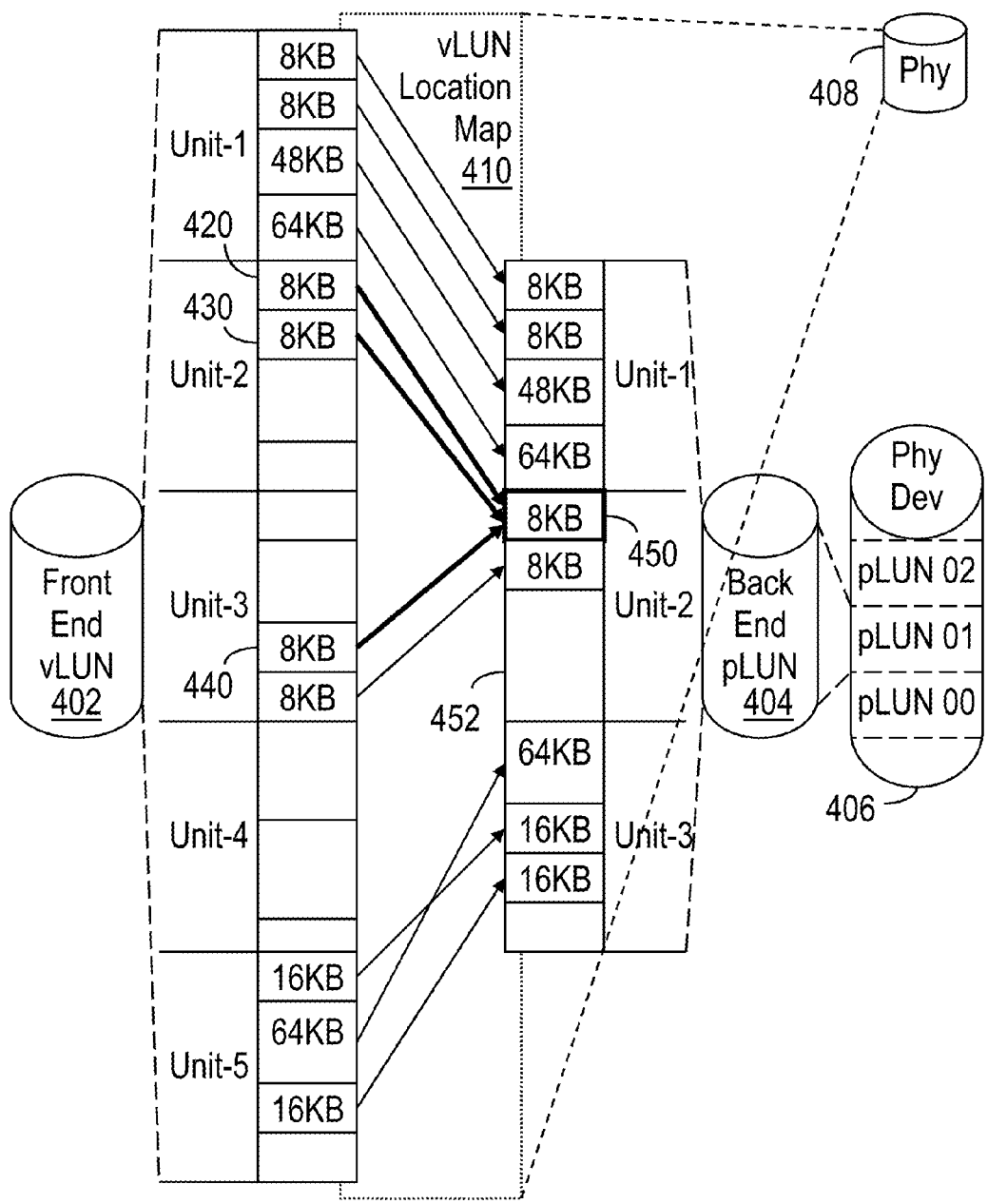
FIG. 4 shows an example of thin provisioning using hierarchal sparse mapping between front-end virtual LUN and back-end physical LUN logical block address spaces, in accordance with at least some embodiments.

The use of the above-described vLUN location map enables deduplication engine 301 to appear to allocate space to the vLUN, while actually delaying the allocation of physical disk space on the pLUN until it is actually needed at the time of the I/O that writes the data to disk. The vLUN location map also enables deduplication engine 301 to implement sparse mapping of the vLUN LBA space, wherein data on the vLUN is spaced out within the vLUN LBA space, but more closely grouped within the pLUN LBA space. For example, as shown in FIG. 4, data is spread out within the address space of front end vLUN 402, with the data within vLUN Unit-1 and Unit-2 spaced out from the data within vLUN Unit-3, and the data within vLUN Unit-3 spaced out from the data within vLUN Unit-5. vLUN Unit-2 and Unit-3 contain very little data, with Unit-2 containing data at the upper end of the address space within the unit, and Unit-3 containing data at the lower end of the address space. vLUN Unit-4 contains no data at all, even though it shown as allocated space within vLUN 402. When the storage space is actually allocated on pLUN 404, Unit-1 of vLUN 402 is mapped to Unit-1 on pLUN 404, vLUN Unit-3 is mapped to pLUN Unit-2, and vLUN Unit-5 is mapped to pLUN Unit-3. Because vLUN Unit-4 does not include any data, vLUN Unit-4 is not mapped when allocated, and no space is allocated for this unit on pLUN 404.

The mapping of vLUN 402 to pLUN 404 is provided using vLUN location map 410, which is stored on physical storage device 408 but which in at least some embodiments is also maintained in volatile storage (e.g., RAM) for faster access (as described below). Depending upon its size, a copy of the vLUN location map may be stored in memory in its entirety, or only portions of the map may be stored in volatile storage as needed (e.g., cached in high performance SDRAM). pLUN 404 may represent a portion of the total space available on a physical drive, as shown in the example embodiment of FIG. 4, or my represent all of the space available on a physical drive (i.e., the physical drive includes only one LUN).

By allocating the space on pLUN 404 on an "as-needed" basis, a form of "thin provisioning" is implemented by deduplication engine 301. However, the thin provisioning implemented in accordance with at least some embodiments allocates storage units of a fixed size (i.e., the pLUN data units shown in FIG. 4), allowing for the allocation of pLUN storage space in excess of what is required by the corresponding vLUN unit (e.g., spare space 452 within pLUN Unit-2 of FIG. 4). As is described in more detail below, the hierarchal structure implemented in the pages, sub-pages and blocks within each unit also provides for additional space in excess of what is required by the data being stored, allowing for variations in the size of a stored chunk (e.g., due to data changes that change the size of a compressed chunk, or due to the addition of data) without necessarily having to allocate additional storage, or to re-allocate new storage for the modified data.

Figure 5A:
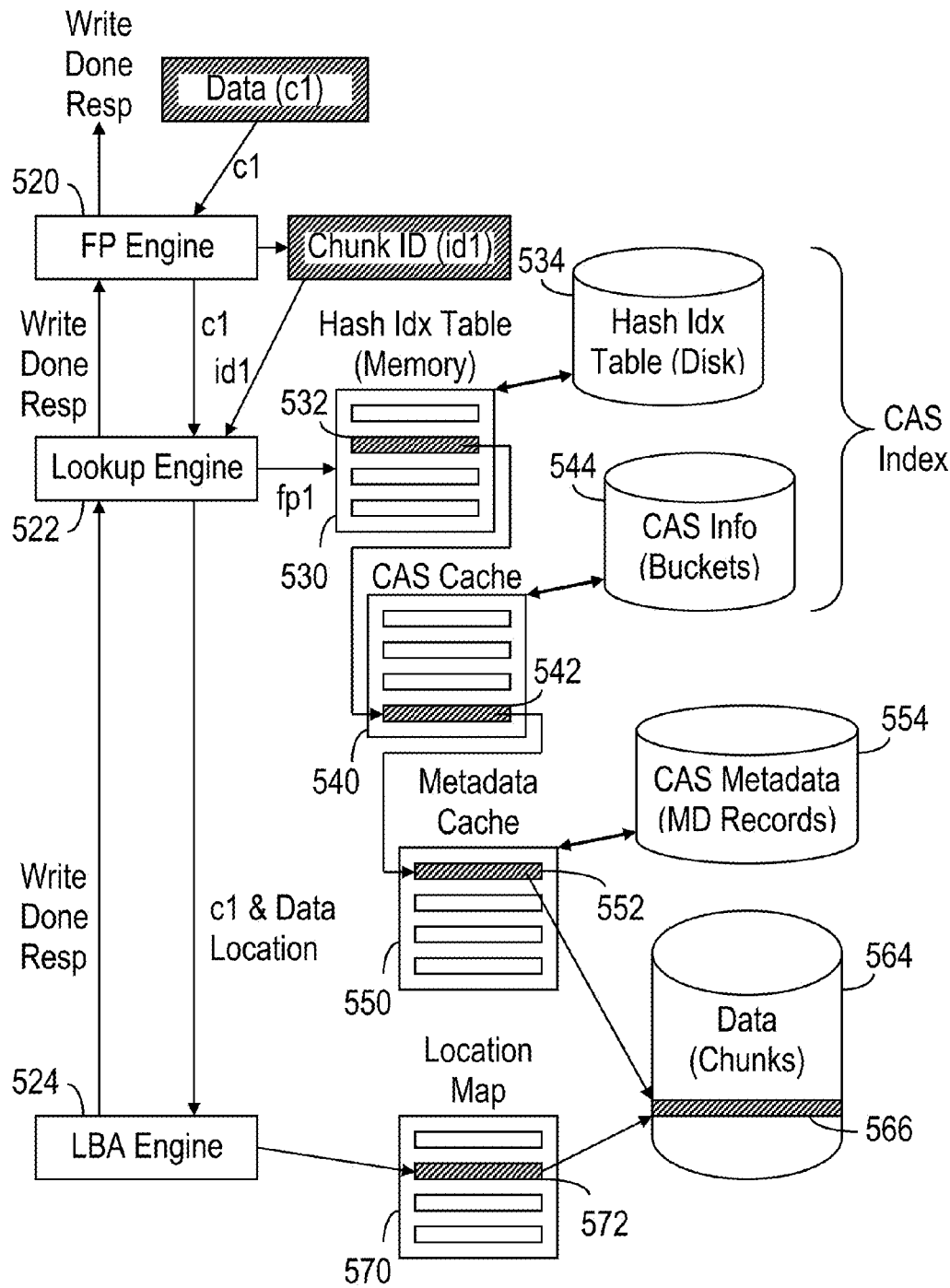
FIG. 5A shows a functional block diagram of a data write and deduplication of a chunk performed by deduplication engine 301 of FIG. 3, in accordance with at least some example embodiments.
Figure 5B:
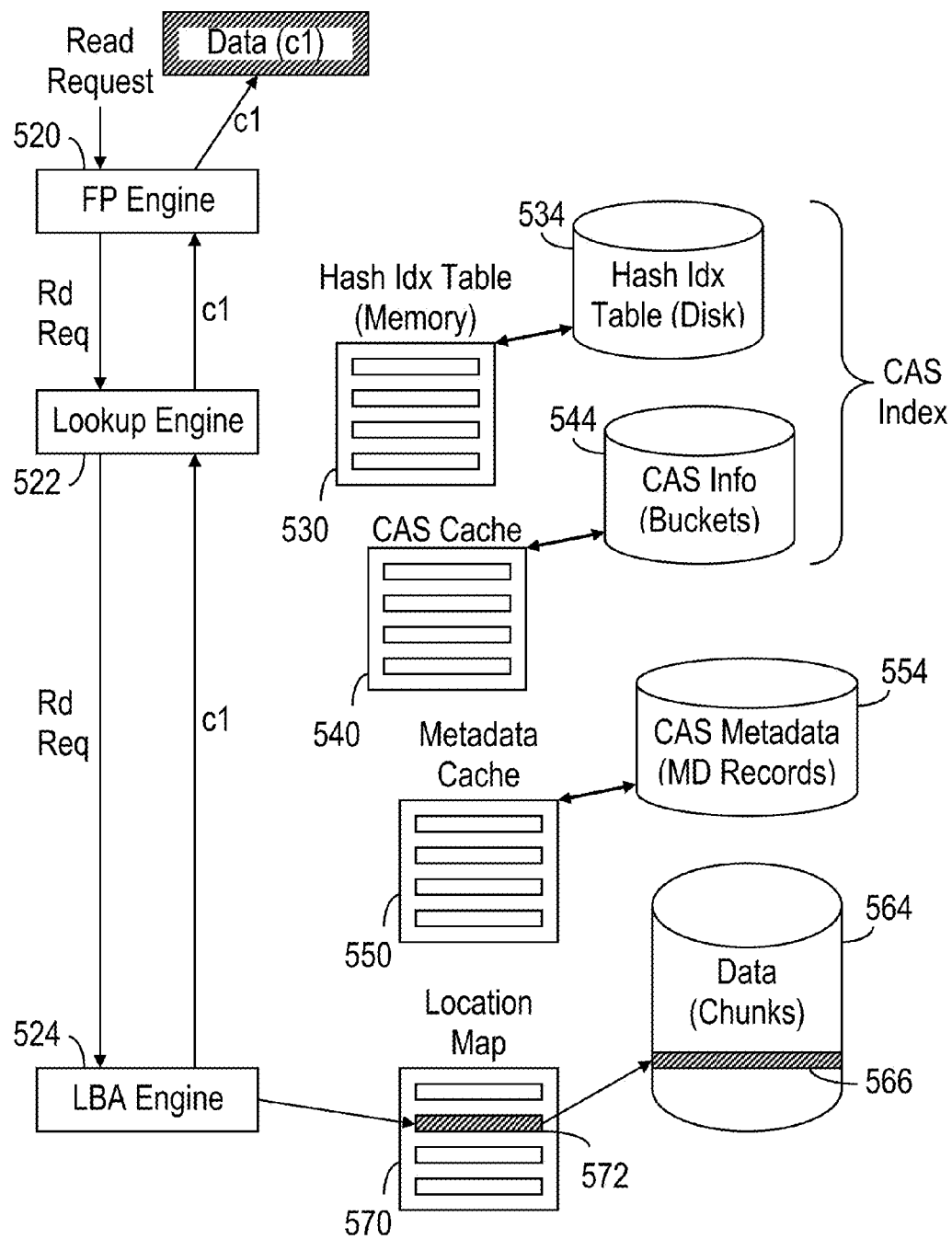
FIG. 5B shows a functional diagram of a data read of a deduplicated chunk performed by deduplication engine 301 of FIG. 3, in accordance with at least some example embodiments.

In addition to enabling the thin provisioning described above, vLUN location map 410 also provides a mechanism for implementing chunk deduplication by mapping multiple vLUN blocks (i.e., chunks) to a single pLUN block. For example, as shown in FIG. 4, two data chunks within vLUN Unit-2 are deduplicated and mapped to the same block(s) within pLUN Unit-2, i.e., vLUN data chunks 420 and 430 of Unit-2 and vLUN data chunk 440 of Unit-3 all contain identical data and are deduplicated by mapping all three vLUN data blocks to the same single pLUN data block(s) 450 of pLUN Unit-2. FIGS. 5A and 5B depict functional block diagrams illustrating in more detail how deduplicated chunks are written to, as well as read from, the storage device virtualized by deduplication engine 301, in accordance with at least some embodiments.

Referring first to FIG. 5A, a chunk is presented as Data c1 to Fingerprint engine 520, which uses data c1 to generate a chunk identifier (Chunk ID id1) that is unique to data c1. Both data c1 and identifier id1 are forwarded to lookup engine 522 to determine whether chunk c1 is a duplicate of a chunk already stored on physical LUN 564. Lookup engine 522 uses at least part of identifier id1 (e.g., part of fingerprint signature fp1, described further below) as an index into memory-resident hash index table 530, which is kept in synchronization with a disk-resident copy of the hash index table maintained on storage device 534. If the chunk already exists on physical LUN 564, a valid entry will exist within hash index table 530 at the indexed location. Each valid table entry (e.g., table entry 532) in hash index table 530 points to a block in content addressable storage (CAS) cache 540 (e.g., block 542), which maintains a cached subset of the CAS information stored on storage device 544. Each block in CAS cache 540 (referred to as "bucket blocks") includes one or more bucket block entries that are each used to uniquely identify a full fingerprint signature (e.g., fingerprint signature fp1) associated with an entry. The combination of a valid hash index table entry and an associated CAS bucket block entry together operate as a CAS index that uniquely identifies a chunk stored on physical LUN 564.

Each CAS bucket block entry also includes a pointer to a metadata record in metadata cache 550 (e.g., metadata record 552), which in turn includes a pointer to the location on physical LUN 564 (e.g., logical block 566) where a corresponding chunk is stored. For an existing chunk identified by lookup engine 522, this data location information is retrieved and forwarded to logical block address (LBA) engine 524. LBA engine 524 updates vLUN location map 570 with data location information so that entry 572 maps its corresponding virtual LUN logical block address (associated with data c1) to the physical LUN logical block address and starting offset of the data already stored in logical block 566 of physical LUN 564. vLUN location map 570 is maintained both on disk (not shown) and in memory (either fully, or partially as a location map cache), and maps the logical block addresses of a vLUN to corresponding logical block addresses and offsets on a pLUN where the data is actually stored (e.g., logical block 566). The virtual LUN logical block address is used as an index into vLUN location map 570, as previously described. Upon completion of the update to vLUN location map 570, LBA Engine 524 issues a write done response that indicates completion of the write operation, which is successively forwarded back to the requestor by lookup engine 522 and fingerprint engine 520.

If lookup engine 522 determines that data c1 is not already saved to physical LUN 564, the data structures within the Hash Index Table 530, CAS Cache 540 and Metadata Cache 550 (as well as their disk-resident counterparts on storage devices 534, 544 and 554) are updated to include new entries for data c1. Data c1 is stored on physical LUN 564 by LBA engine 524. The virtual LUN logical block address for data c1 is used by LBA engine 524 to update vLUN location map 570 such that entry 572 (corresponding to data c1) points to the logical block(s) on pLUN 564 where the chunk is actually stored. Upon completion of the update to vLUN 570, LBA Engine 524 issues a write done response that indicates completion of the write operation, which is successively forwarded back to the requestor by lookup engine 522 and fingerprint engine 520.

Referring now to the example embodiment of FIG. 5B, a read request for data stored on the storage system is received by fingerprint engine 520 and forwarded to lookup engine 522, which in turn forwards the request to LBA engine 524. Neither fingerprint engine 520 nor look up engine 522 access any of the structures and/or related storage devices needed for the previously described write. LBA engine 524 simply accesses the chunk requested by reading logical block 566 on physical LUN 564, which is pointed to by entry 572 of vLUN location map 570 (the entry corresponding to the virtual LUN logical block address provided in the read request). No additional processing related to chunk deduplication is required to read the requested chunk. Data c1 (read by LBA engine 524) is transferred to lookup engine 522, which in turn forwards the data to fingerprint engine 520 for delivery to the requestor, completing the read operation.

As shown in FIGS. 5A and 5B, much of the data referenced either directly or indirectly by lookup engine 522 is cached in memory for faster access to the desired information. Faster access is achieved, at least in part, because of the higher operational speed of memory devices (e.g., random access memories or RAMs) as compared to disk drives. However, because cache memories only store a subset of the information stored on disk, much of the performance gain achieved through the use of cache memory may be diminished whenever new information not currently in the cache is accessed (i.e., a cache "miss"). To mitigate the impact of cache misses and increase the probability that the desired data is already stored in the cache memory (i.e., to increase the probability of cache "hits"), at least some embodiments take advantage of how stored data units tend to be clustered, both hierarchically (i.e., based upon how data units are logically grouped together) and temporally (i.e., based upon the order in which data units are accessed). By storing data units in close physical proximity to each other that are related to each other by either a hierarchal grouping (e.g., data units that form a file) or by contemporaneous access (e.g., files within a single directory sequentially accessed by a backup application), much (if not all) of the data required for a given series of related operations may be read into cache memory using fewer disk read operations, since the disk block(s) accessed and stored in cache memory contains interrelated data.

Figure 6:
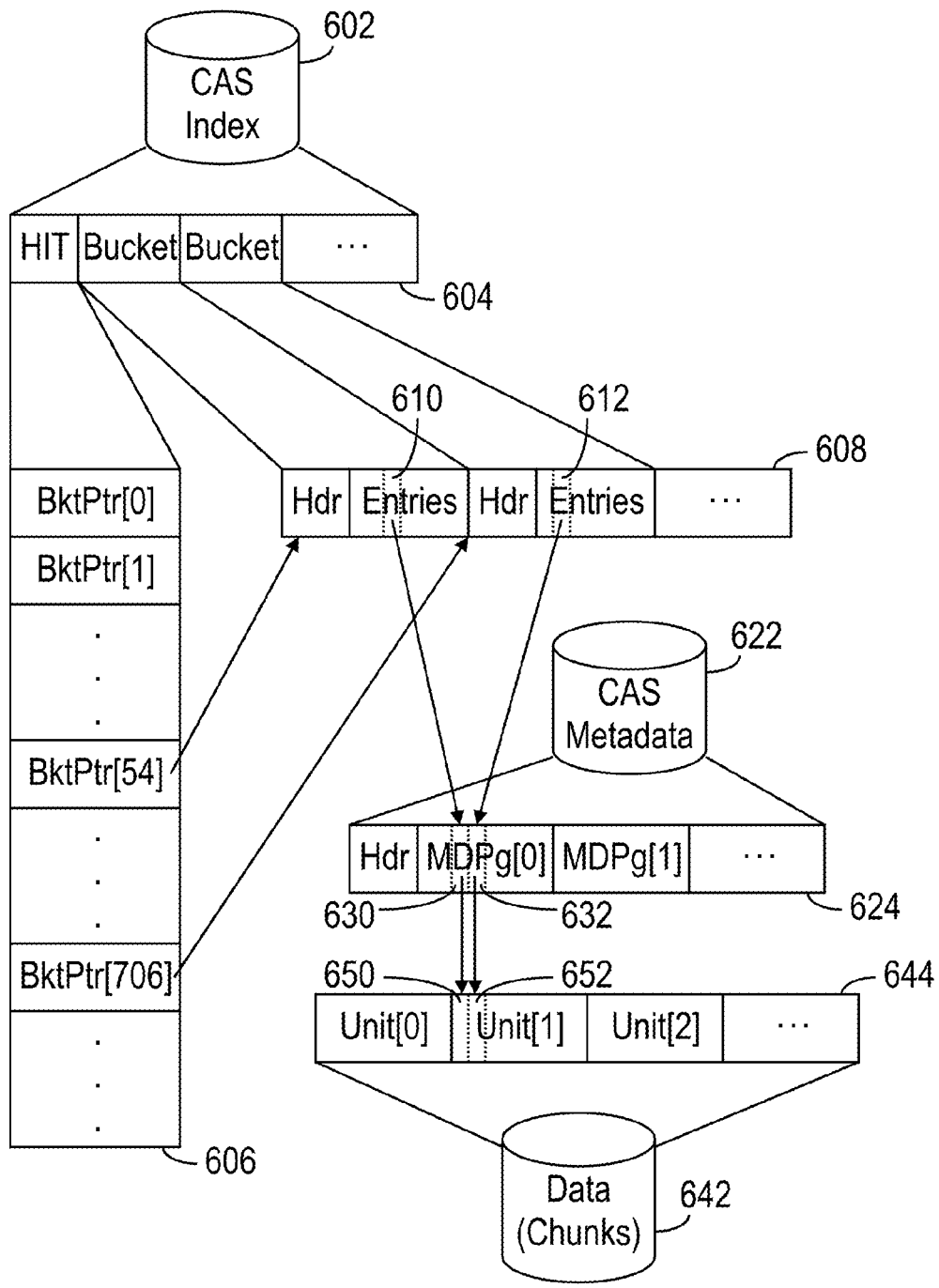
FIG. 6 illustrates the clustering of related metadata and data stored within the deduplication engine 301 of FIG. 3, in accordance with at least some example embodiments.

FIG. 6 shows an example of how the buckets, metadata records and chunks of related data are clustered together on their respective storage devices, in accordance with at least some example embodiments. CAS index 604, which includes hash index table 606 and bucket blocks 608 (each bucket block corresponding to an individual hash index table entry), is maintained on storage device 602. Because only part of the signature fingerprint of a chunk of data is used as an index into the hash index table, each hash index table entry may map to more than one stored chunk, and thus each bucket block includes multiple bucket block entries. Each hash index table entry includes a pointer to a bucket block, which allows related hash index table entries to reference bucket blocks that are close or even adjacent to each other, regardless of the location of the hash index table entry within the table. Thus, for example, even though BktPtr[54] and BktPtr[706] of FIG. 6 are stored at non-adjacent locations within hash index table 606, each pointer is configured to reference adjacent bucket blocks that include entries 610 (corresponding to BktPtr[54]) and 612 (corresponding to BktPtr[706]). If the amount of data read during a CAS Index disk I/O is large enough to encompass multiple bucket blocks (e.g., 512 Kbytes encompassing 2,048, 256 byte memory-resident bucket blocks), accessing the bucket corresponding to BktPtr[54] will not only cause the bucket block containing entry 610 (corresponding to BktPtr[54]) to be read, but also the bucket block containing entry 612 (corresponding to BktPtr[706]) to also be read (as well as a number of other bucket blocks). The storage of BktPtr[54] and BktPtr[706] within CAS cache 530 of FIG. 5A precludes the need for additional reads of the bucket entries from disk each time the information within the entries must be accessed, until such time as they are purged from the CAS cache.

Each bucket entry similarly includes a pointer to a CAS metadata record that is part of CAS metadata 624. CAS metadata 624 is stored on storage device 622 and subdivided into metadata pages, each including a collection of metadata records. As with the bucket blocks, related metadata entries are stored together within a metadata page. Thus, when the metadata page that includes metadata record 630 (corresponding to bucket block entry 610 and BktPtr[54]) is read from storage device 622 into metadata cache 540 of FIG. 5A, related metadata record 632 (corresponding to bucket block entry 612 and BktPtr[706]) is also read and thus available within the metadata cache. As with the bucket blocks, subsequent accesses to metadata records 630 and 632 may be made without additional I/O operations on storage device 622 until the metadata records are purged from the metadata cache.

Each metadata record points to a chunk of the data 644 stored on storage device 642. In at least some example embodiments, the chunks (like their corresponding metadata records) are grouped together in units that include chunks containing related data. Thus when the unit that includes chunk 650 (corresponding to metadata record 630, bucket block entry 610 and BktPtr[54]) is read, related chunk 652 is also read and made available within a chunk cache (not shown). As with the bucket blocks and metadata records, subsequent accesses to chunks 650 and 652 may be made without additional I/O operations on storage device 642 until the chunks are purged from the chunk cache.

By clustering related bucket blocks, metadata records and chunks on their respective storage devices as described above, cache misses are reduced across all caches for inter-related data. Thus, for example, if a file stored on the storage system of FIG. 6 is saved as chunks 650 and 652, after the initial read of chunk 650, metadata record 630 and bucket block entry 610, no additional disk reads are required to access the data within the file (until at least one of the caches is purged of an entry related to the file or a write operations is performed), since all of the data associated with the file is already in cache memory after the initial access to chunk 650. Further, only three storage device I/O operations were required (one for each of storage devices 602, 622 and 642), even though six individual pieces of information were initially required. Additional access to the file as it is operated upon by an application may also be performed on the file without additional I/O operations, as long as the file is not modified. When a modification is made, the corresponding commit of the changes from cache to disk may require as little as two I/O operations (a single write of the chunk to storage device 642 and a single write of the chunk metadata to storage device 622), as will be explained in more detail below.

If a chunk is identified as a new chunk that will be saved onto the storage system (i.e., not deduplicated), deduplication engine 301 will attempt to compress the chunk before it is saved. The chunk is scanned for duplicate sequences of bytes within the chunk, and if a duplicate data sequence is identified it is replaced with a code word that includes a pointer to a location within the chunk where the sequence previously occurred. Because the number of bytes of the code word is less than the number of bytes in the identified duplicate sequence, the overall amount of data within the modified sequence of the chunk is reduced, and thus less device storage space is required to save the chunk onto the storage system. Also, less bandwidth is required to transmit the compressed data over the SAN to the storage device.

Figure 7A:
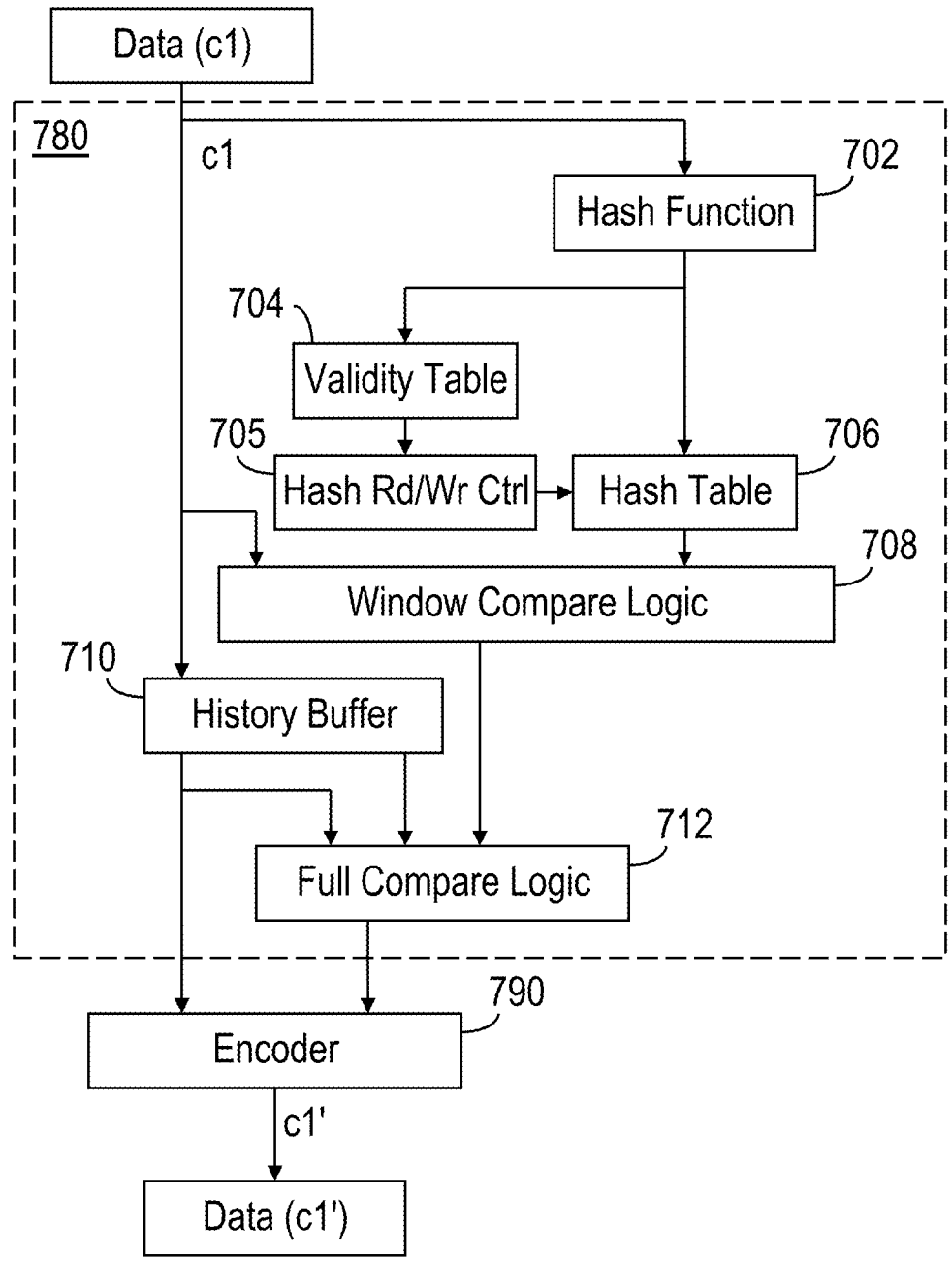
FIG. 7A shows a functional block diagram of a data write and compression of the data within a chunk performed by deduplication engine 301 of FIG. 3, in accordance with at least some example embodiments.

FIGS. 7A depicts a functional block diagram illustrating in more detail how data within a chunk is compressed prior to storage on the storage system, in accordance with at least some example embodiments. Chunk data bytes are provided as data c1 to hash function 702 within sequence detector 780. Hash function 702 generates a hash code over a moving window of a predetermined size (e.g., 3 bytes). The resulting hash code is used to index into a both a validity table 704 and a hash table 706. Both the validity and hash tables are divided into lanes (not shown) that each corresponds to a byte position within a grouping of bytes, each within a separate moving window. As is explained in more detail below, the subdivision of the incoming data stream into lanes facilitates the processing of multiple bytes in parallel as part of the compression of the incoming data.

Validity table 704 provide an indication as to whether a valid hash table entry exists for the byte sequence currently within the moving window, and in which of the data lanes the sequence may be valid. If a valid entry exists in the hash table, then the sequence may have previously occurred in the corresponding lane(s) within the chunk. The validity bits are decoded by hash read/write control (Hash Rd/Wr Ctrl) 705, and used to determine which hash table entries are read, and the lanes from which they are read. In at least some embodiments, the hash code is smaller than the window size, thus resulting in a one-to-many mapping of the hash code to multiple data sequences. The valid entries within hash table 706 corresponding to the hash code each stores sufficient bits of a corresponding previous data sequence occurrence to uniquely identify the data sequence. These bits are compared by window data compare logic 708 to the corresponding data bits of the chunk within the moving window. If a matching sequence is identified, window data compare logic 708 enables full compare logic 712 to continue comparing subsequent received chunk bytes with previously received bytes (saved in history buffer 710), until a byte mismatch is encountered.

Whenever matching bytes are identified, encoder 790 generates a "match" record, which includes a pointer to the matching sequence in the form of an offset from the current chunk location to the location within the chunk of the beginning of the matching sequence. In at least some example embodiments, a pointer to the location in the incoming data stream where the data sequence previously occurred is also stored within hash table 705. In other example embodiments the sequence location pointer is stored within validity table 704. For byte sequences that do not match, encoder 790 generates a "literal" record, which includes the non-matching bytes. When all data within the chunk has been processed, an EOF record is generated and saved to the storage system to indicate the end of the data within the chunk. Encoder 790 outputs these records as they are generated for storage onto the storage system as a new chunk with data c1', which is a collection of literal records, match records, or a combination of both types of records, as well as a single EOF record.

Figure 7B:
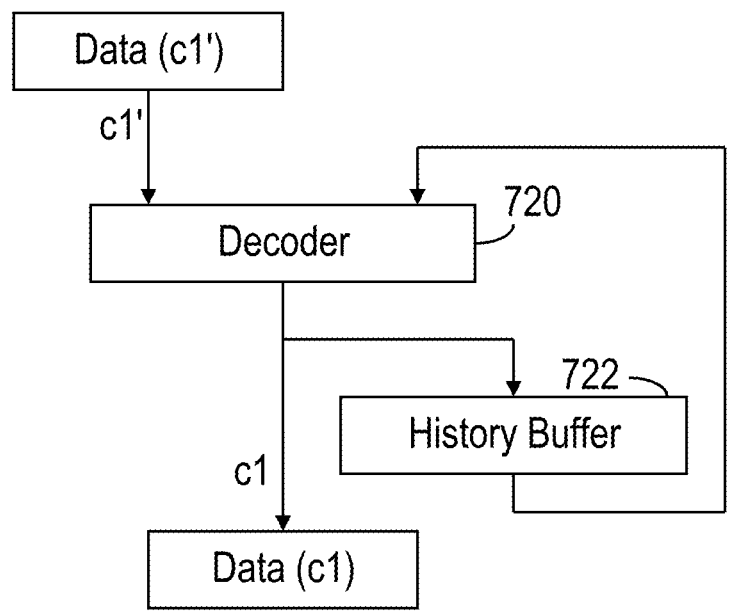
FIG. 7B shows a functional block diagram of a data read and reconstruction of the compressed data within a chunk performed by deduplication engine 301 of FIG. 3, in accordance with at least some example embodiments.

FIG. 7B depicts a functional block diagram illustrating how compressed data that is read from the storage system is reconstructed upon retrieval, in accordance with at least some example embodiments. A chunk with data c1' is read from the storage system and presented to decoder 720. Decoder 720 identifies and processes records within the chunk, parsing out both literal records and match records. When a literal record is identified by decoder 720, the literal bytes stored within the record are extracted and forwarded for transmission as part of data c1 of the requested chunk and for storage within history buffer 722. When a match record is identified, decoder 720 uses the offset pointer within the record to index back to the location within history buffer 722 where the previous occurrence of the matched sequence is stored, reads the identified sequence from the location, outputs the bytes of the sequence as part of data c1 of the requested chunk, and saves the output bytes to history buffer 722. Data is decoded and output in this manner until an EOF record is read, which indicates the end of data c1' of the chunk being read. No part of the EOF record is output as part of data c1.

Although the above-described compression of data within a chunk is performed in conjunction with the deduplication of data chunks stored within the storage system of the embodiments described, those of ordinary skill will recognize that each of these two operations may be selectively performed either together as described or separately. Thus, for example, data that does not necessarily lend itself to efficient chunk compression but does lend itself to very efficient chunk deduplication (e.g., back up data) may be stored as deduplicated data that is not compressed. Similarly, data that does not necessarily lend itself to efficient chunk deduplication but does lend itself to very efficient chunk compression (e.g., semi structured data such as Microsoft® Exchange data) may be stored as compressed data that is not deduplicated.

Although the system described thus far is depicted as implementing thin provisioning, data deduplication, and data compression and decompression, each of these may be implemented without the need for the other. Those of ordinary skill in the art will thus recognize that other example embodiments may include the capability for data deduplication, data compression/decompression, and thin provisioning either alone or in any combination, or all together with the ability to independently enable and/or disable each function, and all such combinations, capabilities and abilities are contemplated by the present disclosure.

Functional Details: Hierarchal Sparse Mapping and Thin Provisioning

As previously described, in at least some example embodiments the front-end vLUN (e.g., vLUN 402 of FIG. 4) is segmented into virtual "units" of a predetermined size, and data stored in the units is spread out over the available virtual address space (i.e., sparsely mapped). A corresponding physical unit is allocated on the back-end pLUN when data is actually written to the physical disk (i.e., using thin provisioning). The sizes of both the physical and virtual units are set when the intelligent storage system is initially configured. In at least some example embodiments, the virtual and physical unit sizes are set so as to align with the physical disk skew, thus reducing or in some cases eliminating head movement during a seek performed by a physical disk.

Figure 8:
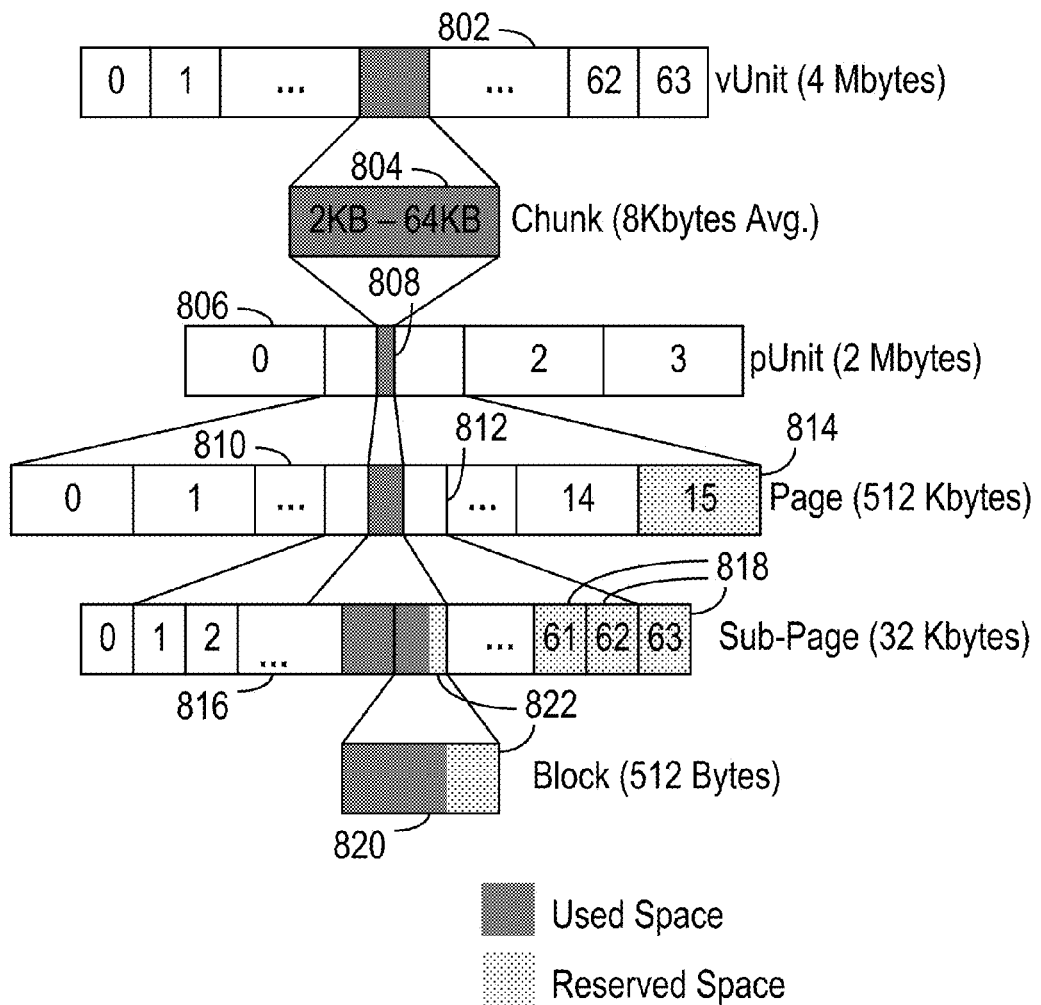
FIG. 8 illustrates the internal hierarchy of a physical LUN unit used to implement hierarchal sparse mapping and thin provisioning, in accordance with at least some example embodiments.

FIG. 8 show the internal hierarchy of a physical unit used to implement hierarchal sparse mapping and thin provisioning in at least some embodiments. In the example shown, each physical unit includes a fixed number of 512-Kbyte pages. The number of pages per physical unit depends upon the size of the virtual unit, and the average level of data compression expected for the system. Thus, as shown in the example of FIG. 8, if the size of virtual unit (vUnit) 802 is set to 4 Mbytes, and an overall average compression ratio of 2:1 is anticipated for the system (using deduplication, data compression, or both), then four, 512-Kbyte pages of pLUN storage space will be allocated for each virtual unit 802 when data is written to that unit. This results in a physical unit (pUnit) 806 with a size of 2 Mbytes.

Data to be stored within virtual unit 802 is divided into variable size chunks 804, each chunk corresponding to a variable length virtual logical block ranging from 2 Kbytes to 64 Kbytes in length, with an average length of 8 Kbytes. In the example embodiment shown, each chunk is deduplicated, and any chunks not already stored on the pLUN are compressed and written to page 810 of pUnit 806. Each page 810 is divided into 16, 32 Kbyte sub-pages 816, and each sub-page is divided into 64, 512-byte blocks 820. At each level of the hierarchy shown, reserved space is set aside to accommodate at least some increases in the amount of data stored without the need to allocate additional virtual and physical units. Thus, in the example of FIG. 8, each page 810 maintains sub-page 15 as 32 Kbytes of reserved space 814, each sub-page 816 maintains blocks 61-63 as 1,536 bytes of reserved space 818, and each block maintains any unused space at the end of the block as reserved space 822. In at least some embodiments, if when the data is initially written the unused space that remains at the end of a block is less than a threshold values (e.g., less than 10% of the block size), an additional block is allocated and operates as at least part of block reserved space 822.

Figure 9:
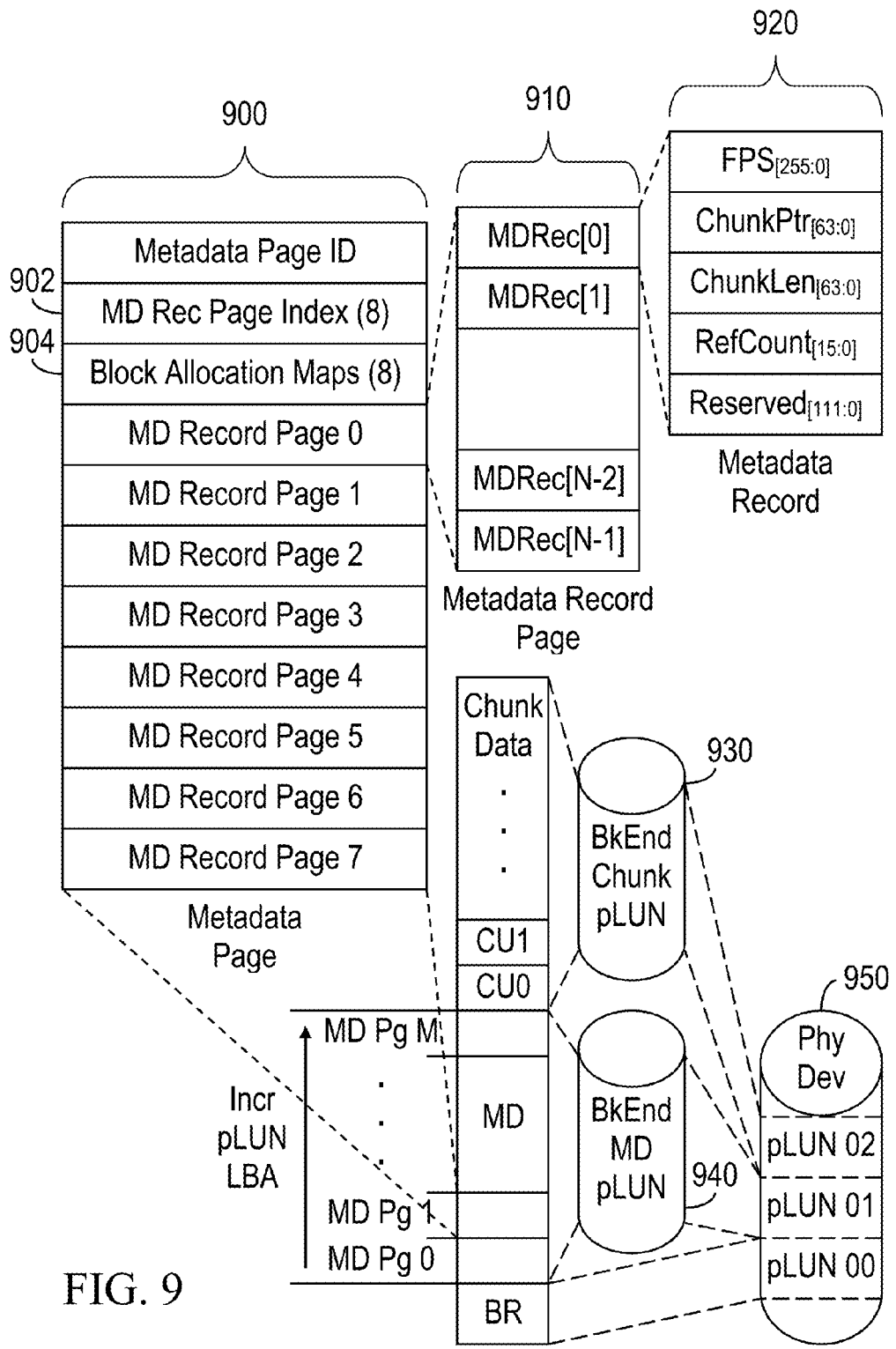
FIG. 9 shows an example of how metadata corresponding to a physical LUN unit is grouped together in a metadata page, in accordance with at least some example embodiments.

Metadata corresponding to each allocated pLUN unit is grouped together in a metadata page. FIG. 9 shows an example of how such a page is organized, in accordance with at least some embodiments. Each Metadata Page 900 includes up to 8 metadata record pages (MD Record Pages) 910, and each metadata record page describes a 512-Kbyte chunk data page stored on backend chunk pLUN (BkEnd Chunk pLUN) 930 and associated with a particular pLUN unit. For each represented chunk data page, the corresponding metadata record page includes: a page index within a page index array 902 with the start address of the allocated chunk data page; a block allocation map from an array of block allocation maps 904, indicating which logical blocks of the backend pLUN within the chunk data page are currently in use (one bit per logical block); and the metadata records 910 (collected together within the metadata record page) that each correspond to a chunk stored within the chunk data page. Each metadata record 920 includes the full fingerprint signature of the corresponding data chunk, the starting pLUN LBA and starting LBA offset of the data chunk (i.e., the chunk pointer), the length in bytes of the data chunk (both before and after data compression), a reference count that tracks the number of chunks on the vLUN that reference the data chunk stored on the pLUN, and a reserved field set aside for future expansion. Table 1 below illustrates an example of how such fields may be organized and subdivided within a 64-Byte metadata record:

TABLE 1

| Name | Description | Length |
| --- | --- | --- |
| Fingerprint Signature | One-way secure hash value on the data chunk | 32 Bytes |
| Chunk Pointer | Device ID: Physical device reference | 2 Bytes |
| | Device starting LBA: Physical logical block in which chunk data starts | 4 Bytes |
| | Device LBA Offset: Starting offset within the device starting LBA of the chunk data | 2 Bytes |

TABLE 1-continued

| Name | Description | Length |
| --- | --- | --- |
| Chunk Length | Original Length: Length of the uncompressed chunk in bytes | 3 Bytes |
| | Compressed Length: Length of the compressed chunk in bytes | 3 Bytes |
| | Pad Length: Length of fill bytes (modulo 512 bytes) | 2 Bytes |
| Reference Count | Specifies the number of virtual to physical logical block links associated with the chunk | 2 Bytes |
| Reserved | For future expansion | 14 Bytes |

Each metadata page 900 is stored on a backend physical LUN (e.g., BkEnd MD pLUN 940), and includes the metadata records corresponding to a "unit" stored on another backend physical LUN (e.g., BkEnd Chunk pLUN 930). Thus, in the example of FIG. 9, metadata page 1 (MD Pg 1) includes the metadata for the data chunks stored within chunk unit 1 (CU1) on backend chunk pLUN 930. The metadata pages are ordered according to the pLUN LBA of the data represented by the metadata page. Thus, for example, if each metadata page represents two backend units that that are each 2 Mbytes in size (i.e., 8 metadata record pages each representing 512 Kbytes of chunk data, 4 metadata record pages per unit), then metadata page 0 includes the metadata records for the data chunks in chunk units 0 and 1 (stored within the first 4 Mbytes of LBA space of pLUN 02), metadata page 1 includes the metadata records for the data chunks in chunk units 2 and 3 (stored within the second 4 Mbytes of LBA space of pLUN 02), and so on for the remainder of the metadata and chunk data. In this manner at least some of the higher order bits of the backend chunk pLUN LBA can be used to index into the metadata LBA space to locate the metadata page that stores the metadata corresponding to the chunk LBA. The remaining lower order bits may be used to locate the specific metadata record within a metadata page and metadata record page.

Referring again to FIG. 8, if at a later time chunk data 804 is modified such that the compressed chunk requires more space (and the chunk reference count is not greater than one), the data is written into the available reserved space within the blocks already allocated if the reserved space is sufficient to accommodate the modified data chunk. Because the modified chunk is written to the same blocks within the same page and sub-page, the modification of the corresponding metadata record is limited to the chunk length field. If the modified chunk data cannot be written back to the existing allocated space (e.g., if there is not enough reserved space within the block and the adjacent block is already used, or if the chunk reference is greater than one and thus cannot be modified), space for the modified chunk is allocated elsewhere within the sub-page. If there is insufficient space within blocks 0-60, but the modified block will fit within reserved sub-page space 818, the reserved space is allocated (as needed) to the modified chunk.

Regardless of whether the modified chunk is written to reserved or non-reserved space within sub-page 816, the described modification of the metadata is limited to (at most) an update of the metadata record within the metadata record page corresponding to the modified chunk data, and an update to the block allocation map corresponding to the metadata record page of the modified metadata record. Since the example described involves a modification of an existing chunk (i.e., a read-modify-write operation), it is highly probable that the metadata record page corresponding to the chunk data page will already be in metadata cache memory (described below) as a result of the initial read, and thus the updates to the metadata records described will be performed as memory write operations that are later flushed to disk in as little as two disk I/O operations (one to the chunk data storage device, the other to the metadata storage device). By using the reserved space before allocating additional space, incremental changes to data chunks can be made with little or no degradation in performance (as compared to the initial write of the chunk data) due to the metadata upkeep, since the metadata for the reserved space is kept in the same metadata record page as the metadata for the unmodified chunk data.

Similarly, in at least some example embodiments, if there is insufficient space within a sub-page to allocate to a modified chunk, space is allocated from another sub-page. If there is insufficient space in sub-pages 0-14, space is allocated from reserved space 814 (i.e., sub-page 15). Because the metadata for all of the sub-pages are maintained within the same metadata page record, the updates to the corresponding metadata records will also likely be performed as write operations to metadata cache memory. Additionally, in at least some embodiments, a defragmentation process (previously described) executes in background within a processor of the intelligent storage system of the present disclosure, reallocating space among the various chunks so as to periodically free up the reserved space at each level within the data page hierarchy, while still keeping related data and metadata in the same or physically proximate chunk data pages and metadata record pages on the pLUN, respectively. By maintaining a pool of reserved space, future chunk modifications can be continually accommodated with little or no metadata-related performance penalty (as compared to the initial write of the chunk data).

The thin provisioning described above, wherein units of the backend chunk pLUN are allocated only when data is actually written, is not limited to just the chunk data. In at least some example embodiments, space on the backend metadata pLUN (e.g., backend metadata pLUN 940 of FIG. 9) is also allocated when the corresponding chunk data is allocated on the backend chunk pLUN (e.g., backend chunk pLUN 930 of FIG. 9), regardless of when the corresponding space is allocated on the vLUN. Because the metadata pages are of a known, fixed size, as the storage requirements of the system grows the corresponding metadata storage requirements can be calculated and increased in direct proportion to increases in chunk data storage. Thus, physical storage resources needed for both the chunk data and the chunk metadata can be added to the intelligent storage system on an as-needed basis, as demand increases, over time. It should be noted that because the metadata pages are of a known fixed size, in at least some example embodiments there is no need to maintain reserved space within the physical units of the backend metadata pLUN. Also, in such example embodiments, the physical units are sized to match either the size of a metadata page, or a multiple of the size of a metadata page.

Functional Details: Chunk Creation and Chunk Identifier Generation

Figure 10A:
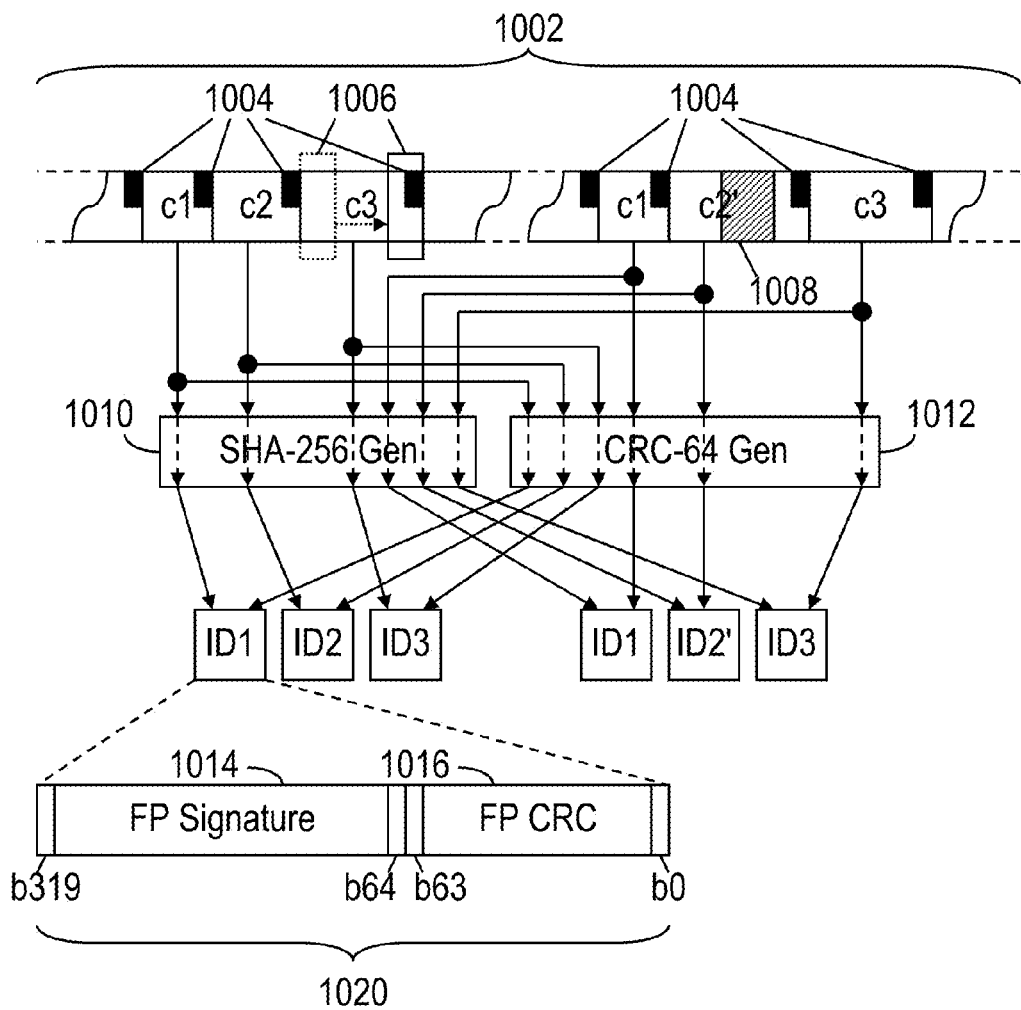
FIG. 10A shows the chunking and chunk ID generation implemented by deduplication engine 301 of FIG. 3, in accordance with at least some example embodiments.

FIG. 10A illustrates some of the processing performed on an incoming data stream received for storage by deduplication engine 301, in accordance with at least some example embodiments. Data stream 1002 is first subdivided into "chunks" of varying size as the data is received (e.g., chunks c1-c3 and c2' of FIG. 3). Duplicate chunks may later be "deduplicated" (as previously described), and deduplicated chunks may optionally be individually compressed before being stored. The size of each chunk is determined based upon the content of the data, a technique sometimes referred to as "content-defined chunking." The boundary between two chunks is defined by identifying anchor points 1004 that depend upon small subsets of the data, as shown in FIG. 10A. More specifically, as the data is received a digital signature is calculated on a small, fixed size sliding window 1006 over the data stream. While any random irreducible polynomial may be used to generate the digital signature (and thus all such polynomials are contemplated by the present disclosure), in at least some embodiments a Rabin fingerprint is calculated over a 48-byte sliding window according to the 22-bit polynomial, $$X^{22}+X^{20}+X^{18}+X^{16}+X^{13}+X^{12}+X^{10}+X^4+X^3+X+1. \quad (1)$$

Although a 48 byte is used in at least some of the embodiments described, other window sizes may be used and all such window sizes are contemplated by the present disclosure.

The length of the polynomial used to calculate the digital signature determines the upper limit of the average chunks size, which for the polynomial of equation (1) is 4 Mbytes. In at least some embodiments, the maximum chunk size is limited to 64 Kbytes so as to limit the amount of hardware needed to implement said embodiments. As the data is received, signature window 1006 moves along the data stream and the digital signature for the 48 bytes currently within the window is calculated. An anchor 1004 is identified when a selected subset of bits of the resulting digital signature (the Rabin fingerprint value in the embodiments described) matches a pre-defined constant value. In at least some embodiments, the 13 least significant bits of the digital signature are used (yielding a probability of 1 in $2^{13}$ of identifying the chosen constant value within a data byte), and are compared against a constant value of 0x78. The resulting average chunk size is 8 Kbytes, assuming a random distribution of the data within the data stream.

The use of a digital signature as described above is susceptible to extreme cases, wherein the identified anchors may be either too close to each other or too far apart. To avoid such cases, upper and lower limits may be imposed to force both a minimum and a maximum distance between anchor points. In at least some embodiments, a minimum chunk size (i.e., a minimum anchor spacing) is imposed by not beginning the search for an anchor until at least 2 Kbytes of data have been received since the last identified anchor (or since the start of data reception if no anchors have yet been identified). If the data stream is less than the minimum chunk size, fill bytes are added at the end of the stream until the minimum chunk size is reached. Similarly, a maximum chunk size is imposed by ending the search for an anchor if 64 Kbytes have been received since the start of data reception or since identifying the previous anchor point, in which case the anchor point is forced at 64 Kbytes (which is the maximum size chosen to simplify the implementation of at least some of the hardware, as previously noted).

By using digital fingerprinting to define chunks, a small change in one chunk within a data stream will not cause a mismatch between all subsequent chunks and previously matching chunks, which would prevent inter-block deduplication of the chunks (whether compressed or uncompressed) after the change. Continuing to refer to the example of FIG. 10A, if two sequences of chunks c1-c2-c3 and c1-c2'-c3 are transmitted within the data stream 1002, only the chunk that is different (chunk c2') will not be deduplicated. Because the anchor points are content-defined, the anchor points defining chunks c1 and c3 will be the same within both sequences c1-c2-c3 and c1-c2'-c3, despite the insertion of additional data 1008 within chunk c2', and thus most of sequence c1-c2'-c3 can be deduplicated relative to sequence c1-c2-c3 (i.e., stored at least partially as a series of pointers to the corresponding matching chunks c1 and c3 within sequence c1-c2-c3).

As the data stream of FIG. 10A is subdivided into chunks, a "chunk identifier" is generated to uniquely identify each chunk (e.g., ID1, ID2, ID2' and ID3). While any number of hash functions may be used to generate the chunk identifier (all of which are contemplated by the present disclosure), in at least some example embodiments a chunk identifier is produced that is a composite of two hash values, wherein each hash value is generated by inputting the chunk data through separate, independent hash functions (hash generation functions SHA-256 Gen 1010 and CRC-64 Gen 1012). The first hash value (FP Signature 1014) is generated using a 256-bit Secure Hash Algorithm (SHA-256), while the second hash value (FP CRC 1016) is generated as a 64-bit Cyclic Redundancy Check (CRC-64) code. The two hash values are concatenated to produce 320-bit chunk identifier 1020, with FP Signature 1014 (the SHA-256 hash value) occupying bits 319 through 64 (b319-b64) of chunk identifier 1020, and FP CRC 1016 (the CRC-64 hash value) occupying bits 63-0 (b63-b0) of chunk identifier 1020.

Functional Details: Duplicate Block Identification

Once the chunks are defined and the identifiers for each chunk have been generated, each chunk is checked to determine if it is a duplicate of another chunk already stored within the storage system. Each chunk is checked by "folding" selected subsets of its chunk identifier bits into a series of smaller hash address values, each of which is applied to a Bloom filter to determine if the unique chunk identifier (and thus the chunk) has previously been stored by the storage system. A Bloom filter is a space-efficient probabilistic data structure that is used to determine whether an element is a member of a set. False positives are possible, but false negatives are not, and elements are added to the set, but are not removed. Further, the more elements that are added to the set, the larger the probability of false positives. A Bloom filter is organized as an array of m bits, which are all initialized to a de-asserted state (e.g., zero). An element is added to the set by applying k independent hash functions to the element data, and using the resulting k hash values to address and assert (e.g., set to one) a bit within the array of bits. Thus, for each element added, k bits within the array will be asserted. A query to test whether an element already belongs to the set is performed by applying the k hash functions to the set element data and testing each of the k bits addressed by each resulting hash address value. If any of the k bits read are de-asserted, the element is not in the set. If all k bits read are asserted, then the element may be in the set, but is not guaranteed to be in the set.

For larger values of m (i.e., a larger number of Bloom filter array bits), independence among the k hash functions can be relaxed with a negligible increase in the rate of false positive indications to query responses. Further, because a good hash function is one that has little if any correlation between different bit fields of the hash address value generated, a hash function that generates a wide hash address value can be subdivided into k bit fields (sometimes referred to as partitioning) to produce the k "independent" hash function values. Thus, while the hash function values produced by partitioning may not be truly independent, such values are independent enough for use with the Bloom filter if the original base hash value is wide enough and the partitioned hash values are applied to a Bloom filter with a large number of Bloom filter array bit (e.g., a 256-bit hash value that is partitioned into four 39-bit hash address values that each address 1 out of 549,755, 813,888 ($2^{39}$) possible Bloom filter array bits). The results of a smaller number of independent hash functions (e.g., 2 or 3 functions) may also be manipulated and combined (sometimes referred to as double or triple hashing) as an alternative means of producing the k "independent" hash function values required by a Bloom filter (e.g., an SHA-256 value combined with a CRC-64 value to produce a 320-bit hash value that is subsequently partitioned). In at least some embodiments, a combination of partitioning and multi-level hashing are used to produce the k hash function values.

Figure 10B:
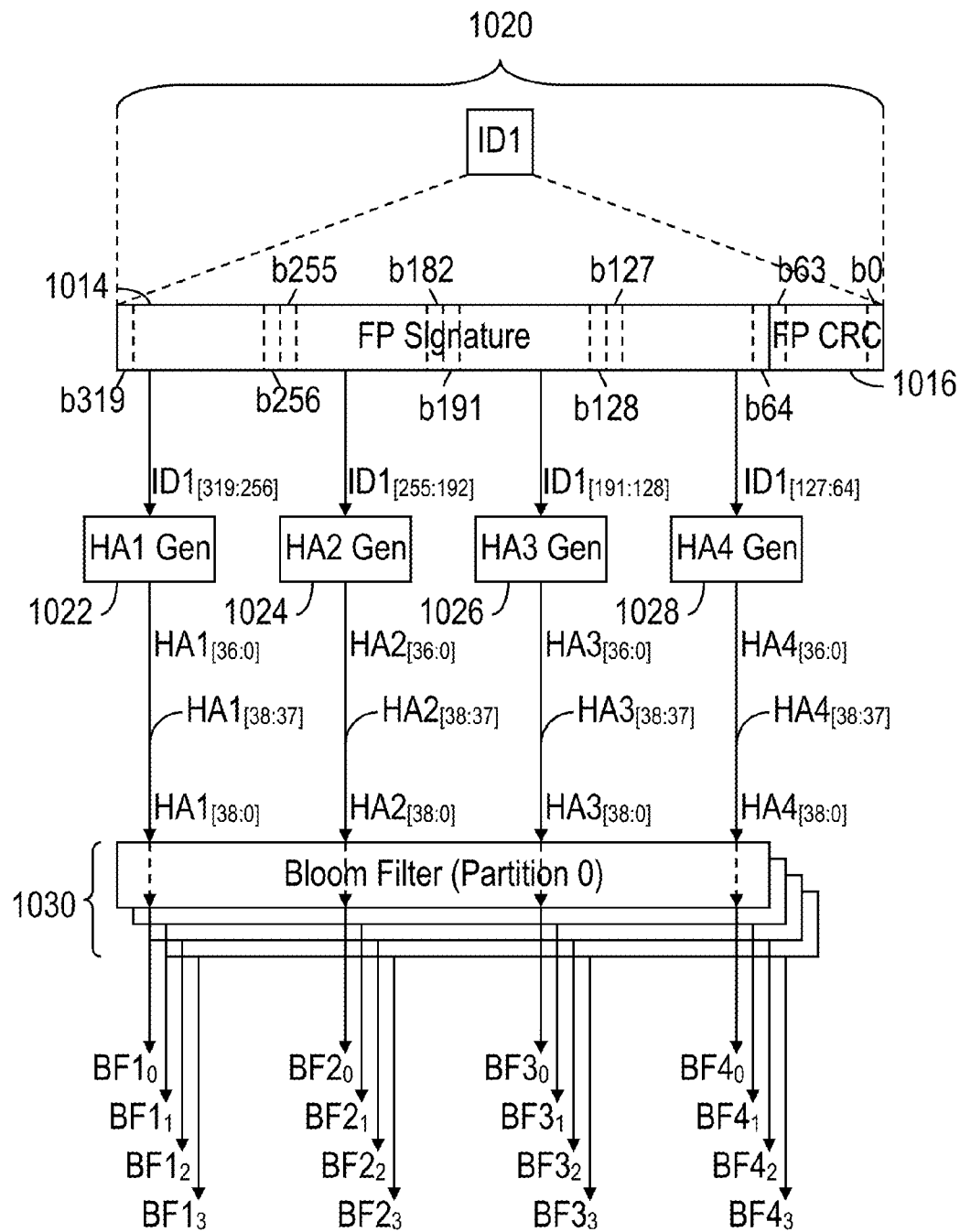
FIG. 10B shows the conversion of the chunk ID of FIG. 10A into separate hash address values used to access the Bloom filter status bits, in accordance with at least some example embodiments.

In the example of FIG. 10A, 256-bit fingerprint signature 1014 is manipulated ("folded") to produce k, 39-bit hash address values. FIG. 10B shows an example of such "folding," wherein fingerprint signature 1014 of chunk identifier 1020 is subdivided into 4 bit fields (k=4), each of which is folded by hash address generators 1-4 (HA1 Gen 1022 through HA4 Gen 1028) to each generate one of four hash address values (HA1 through HA4). Each hash address value may be up to 39-bits in width, depending upon the partition size. The partition size (minus 1) acts as a mask that ensures that the addresses each fall within a given partition. Each of the resulting k address values is then applied to Bloom filter 1030. Table 2 illustrates an example for generating the hash addresses with k set to 4:

TABLE 2

| k | Bit Field Subdivision | Hash Address Generation (Folding of ID bits) |
|---|---|---|
| 4 | Field1: ID[63:0]<br>Field2: ID[127:64]<br>Field3: ID[191:128]<br>Field4: ID[255:192] | For Field1-Field4 (substituting the corresponding ID bits):<br>a) ID bit field bits are folded to form a 37-bit address:<br>Fold[36:0]=ID[36:0]^ID[63:37]<br>b) Mask to force address into partition address range:<br>Mask[36:0]=Fold[36:0]&{PartSize-1,28'hiff_ffff,3'h7}*<br>c) Add partition base address:<br>HashAddr[38:0]=Mask+{PartBaseX**,28'h0,3'h0} |

*Indicates a 28-bit field set to all ones, concatenated with one less than the partition size. PartSize is the size of a memory partition in 256 Mbyte increments (4-bit field).
**PartBaseX is the partition base address in memory for partition X (0-3), in 256 Mbyte increments (8-bit field that includes hash address bits 31-38).

In at least some example embodiments, the Bloom filter array is maintained in memory as a collection of individual bits that each corresponds to a single hash address. Thus, for a 39-bit hash address, up to 549,755,813,888 ($2^{39}$) Bloom filter bits may be accessed, requiring 64 Gbytes of memory for the Bloom filter status array ($2^{39}$ bits/$2^3$ bits per byte). This address space is further subdivided into partitions, each of which addresses the status bits for a separate Bloom filter 1030. The filters are each presented with the same hash address (e.g., HA1$_{[38:0]}$ of FIG. 10B) to concurrently access the corresponding Bloom filter bit in each partition as described in more detail below. In at least some embodiments, deduplication engine software 350 of FIG. 3 selects the partition by determining the value of the upper two most significant bits of the Hash address (e.g., HA1$_{[38:37]}$). In the example of FIG. 10B, each Bloom filter includes 137,438,953,472 status bits ($2^{39}$ bits/$2^2$ partitions), each requiring 16 Gbytes of memory ($2^{37}$ bits per filter/$2^3$ bits per byte). The sizing of the partitions and the number of partitions actually configured depends upon such factors as the number of configured hash functions, the amount of memory available for use by the Bloom filter, and the desired worst case false positive detection rate of the Bloom filter (e.g., the false positive detection rate of a full backend storage device). Further, the partitioning of the Bloom filter memory space is mirrored by a similar partitioning of the memory and storage space used to maintain the hash index table, CAS metadata and chunk data as described in more detail below.

For each Bloom filter the k resulting hash address values are used to address one of m bits stored within a partition in memory (i.e., the Bloom filter data structure), thus accessing the Bloom filter status bit corresponding to the hash address value. In the example of FIG. 10B, hash address values HA1 through HA4 each separately accesses a corresponding status bit within Bloom filters 1030 for each of the four partitions shown (status bits BF1 through BF4 for each of partitions 0-3). Status bits BF1$_0$ through BF1$_3$ are accessed using hash address HA1, status bits BF2$_0$ through BF2$_3$ are accessed using hash address HA2, and so forth for the remaining hash addresses HA3 and HA4. Each of the k status bits for each partition is read and tested to determine whether the hash address value has not previously been processed and thus not previously been stored on the storage system (i.e., at least one of the k bits read is not asserted). If any of the k bits read is not asserted (i.e., this is the first occurrence of the chunk processed by the storage system), then the k status bits for the active partition (described in more detail below) are re-saved in the asserted state back to the corresponding Bloom filter data structure, thus recording the occurrence and storage of the chunk (corresponding to the processed chunk ID).

As already noted, the Bloom filter accurately indicates when a particular chunk identifier (and thus the chunk) has not previously been detected by the storage system (no false negative indications), but may indicate that the chunk identifier has previously been detected and processed when in fact it has not (a false positive indication). In at least some example embodiments, a chunk that is identified as new by the Bloom filter is flagged for storage, and no additional reads to memory and/or disk are performed (and none are needed) to confirm that the chunk is new. If the chunk is identified by the Bloom filter as a duplicate, additional reads to memory and/or disk must be performed to determine whether the chunk really is a duplicate (i.e., has already been stored) and is not a new chunk that has been incorrectly identified as new (i.e., a false positive). If the chunk is in fact a new chunk, it is flagged for storage. If the chunk is a duplicate of a previously stored chunk, the chunk is flagged as a duplicate chunk that requires additional processing, as further described below.

Because the removal of a set element from the Bloom filter array is not possible, the rate of false positive indications will increase as chunks are deleted from the storage system (while their corresponding Bloom filter entries are not deleted), or as data is changed (thus changing the corresponding Bloom filter entry without deleting the previously corresponding entry). To address this issue, at least some embodiments can reinitialize and reconstruct the Bloom filter array to reflect the current contents of the storage system. The reconstruction is initiated by the deduplication engine software, based upon a threshold being exceeded (e.g., if the number of false positive for the last 1000 Bloom filter searches exceeds 20%). When being rebuilt, the Bloom filter array is marked as "disabled" and messages sent by the deduplication assist hardware in response to requests from the deduplication software to search the Bloom filter array indicate that no search was performed. This response causes the deduplication software to perform additional memory and/or disk reads similar to those performed when the Bloom filter indicates that the chunk identifier is a duplicate. While disabled, the Bloom filter is cleared (all bits de-asserted). The CAS index is then searched for all fingerprints currently stored within the CAS buckets, and each Bloom Filter array entry, corresponding to the hash addresses produced by each fingerprint, is asserted to indicate that the chunk associated with the fingerprint is already on the disk. When all of the fingerprints stored within the CAS index have been processed, the Bloom filter is marked "enabled," and processing of Bloom filter search requests resumes.

To reduce the impact of the above-described Bloom filter rebuild on the overall performance of the system, a partition rotation scheme is implemented in at least some embodiments. According to one such example scheme, one partition is selected as the active partition and this is the partition that is updated whenever a new chunk is identified and saved. Upon reaching a predetermined threshold value, but before reaching the above-described rebuild threshold value, the active partition is deselected and another partition is selected as the active partition. If the deactivated partition subsequently exceeds the rebuild threshold and a rebuild is initiated, writes of new chunks will not be affected by the rebuild since updates to the Bloom filter are only applied to the active partition. Further, because such a rotation scheme results in a distribution of the status bit over multiple partitions, the probability of accessing a Bloom filter being rebuilt is reduced proportionately by the number of partitions. In at least some embodiments, only one partition is rebuilt at a time to further reduce the chances of accessing a Bloom filter being rebuilt. Also, because the partitions are subsets of the total memory allocated for the Bloom filters rebuilding only a single partition takes less time than would be required to rebuild a single Bloom filter occupying the entire Bloom filter memory space.

The above-described rotation scheme also results in a segregation of Bloom filter status bits within each partition, with status bits corresponding to newer chunks being stored in partitions that were more recently the active partition, and status bits for older chunks being stored in partitions that were less recently the active partition. A rebuild of a Bloom filter may be initiated whenever the corresponding partition becomes the oldest partition (least recently selected as the active partition). In this manner the oldest partition, which tends to have a higher number of false positive indications, is rebuilt prior to being selected as the active partition even if it hasn't reached its rebuild threshold. Such preemptive Bloom filter rebuilding helps reduce false positive indications for the active partition, which tends to be the most active partition, thus improving the overall system performance.

Each of the hash values included within chunk identifier 1020 may also each be used separately to implement other functions within deduplication engine 301 of FIG. 3. In at least some embodiments, fingerprint signature 1014 of chunk identifier 1020 is further used to uniquely identify the chunk used to generate the signature, while requiring less data bits than the full chunk identifier. Similarly, fingerprint CRC 1016 of chunk identifier 1020 is additionally used to provide integrity and/or error checking of the corresponding chunk data as it is processed by the various components of deduplication engine 301.

Functional Details: Chunk Deduplication

Because the fingerprint signature uniquely identifies a chunk, it is possible to also use this signature as an indicator of the location within a storage system of the chunk. A hash value can be derived from the fingerprint signature (which itself was previously derived from the data within the chunk) and the derived hash value used to determine the location of the chunk. Such a use of data content to produce a hash value that identifies the location in storage of the data content is sometimes referred to as "Content-Addressable Storage" (CAS). In at least some example embodiments, the 24 most significant bits of the fingerprint signature are used as a hash value to access a disk-resident hash index table.

Figure 11A:
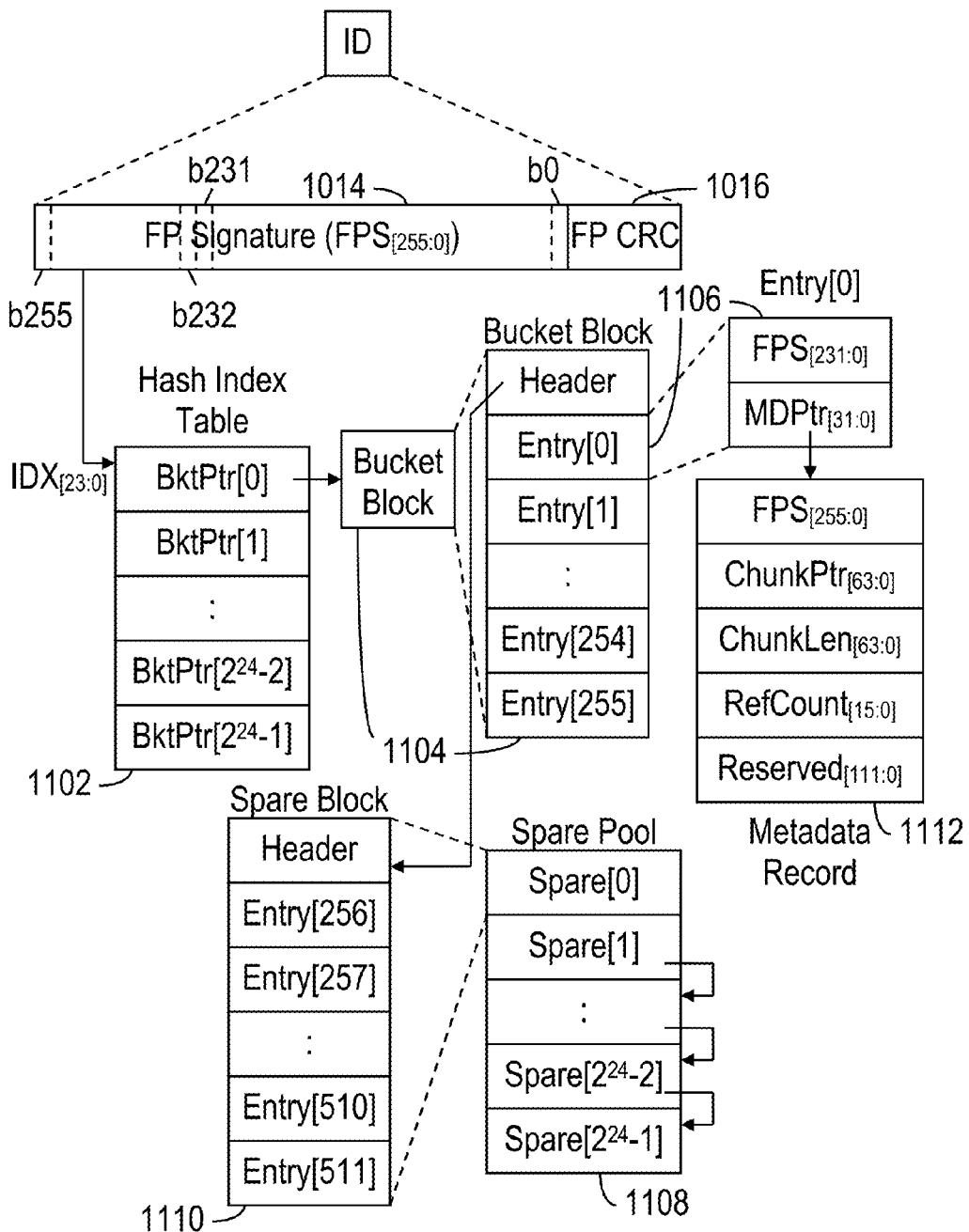
FIG. 11A shows the organization of the metadata within the disk-resident portion of a CAS system, in accordance with at least some example embodiments.

FIG. 11A illustrates an example of a disk-resident CAS system, implemented in accordance with at least some embodiments, which uses at least part of the fingerprint signatures of the chunk IDs of FIGS. 10A and 10B to index into CAS hash index table 1102 as described above. The 24-bit hash value ($IDX_{[23:0]}$) is used as an index into table 1102, which contains a list of 32-bit pointers to CAS "bucket blocks" at each indexed location within the table. If a valid pointer (e.g., a non-zero pointer) exists at the indexed location, a valid entry exists within the bucket block addressed by the pointer. In the example of FIG. 11A, the hash index table entry for the bucket pointer corresponding to index 0 (BktPtr [0]) contains the address of bucket block 1104. Each bucket block includes a header and 256 CAS entries, wherein each entry includes the remaining 232 bits of the fingerprint signature (29 bytes) and a 32-bit pointer (4 bytes) to a CAS metadata record. Thus, in the example of FIG. 11A, bucket block 1104 includes entry[0]1106, which includes the 232 least significant bits of fingerprint signature 1014 ($FPS_{[231:0]}$) and a pointer (MDPtr) to metadata record 1112, which describes the chunk corresponding to fingerprint signature 1014.

Because only 24 bits of the fingerprint signature are used to locate a bucket block (via its index), multiple fingerprint signatures can map to the same bucket block (i.e., two or more fingerprint signatures may "collide"). For this reason, multiple entries are maintained within each bucket block, with each entry including the remaining bits of the fingerprint signature (FPS bits 231:0 in the example of FIG. 11A). The specific entry corresponding to the fingerprint signature used to access the bucket block can be identified by searching through the entries for the correct fingerprint signature within a bucket using any of a number of known data structures and search methods.

In other example embodiments, each bucket block entry stores the next 32 most significant bits following the 24 index bits of the fingerprint signature, rather than the full remaining 232 bits. This reduces the minimum storage requirements for each buck block entry from 33 bytes per entry to 8 bytes per entry. However, in order to determine if the full fingerprint signature matches, the full signature corresponding to the entry must be read from the metadata record pointed to by the entry. If the full fingerprint signature is not a match, the metadata records for each subsequent partially matching entry within the bucket block must be read until a matching entry is found, or the end of valid entries in the bucket block is reached. The savings in bucket block storage space is thus achieved at the expense of entry processing time for fingerprint signatures that map to a bucket block with multiple entries, wherein a matching entry is either not the first entry or is not yet stored within the bucket block. In still other embodiments, the full 240 bits of the fingerprint signature are stored in the bucket block.

Although each bucket block of the described embodiments can accommodate up to 256 entry pointers, the number of entry slots pre-allocated per bucket block may be set to any value (higher or lower than 256 entries), depending upon the average chunk size and the total amount of storage which needs to be represented by the hash index table. Thus, for at least some of the described embodiments, with an average chunk size of 8 Kbytes (each represented by a single entry) and $2^{24}$ hash index table buckets, if a total storage capacity of 32 Tbytes is desired, the buckets must be able to accommodate, on average, 256 entries ($2^{24}$ buckets*256 entries/bucket=$2^{32}$ entries, and $2^{32}$ * 8Kbytes/entry=32 Tbytes). If more (or less) storage space is desired/required, buckets with more (or less) entries may be used, or a larger (or smaller) table (i.e., a larger/smaller number of buckets) may be used, or both different table and bucket sizes may be used. Those of ordinary skill in the art will recognize that any combination of table sizes and/or bucket sizes may be used to meet any of a number of desired storage requirements, and all such combinations are contemplated by the present disclosure.

Even though the use of SHA-256 to generate the fingerprint signature, and the generally random nature of the data processed, together tend to produce a statistically random distribution of entries among buckets, it is possible for some data patterns to cause one or more bucket blocks to require more than the number of entries allocated to a bucket block (e.g., more than 256 in the example of FIG. 11A). To address this bucket overflow condition, in at least some embodiments a spare pool that includes a number of unused bucket blocks (e.g., Spare Pool 1108 of FIG. 11A) equal to the total number of pre-allocated "permanent" bucket blocks is maintained in a linked list. Each of these "spare" bucket blocks can be re-linked to the any of the permanent bucket blocks if additional entries are needed within a bucket block. The example of FIG. 11A illustrates such a case, wherein bucket block 1104 (corresponding to bktPtr[0]) is linked to spare block 1110 (corresponding to the spare[0] entry of spare pool 1108). The remaining spare entries within the spare pool remain linked to each other. If the number of entries within an overflowed bucket is later reduced below the overflow point, the spare bucket block can be released and returned to the spare bucket pool (i.e., unlinked from the permanent bucket block and re-linked to the spare bucket blocks of the spare pool linked list).

In at least some embodiments, the partitioning described with respect to the Bloom filter is also applied to the system's metadata and data. Thus, each partition has a hash index table, bucket blocks, CAS metadata and chunk data. When a Bloom filter provides a positive indication, the metadata structures corresponding to the Bloom filter's partition are accessed. If none of the Bloom filters for any of the partitions provide a positive indication, the new metadata and data are stored within the appropriate structures corresponding to the active partition. As with the bloom filter status bits, the previously-described rotation of the partitions operates to segregate and distribute the metadata and data across partitions. Further, in at least some embodiments, metadata and data stored on older partitions are given priority over newer metadata and data by defragmentation module 362 of FIG. 3, as the older data and metadata are more likely to be fragmented. Since newer defragmented data is stored on the active partition, this operates to preemptively free up space on the older partition prior to being selected as the active partition.

Figure 11B:
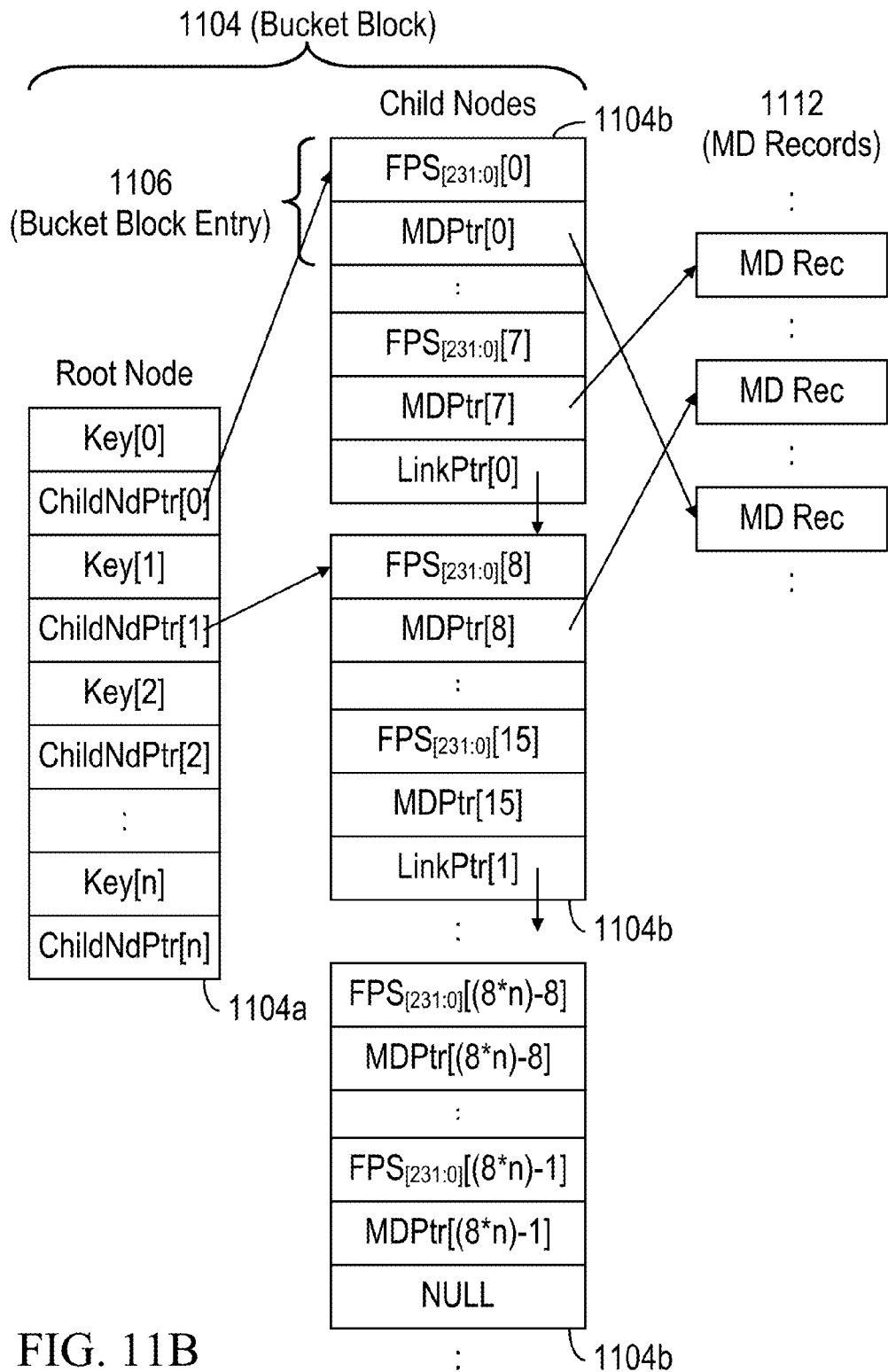
FIG. 11B shows the organization of a B+ search tree implemented within a CAS bucket block, in accordance with at least some example embodiments.

In at least some embodiments, the entries within a bucket are organized as a B+ search tree, as shown in FIG. 11B. The theory and use of B+ search trees is well known in the art and thus the discussion that follows focuses primarily on the structure of the disclosed embodiments that implement such trees. In the embodiment of FIG. 11B, each of the bucket blocks 1104 includes both a memory-resident root node 1104*a* (initialized when intelligent storage system 200 is initialized) and disk-resident child nodes 1104*b* of the B+ search tree. The child nodes together contain the bucket block entries 1106 of bucket block 1104 (each entry including bits 231:0 of fingerprint signature 1014 and a pointer to the corresponding metadata record).

By using the B+ search tree structure of FIG. 11B, bucket blocks with multiple entries may be searched for a fingerprint signature match more efficiently when compared to a straight linear search of the bucket block structure shown in FIG. 11A. Also, because the root node is created and maintained in memory, the basic structure of the bucket block entries stored on disk is essentially the same for both the linear search implementation of FIG. 11A and the B+ search tree implementation of FIG. 11B. Thus, as long as all the bits of the value used as the key of the search tree are stored in the bucket block entry (e.g., the lower 231 bits of fingerprint signature 1014), intelligent storage system 200 may be optionally operated either with or without the B+ search tree without altering how bucket block entries are stored.

It should also be noted that when a B+ search tree is implemented there is no need for a separate spare bucket block linking field within the bucket block header, as shown in FIG. 11A. Instead, in at least some embodiments the link pointer of the last child node (normally set to a null) is set to the location of the first entry of the spare bucket block. All other operations regarding the spare bucket block are performed as previously described.

Functional Details: Caching and Cache Optimization

Figure 11C:
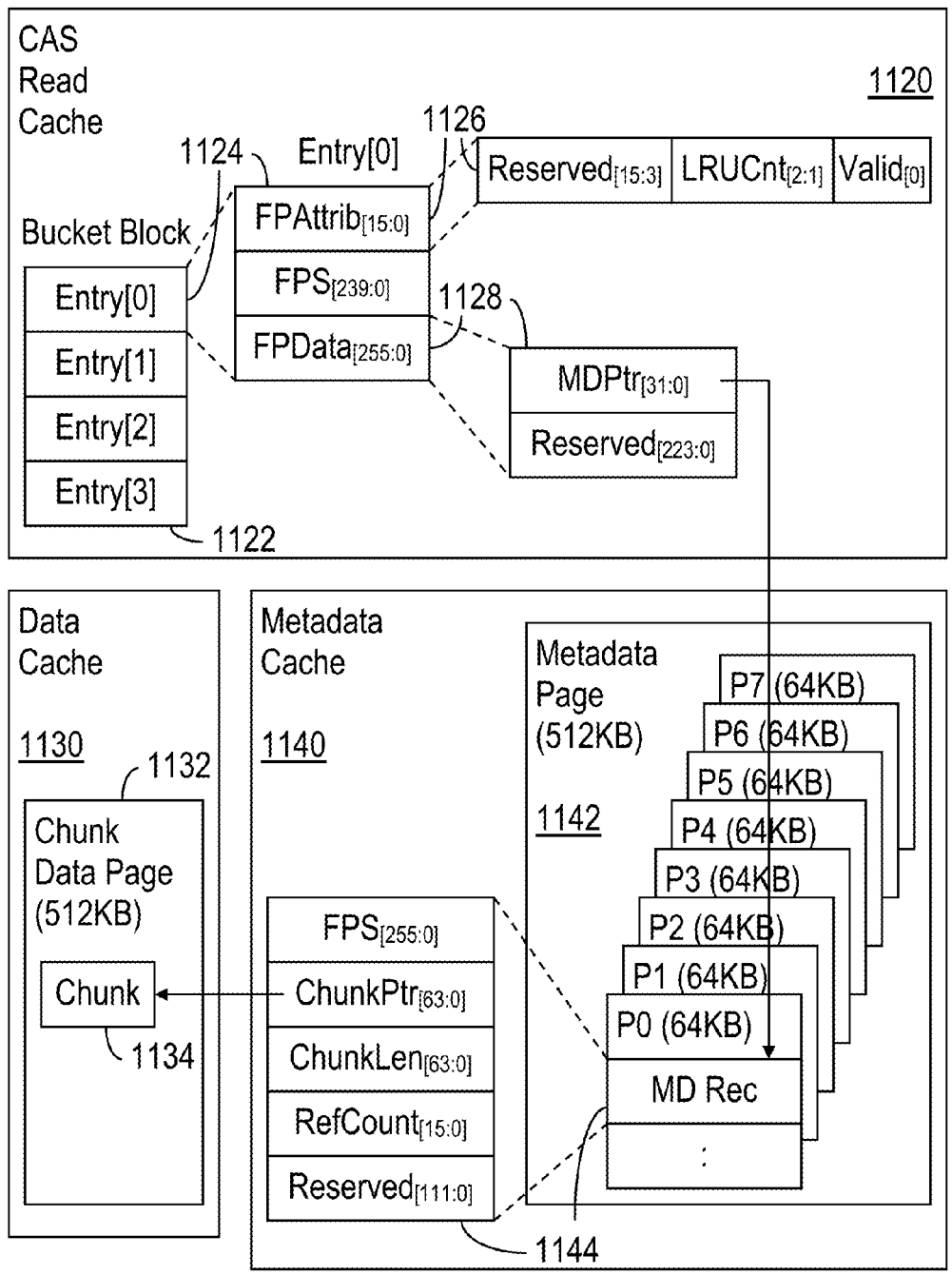
FIG. 11C shows the organization of the metadata within the read section of the memory-resident portion (read cache) of a CAS system, in accordance with at least some example embodiments.

To further improve the performance of the storage system utilizing the CAS technique described above, at least some example embodiments include both a CAS read cache and a CAS write CAS. Referring to FIG. 11C, CAS read cache 1120 maintains a memory-resident subset of the disk-resident CAS bucket blocks and entries, wherein only some of the bucket blocks are copied from disk into the CAS read cache as a memory-resident bucket block (e.g., Bucket Block 1122), and wherein each memory-resident bucket block copy only includes four of the entries of the corresponding disk-resident bucket. The CAS read cache thus operates as a 4-way associative cache. Each memory-resident entry (e.g., Entry[0] 1124) includes additional fields (e.g., a least recently used count and a valid bit) within an attributes section (e.g., FPAtrib$_{[15:0]}$ 1126) that are used to maintain usage information of the memory-resident entries. These fields allow invalid and/or lesser used entries to be replaced with other entries (read from disk) for the same bucket block, as needed (e.g., using a least recently used or LRU algorithm).

When an entry is identified as corresponding to the fingerprint signature of a chunk being processed, the metadata page that includes the metadata record pointed to by the identified entry is accessed (e.g., metadata page 1142 including metadata record (MD Rec) 1144, pointed to by a metadata pointer within fingerprint data (FPData) 1128 within Entry[0] 1124) and read into a separate cache memory (e.g., metadata cache 1140). In the example shown in FIG. 11C, chunk data page 1132, which includes the data chunk referenced by metadata record 1144 (chunk 1134) is also read into another cache memory (data cache 1130), thus providing additional performance improvements.

The above-described read caching of metadata and data takes advantage of the temporal and spatial locality of many types of data. It is not uncommon for data to be created and modified contemporaneously and related data is frequently stored in a common location (e.g., a common subdirectory) even if saved as separate files. The bucket blocks provide an abstraction layer that enables co-locating related metadata records on disk. The metadata records similarly provide an abstraction layer that enables co-locating related data chunks on disk. Such co-location reduces the probability of cache misses when accessing related information, as co-located related metadata data and data will generally already be loaded and available in the corresponding cache after the initial access of the first chunk and its related metadata. Further, defragmentation module 362 of FIG. 3 operates to maintain such co-location, thus sustaining the performance gains achieved by co-locating the metadata and data.

Figure 11D:
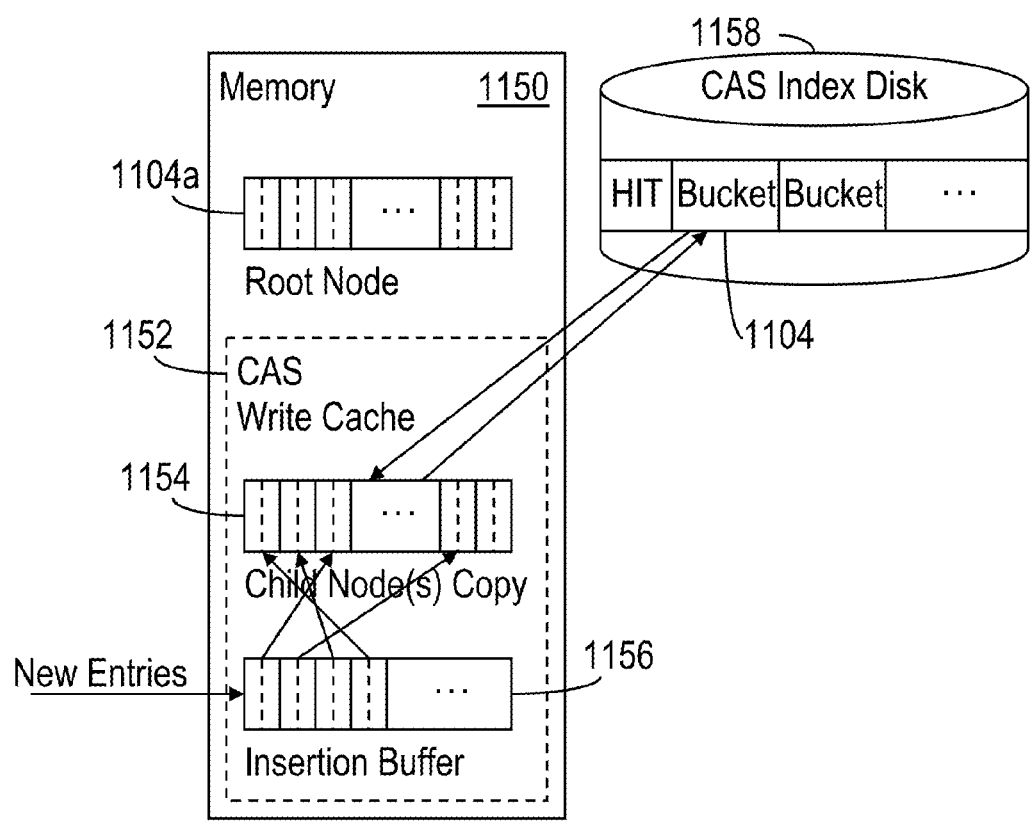
FIG. 11D shows the organization of the meta data within the write section of the memory-resident portion (write cache) of a CAS system, in accordance with at least some example embodiments.

FIG. 11D illustrates an example of a CAS write cache 1152 that interacts with and updates the B+ search tree of FIG. 11B. When new buck block entries are added to a bucket block, the new entries are added to insertion buffer 1156 within CAS write cache 1152, which is associated with a particular bucket block. CAS write cache 1152 and previously-described root node 1104a of the B+ tree are both stored within memory 1150. New entries continue to be added to the bucket block's insertion buffer 1156 until a flush of the buffer is triggered. The buffer flush may be triggered, for example, by the buffer being full or by a request to read an entry from bucket block 1104. In either case, one or more child nodes 1154 are copied from disk-resident bucket block 1104 into CAS write cache 1152. The contents of insertion buffer 1156 are inserted into the appropriate locations within the copy of the bucket block's child node(s) and the root node is updated, as required to maintain the B+ search tree. Once child node(s) copy 1154 and root node 1104(a) are updated the child node(s) copy is written back to disk-resident bucket block 1104. In this manner, multiple write updates to bucket blocks stored on CAS index disk 1158 can be performed in as little as one I/O operation (e.g., a read-modify-write operation). Additional performance improvements may be achieved by sizing the child nodes to match a memory or disk device access unit size (e.g., a memory page size, a disk sector size, both or multiples of both).

In at least some example embodiments, a second data cache or "chunk group cache" (not shown) is maintained between data cache 1130 of FIG. 11C and the backend pLUN that temporarily stores chunk data written to the pLUN. The chunk group cache collects into chunk group buffers allocated for each unit (e.g., a 4 Mbyte chunk group buffer allocated within a chunk group cache implemented using 2 Gbytes of non-volatile RAM) the data and metadata associated with individual chunks or groups of chunks written to a given pLUN unit. When a chunk group buffer is full, or when a threshold time limit for holding the buffered data chunks has expired, the data chunks are written to the pLUN unit in just a few write operations (possibly as few as one write operation). By grouping the data as described, the overhead associated with large numbers of smaller write operations is avoided, providing additional performance improvements.

Although only a subset of CAS bucket blocks and entries are maintained in CAS read cache memory 1120 at any given point in time, a complete copy of the full disk-resident CAS hash index table 1102 of FIG. 9A is maintained in memory, allowing quick access to the bucket blocks within either the memory-resident CAS cache, or the disk-resident CAS storage. This is possible due to the fact that the hash index table only includes the 32-bit block pointers to the bucket blocks, and thus the entire table only requires 64 Mbytes of memory ($2^{24}$ table entries*4 bytes per entry=64 Mbytes).

As previously noted, as many as 8 partitions may be defined for a corresponding number of Bloom filter, hash index table, bucket block, CAS metadata and chunk data partitions. In at least some embodiments that implement such partitioning, the CAS cache may similarly be divided into separate corresponding partitions.

Figure 11E:
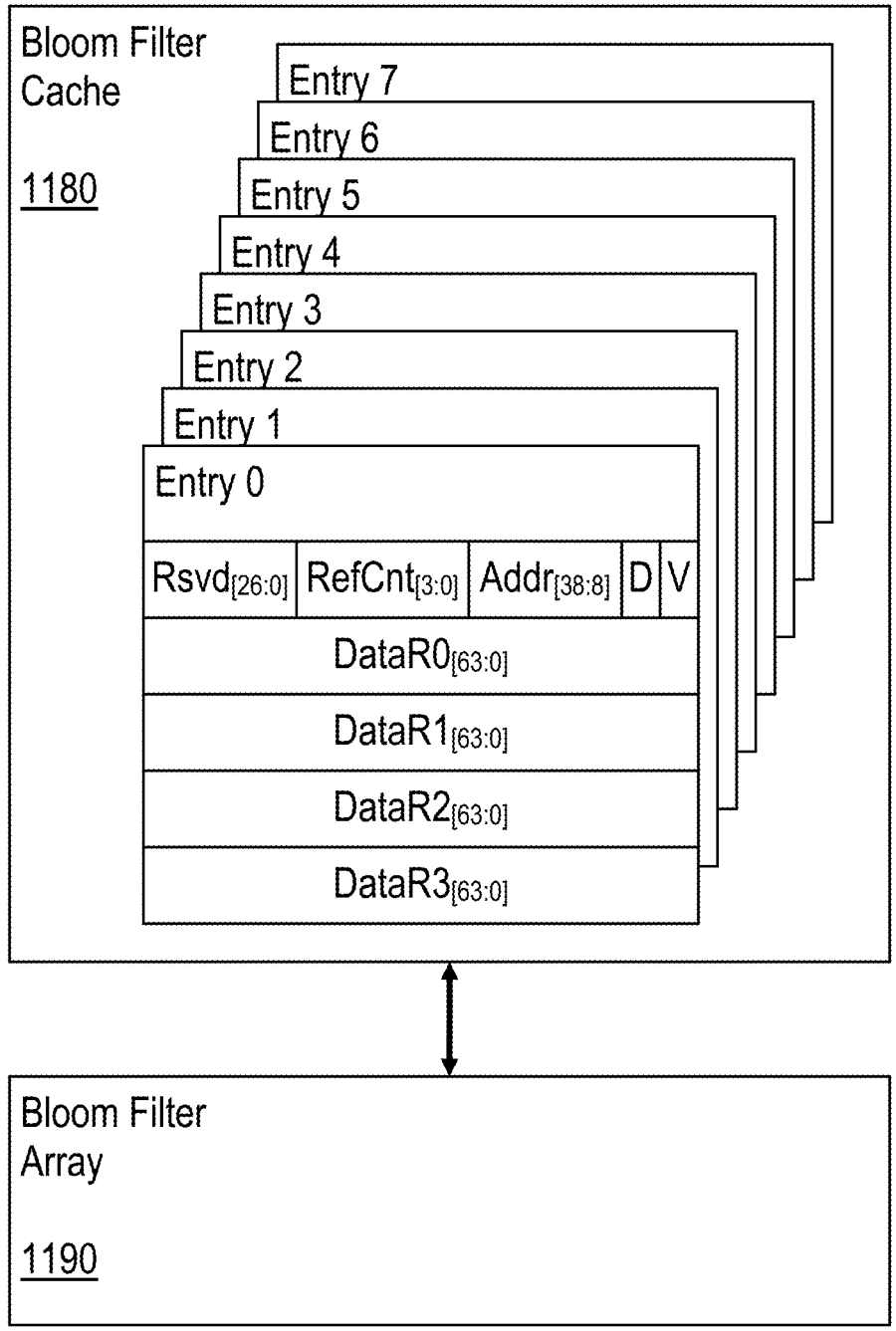
FIG. 11E shows the organization of the Bloom filter data within the Bloom filter cache, in accordance with at least some example embodiments.

The Bloom filters are each maintained in high performance memory devices (e.g., double data rate, version 2, synchronous dynamic random access memories, or DDR2 SDRAMs). However, because the Bloom filters are accessed more frequently than the CAS or metadata caches (also maintained in DDR2 SDRAMs), in at least some embodiments a Bloom filter cache is utilized to further improve the performance of deduplication engine 301. As shown in FIG. 11E, Bloom filter cache 1180 includes 8 entries (Entry 0-Entry 7). Each entry includes a valid bit (V), a dirty bit (D), a 31-bit address field ($Addr_{[38-8]}$), a 4-bit reference count, 27 bits reserved for future expansion ($Rsvd_{[26:0]}$), and 256 Bloom filter status bits (organized as 4 rows of 64 status bits each, DataR0-DataR3).

When data is read from within Bloom filter array 1190, 32 bytes of array data is read into an available Bloom filter cache 1180 entry (i.e., an entry with a de-asserted valid bit). As previously noted, in at least some example embodiments each unique 39-bit hash address presented to the Bloom filter accesses a single Bloom filter status bit. When a hash address is used to access a Bloom filter status bit, the 31 most significant bits of the hash address (bits 38-8) are first compared against the 31-bit address field of each of the eight cache entries within Bloom filter cache 1180. If a matching entry with an asserted valid bit is identified, the status bit being accessed is already loaded in the Bloom filter cache. The remaining 8 least significant bits of the hash address are used to access the specific status bit. Hash address bits 6-7 are used to select the data row (i.e., one of DataR0-Data R3), and hash address bits 0-5 are used to select one out of the 64 status bits of the selected data row.

When a Bloom filter status bit is initially accessed (read or written), the reference count for the corresponding cache entry is incremented. If the status bit is not modified, the I/O operation is completed and the reference count of the entry is decremented. If the status bit is modified (e.g., asserted to indicate the addition of a new chunk to the storage device), then the cache bit is updated, the dirty bit is asserted, and the reference count is decremented, completing the I/O operation. Because the Bloom filter is a shared resource that can be accessed as part of the deduplication of multiple concurrent data streams, it is possible for multiple Bloom filter accesses to the same cached range of status bits to be requested before a pending request completes. For example, after an update to a Bloom filter bit has been performed, additional updates to the dirty bit and to the reference count must still be performed to complete the I/O operation. In between each of these accesses, another access may be initiated by the deduplication of another stream processed by deduplication engine 301. The cache entry reference count tracks the number of such back-to-back I/O operations that are initiated but not yet completed, i.e., the number of pending Bloom filter cache I/O operations.

When the reference count is decremented back down to its initial value (e.g., −1), all pending I/O operations accessing bits within the cache entry's hash address range have been completed. If the dirty bit is set, then at least one of the I/O operations involved a write to one of the bits within the entry, and this updated status needs to be written back to Bloom filter array 1190. The full 32 bytes of status data are written back to the array, and the dirty bit is de-asserted, thus updating Bloom filter array 1190. By allowing multiple pending I/O operations initiated by the deduplication of multiple streams, it is possible to reduce the number of writes to Bloom filter array 1190. Allowing multiple pending I/O operations also reduces the latency that would otherwise be introduced by holding off the deduplication of one stream while awaiting the completion of a Bloom filter I/O operation initiated by the deduplication of another stream. Instead, the I/O operations for multiple streams may be initiated back-to-back, regardless of the completion status of the previous I/O. Updates by a previous I/O are reflected in the cached entry, and subsequent I/O operations to the same status bit will produce the correct results.

In at least some example embodiments, the number of pending I/O operations performed on bits within a Bloom filter cache entry is limited to a maximum number (e.g., 8). When the reference count reaches this limit, all subsequent requests to access a Bloom filter status bit within the range of the entry are rejected. When the count is decremented below the limit, subsequent requests are again accepted. If a request is presented to the Bloom filter to access a status bit that is not currently in the cache, the request will cause a new read of the corresponding hash address range of Bloom filter array 1190 data into Bloom filter cache 1180 if a cache entry is available. An entry is considered available if there are no I/O operations still pending (e.g., a reference count of −1) and the entry's dirty bit is not asserted (i.e., a write back to the Bloom filter array is not pending), or if the entry's valid bit is not asserted. If no entries are available, the request is rejected.

Because the Bloom filter array is shared by all of the devices managed by deduplication engine 301, setting the number of Bloom filter cache entries and the number of allowable pending I/O requests equal to the maximum number of partitions (i.e., equal to the number of Bloom filters and thus to the number of backend pLUNs) operates to reduce delays caused by the collision of Bloom filter cache I/O operations associated with different backend pLUNs. If each I/O operation involves non-overlapping ranges of Bloom filter status bits, each I/O operation will be assigned to a different Bloom filter cache entry. If the I/O operations involve overlapping ranges of Bloom filter status bits, requiring access to the same Bloom filter cache entry, each of the I/O operations will be performed back-to-back, as described above. In each case, an I/O operation to the Bloom filter cache associated with one pLUN device is not held off pending the completion of an I/O operation to the Bloom filter cache associated with a second pLUN device. Further, none of the I/O requests will be rejected, given that the number of cache entries and the maximum number of allowable pending I/O requests are both sufficient to accommodate any combination of requests for all of the partitions.

Additionally, if the number of Bloom filter cache entries is also at least equal to the maximum number of concurrent streams that can be processed by deduplication engine 301, then concurrent and/or back-to-back Bloom filter accesses will also be possible, regardless of whether the accesses are associated with different pLUN devices, the same pLUN device but different Bloom filter array ranges, or the same pLUN device within the same Bloom filter array range. In all cases, a Bloom filter I/O operation associated with one data stream will not be held off pending the completion of a Bloom filter I/O operation associated with another stream. Also, none of the I/O requests will be rejected, given that the number of cache entries and the maximum number of allowable pending I/O requests are both sufficient to accommodate any combination of requests from all of the streams currently being processed by deduplication engine 301.

Functional Details: Chunk Compression/Decompression

Figure 12:
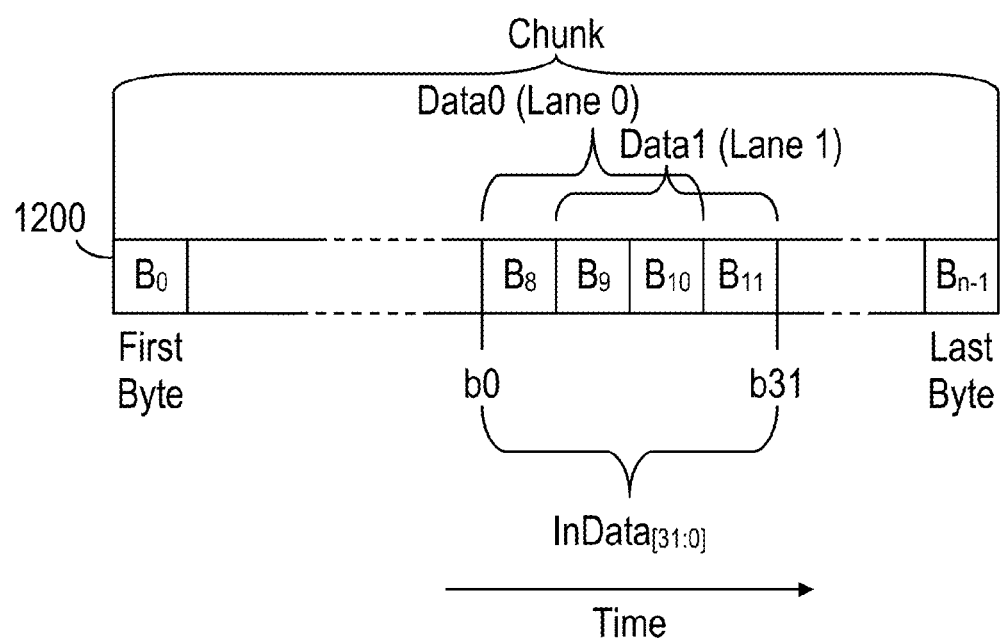
FIG. 12 shows the subdivision of an incoming byte stream into two data lanes, in accordance with at least some example embodiments.

Once those chunks within a write operation that are already saved onto a storage device are indentified, the remaining new chunks (if any) are each forwarded for compression (if enabled) prior to being stored on a backend pLUN. As previously described, the chunk is compressed by identifying duplicate byte sequences within the chunk and replacing such duplicate sequences with code words that point to a prior occurrence of the sequence. A hash code is generated using chunk data within a moving window, and the hash code is used to index into a series of tables (described below) to determine if the sequence of data bytes has previously occurred within the chunk. In at least some example embodiments, multiple hash codes are concurrently generated in parallel using data within multiple windows over different portions of the incoming chunk data stream. FIG. 12 shows an example using two moving windows of three bytes each, each window defining a data lane within chunk byte stream 1200. For a minimum code word size of two bytes, three bytes is the minimum window size that can be used that produces a compression of the data (i.e., a reduction of at least one byte).

In the example shown in FIG. 12, as well as the in subsequent examples shown in the figures and described in the present disclosure, two data lanes are presented for simplicity and clarity. Nonetheless, those of ordinary skill in the art will recognize that a variety of embodiments incorporating any number of lanes may be used to implement the compression techniques described herein, and all such embodiments are contemplated by the present disclosure. Those of ordinary skill in the art will also recognize that increasing the number of data lanes proportionally increases the number of bytes that can be concurrently processed in parallel by the data compression engine. Such increases in concurrent processing enable the data compression engine described to support similarly proportional increases in the bit rate of the incoming data stream.

Continuing to refer to the example of FIG. 12, one window defines lane 0 (Data0), which includes data bytes $B_8$ (the first byte of the 3-byte sequence that includes bits 0 through 23) through $B_{10}$ (the last byte of the 3-byte sequence). Similarly, a second window defines lane 1 (Data 1), which includes data bytes $B_9$ through $B_{11}$ (bits 8-31). Because both lanes are processed concurrently in parallel, for each processing cycle the processed byte stream is shifted by two bytes, and two new bytes are loaded. Thus, in the next cycle after that shown in FIG. 12 data lanes 0 and 1 will include data bytes $B_{10}$-$B_{12}$ and $B_{11}$-$B_{13}$ respectively.

Figure 13A:
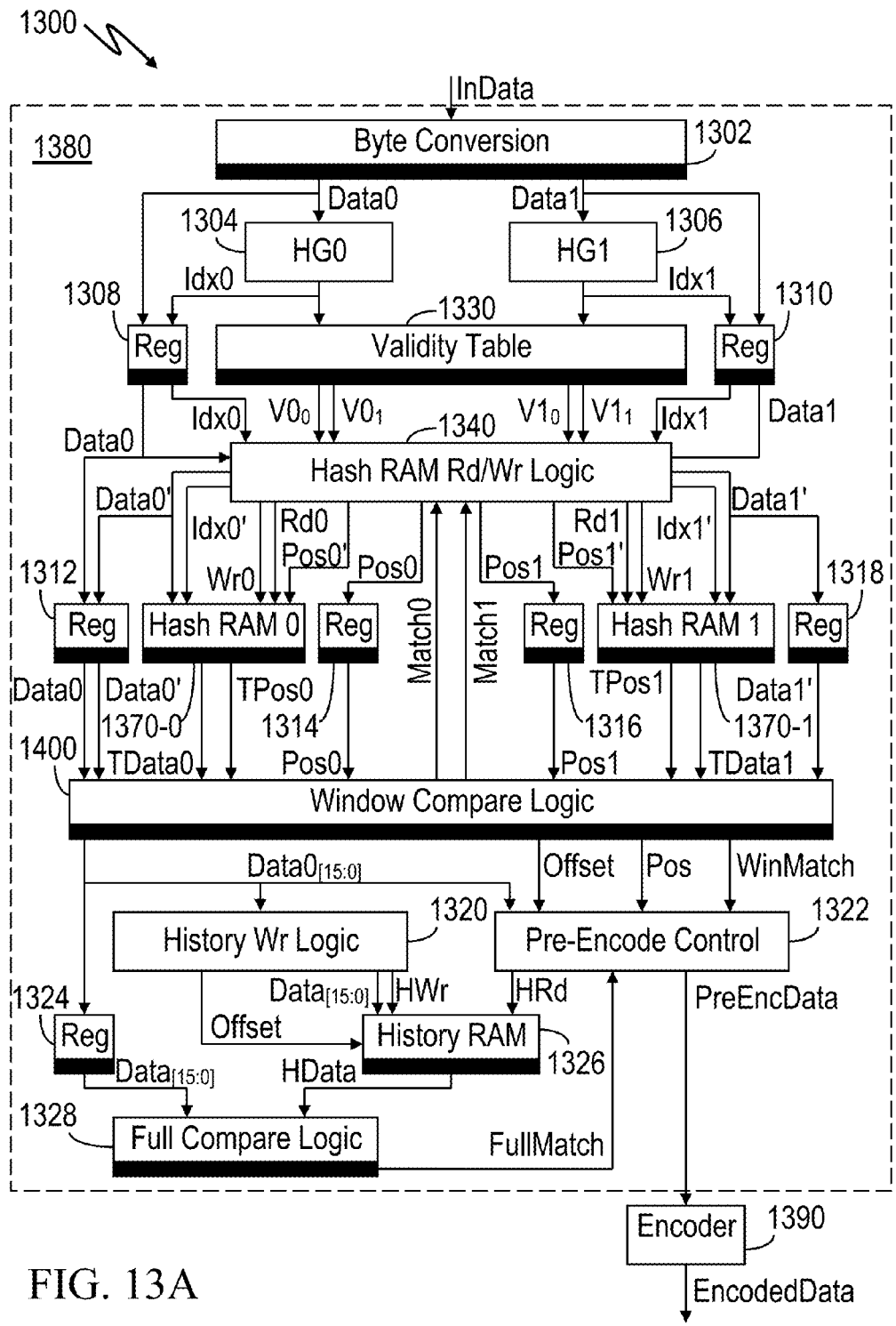
FIG. 13A shows a detailed functional block diagram of a compression engine, with position information stored within hash RAMs 1370-0 and 1370-1, in accordance with at least some example embodiments.

FIG. 13A shows a functional block diagram of data compression engine 1300, which includes sequence detector 1380 and encoder 1390. Data compression engine 1300 provides concurrent compression processing of the parallel data lanes of FIG. 12, in accordance with at least some example embodiments. Because of the high data rates which data compression engine 1300 may support (e.g., 48 Gbps), pipelining is used within sequence detector 1380, and each pipeline stage boundary is indicated by a black bar at the output of a functional block within a stage. Registers (Reg 1308, 1310, 1312, 1314, 1316, 1318 and 1324) are shown where signals pass through a given stage without necessarily being processed by logic within a stage, reflecting the lockstep transfer of all data from one pipeline stage to the next. While the detailed diagrams of some of the functional blocks of FIGS. 13A and 17A (e.g., FIG. 14) do not show any registers or supporting clocking logic associated with the pipelining, the omission of such circuitry in these detailed figures is only to simplify and de-clutter the figures. Continuing to refer to FIG. 13A, byte conversion block 1302 accepts the incoming data, shifting the data bytes by two bytes, and forwarding the resulting four bytes of data to the rest of the processing logic, once per processing cycle. Because the two data lanes together span four bytes, processing by sequence detector 1380 cannot begin until at least the first four bytes of data chunk 1200 of FIG. 12 have been received.

Continuing to refer to FIG. 13A, once at least four bytes have been received, the data for each lane is forwarded to a corresponding hash code generator (HG0 1304 for data lane 0, HG1 1306 for data lane 1). Each hash generator implements in hardware an irreducible polynomial that uses the 24 bits of the corresponding lane data to produce a 10-bit hash index value (Idx0 for lane 0, Idx1 for lane 1). Equation (2) below illustrates an example of such a polynomial:

$$X^{24}+X^{22}+X^{20}+X^{19}+X^{18}+X^{16}+X^{14}+X^{13}+X^{11}+X^{10}+X^8+X^7+X^6+X^3+X+1. \quad (2)$$

Those of ordinary skill in the art will recognize that a variety of irreducible polynomials and hardware implementations of such polynomials may be suitable for implementing the hash generators described herein, and all such polynomials and implementations are contemplated by the present disclosure. Each generated index value is used to perform a lookup within validity table 1330. Validity table 1330 maintains validity bits for each possible index value that together indicate whether that index value has previously occurred within a chunk, and in which lane the value occurred. The validity bit information is subsequently used by hash RAM read/write logic (Hash RAM Rd/Wr Logic) 1340 to determine if a read of one or more of the hash tables is needed, and which tables (lane 0 and/or lane 1) will be accessed to retrieve the hash table data.

Figure 13B:
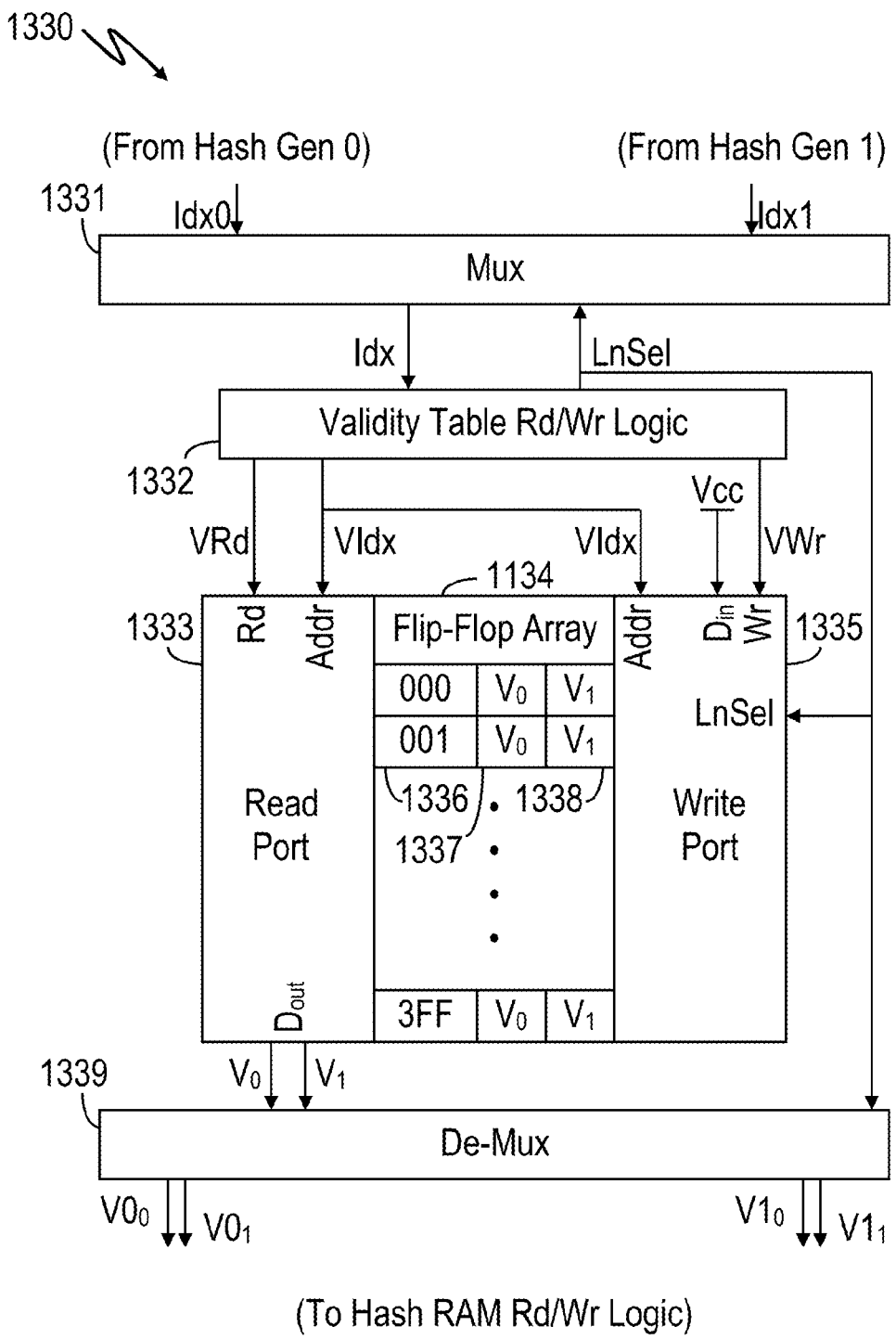
FIG. 13B shows a block diagram of validity table 1330 of FIG. 13A, implemented as a flip-flop array, in accordance with at least some example embodiments.

FIG. 13B shows a more detailed functional block diagram of validity table 1330 of FIG. 13A, in accordance with at least some example embodiments. Validity table 1330 is implemented using a dual-port array of static flip-flop pairs, each flip-flop pair addressed by one of the 1024 ($2^{10}$) possible hash index values. One port is a dedicated read port that reads both values at the addressed location (e.g., values $V_0$ and $V_1$), while the other port is a dedicated write port that only writes to one of the two validity bits at the addressed location. The validity bit updated during a write is determined by the value of the lane select (LnSel) signal, generated by validity table read write logic (Validity Table Rd/Wr Logic) 1332. The lane select signal also controls the input port selection of multiplexer (MUX) 1331 and the output port selection of de-multiplexer (De-Mux) 1339. Those of ordinary skill will recognize that validity table 1330 may be implemented using discrete components, using one or more field programmable gate arrays (FPGAs), or using any combination of these or any of a variety of components. All such components and combinations of components are contemplated by the present disclosure.

By using static flip-flops to form the array of validity bits, the array may be accessed multiple times for either reads or writes (or both reads and writes) within a single processing cycle. Thus, a preliminary determination of which data lane values have previously occurred in both lanes may be made (based on the occurrence of the hash indices) without having to read each corresponding location within the larger, slower hash RAMs. As will be shown below, this preliminary determination permits the identification of a number of conditions that preclude the need for accessing one or more of the hash RAM.

At the beginning of each chunk, a global clear signal (not shown) initializes all of the validity bits within the table to a de-asserted state (e.g., to a logical 0). After both bits at a validity table location are read, the location is updated to reflect the current occurrence of the index value by asserting the validity bit stored at that location. In the example of FIG. 13B, the write data input is forced to a voltage level (VCC) corresponding to a logical 1 and the value is written to the location corresponding to the selected lane when a write cycle is performed. Because each lane only updates the validity bits corresponding to that lane, the index addresses for which the validity bits are valid are evenly distributed across lanes within the table.

Figure 13C:
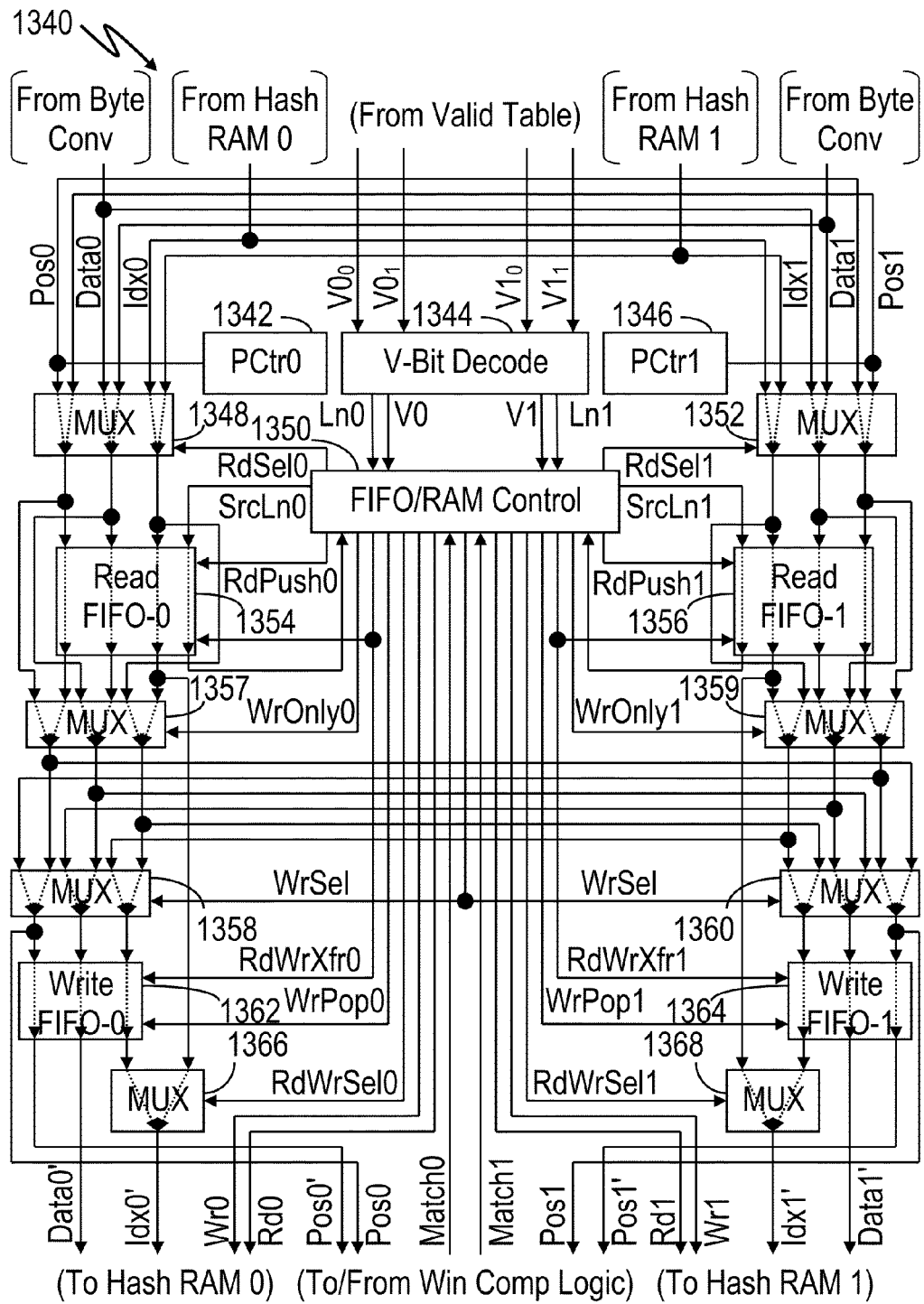
FIG. 13C shows a block diagram of hash RAM read/write logic 1340 of FIG. 13A, in accordance with at least some example embodiments.

Referring again to FIG. 13A, the index values (Idx0 and Idx1) and validity bits for each lane ($V0_0$ and $V0_1$ for lane 0, and $V1_0$ and $V1_1$ for lane 1) are forwarded to hash RAM read/write logic 1340, which determines which hash RAM locations should be read, and from which lane(s). Each lane includes a separate hash RAM (hash RAM 0 1370-0 for lane 0, and hash RAM 1 1370-1 for lane 1), and hash RAM read/write logic 1340 controls read and write accesses to both RAMs. FIG. 13C illustrates an example of hash RAM read/write logic 1340, in accordance with at least some embodiments. The validity bits for both lanes are input into validity bit decode (V-Bit Decode) 1344, which combines the validity bits to produce validity flags (V0 and V1) and target read lane signals (Ln0 and Ln1) for each lane. Table 3 shows how the validity bits are combined in the example embodiment of FIG. 13C to produce the target read lane signals for each lane:

TABLE 3

| Lane 0 Validity Bits | | Lane 1 Validity Bits | | Hash Target Read Lane 0 | Hash Target Read Lane 1 |
|---|---|---|---|---|---|
| V0 | V1 | V0 | V1 | | |
| 0 | 0 | 0 | 0 | X* | X |
| 0 | 0 | 0 | 1 | X | 1 |
| 0 | 0 | 1 | 0 | X | 0** |
| 0 | 0 | 1 | 1 | X | 1 |
| 0 | 1 | 0 | 0 | 1** | X |
| 0 | 1 | 0 | 1 | 1*** | 1*** |
| 0 | 1 | 1 | 0 | 1** | 0** |
| 0 | 1 | 1 | 1 | 1** | 0** |
| 1 | 0 | 0 | 0 | 0 | X |
| 1 | 0 | 0 | 1 | 0 | 1 |
| 1 | 0 | 1 | 0 | 0*** | 0*** |
| 1 | 0 | 1 | 1 | 0 | 1 |
| 1 | 1 | 0 | 0 | 0 | X |
| 1 | 1 | 0 | 1 | 0 | 1 |
| 1 | 1 | 1 | 0 | 1** | 0** |
| 1 | 1 | 1 | 1 | 0 | 1 |

*A don't care (X) indicates that a hash RAM read is not required from either lane.
**One or both hash RAM reads are from an opposite lane.
***Both hash RAM reads are from the same lane.

As can be seen from Table 3, where a validity bit indicates that the index may have previously occurred in more than one lane, the hash RAM lane corresponding to the current lane is selected if the selection doesn't cause two reads from the same hash RAM lane. Otherwise, the opposite hash RAM lane is selected to avoid performing both reads in the same lane. This is because the hash RAM is generally the slowest component within sequence detector 1380, and the processing cycle of the pipelined sequence detector of FIG. 13A is thus limited to the time it takes to perform a hash RAM read (assuming that the hash RAM is implemented as a dual-port RAM, with one port dedicated to reads and the other to writes). By adopting a validity bit decode strategy that seeks to avoid two reads in the same lane, only two combinations of validity bits produce reads from the same hash RAM lane that cannot be avoided, i.e., when both lanes indicate that the corresponding indices have previously occurred only in lane 0 or only in lane 1 (indicated in Table 3 with a triple asterisk).

If validity bit decode 1344 indicates that an index has previously occurred within at least one of the two lanes (e.g., by asserting one or both of signals V0 or V1), the index value (Idx0/1), the position within the chunk (Pos0/1) and the lane data (Data0/1) are routed from the originating lane to the read FIFO (read FIFO 1354 or 1356) corresponding to the target read lane by one of multiplexers 1348 or 1352 (controlled by the read select 0 or 1 (RdSel0/1) signal). The read FIFOs are static asynchronous FIFOs that, like the static flip-flops of validity table 1330, can be both written and read multiple times within a single processing cycle. Thus, if validity bit decode 1344 indicates that a read is needed from lane 0 by both of the current lanes, FIFO/RAM control 1350 will sequence the FIFO read select 0, read push 0 (RdPush0), read select 1 and read push 1 signals so as to load the index, position (generated by position counter Pctr0 1342), data and source lane (SrcLn0) values from lane 0 to read FIFO 0, and then the index, position (generated by position counter Pctrl 1346), data and source lane (SrcLn1) values from lane 1 to read FIFO 0 as well. In this manner, the read FIFO load of both sets of values is performed within a single processing cycle.

If a read is not required for a lane, FIFO/RAM control 1350 operates one of either multiplexer 1357 (lane 0) or 1359 (lane 1) with the write only signal for that lane (e.g., WrOnly1) to bypass the corresponding read FIFO and load the set of values directly into the write FIFO for the lane. Subsequently, if one or both of the read FIFOs for a lane is not empty, the hash RAM read/write select (RdWrSel0/1) signal(s) is/are set to operate multiplexer 1366 and/or 1368 to select the index value from the output of the corresponding read FIFO, and the hash RAM read (Rd0/1) signal(s) for the non-empty lane(s) is/are transitioned to execute a read of the hash RAM for the corresponding lane(s). The write select (WrSel) signal is set (based on the state of the source lane bit(s) output by the read FIFO(s)) so as to transfer to write FIFO 1362 and/or 1364 (via multiplexer 1358 and/or 1360) any sets of values still within the read FIFO(s), and the read/write transfer (RdWrXfr0/1) signal for each lane with read FIFO data is transitioned to execute the transfer (pushing the values onto the write FIFO and popping the values off of the read FIFO). The hash RAM read/write select signal(s) is/are set to operate multiplexers 1366 and/or 1368 to select the index value from the output of the corresponding write FIFO, and the hash RAM write (Wr0/1) signal(s) is/are transitioned to execute a write of the hash RAM for the corresponding lane(s). The write updates the hash RAM for each lane with the new data and position values associated with the corresponding index value. Because the data for the write originates from the output of the read FIFOs, the write is guaranteed to be performed after any required read of the same location.

Referring again to FIG. 13A, if the data read from the hash RAMs (e.g., TData0) matches the current chunk data output by hash RAM read/write logic 1340 as part of a set of values (e.g., Data0'), and the current chunk data is close enough to the previous occurrence within the chunk to be represented by a code word, a match signal for the corresponding lane will be asserted by window compare logic 1400 (described in detail below) within the same processing cycle as the hash RAM read. If the position value of the next set of values present at the output of the read FIFO for the lane just matched is within two bytes of the preceding position value output by the same FIFO (e.g., if two hash RAM reads are required in the same lane within a processing cycle), the set of values at the output of the read FIFO are transferred to the write FIFO without performing a hash RAM read (i.e., a "write only" operation as previously described). This is because the chunk data byte at the start of the next set of values is already known to be one of the three bytes that will be included in the code word that will be created as a result of the match. Thus, it doesn't matter whether the lane data corresponding to the next byte matches an existing hash RAM entry, and the next hash RAM read can be skipped. In at least some example embodiments, such a comparison of two successive read FIFO positions values is performed within hash RAM read/write logic 1340 (not shown), with the results of the comparison provided to FIFO/RAM control 1350.

Figure 13D:
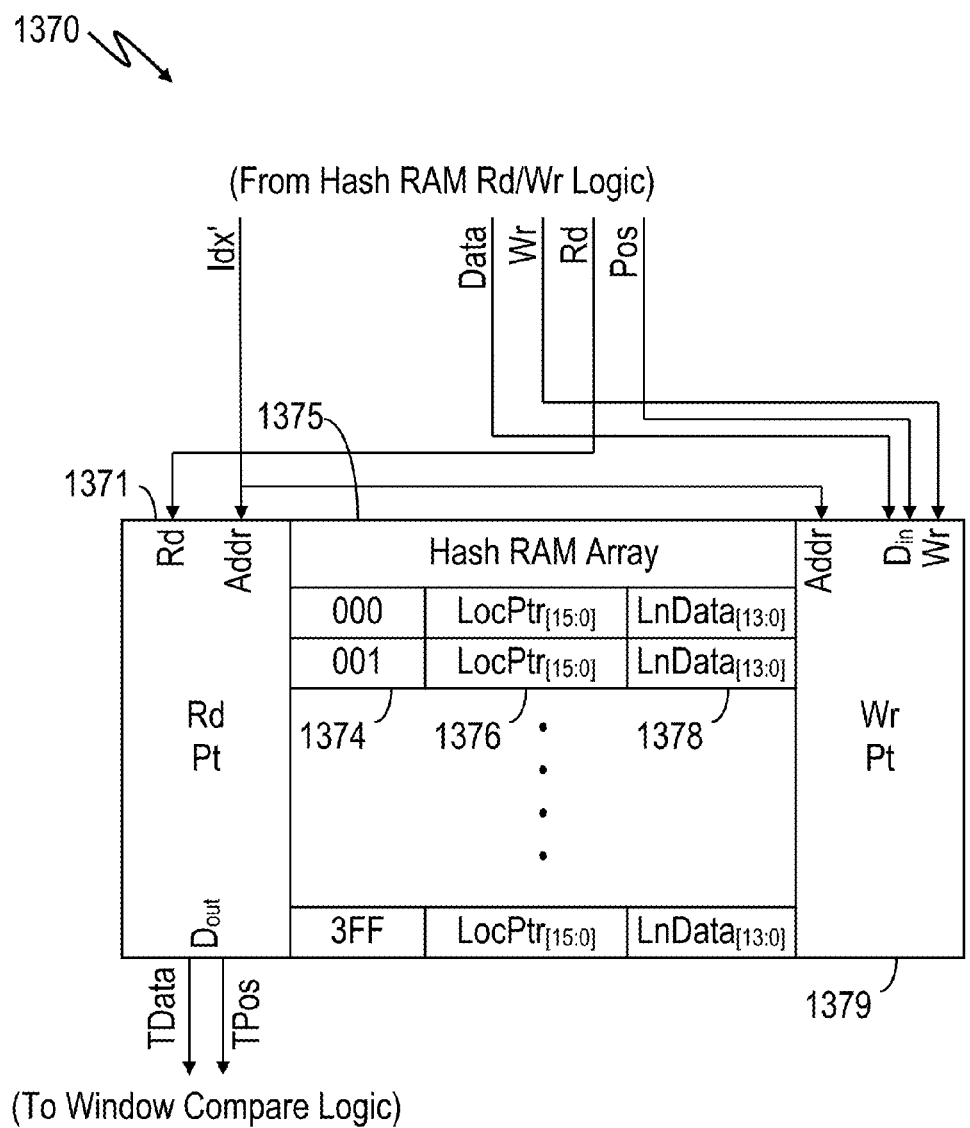
FIG. 13D shows a block diagram of a hash RAM 1370 (corresponding to hash RAMs 1370-0 and 1370-1 of FIG. 13A), in accordance with at least some example embodiments.

FIG. 13D illustrates an example of dual-port hash RAM 1370 (representative of hash RAMs 1370-0 and 1370-1 of FIG. 11A), in accordance with at least some embodiments. One port is dedicated to hash RAM reads (Rd Pt 1371), the other to hash RAM writes (Wr Pt 1379). Each location 1374 within array 1375 corresponds to one of the 1024 possible index values, and both the position relative to the start of the chunk (LocPtr$_{[15:0]}$ 1376) and the data value (LnData$_{[13:0]}$ 1378) of the most recent data sequence corresponding to the index value are stored in the hash RAM. Because the bit width of the hash index (10 bits) is less than the bit width of the data used to produce the index (24 bits), the correspondence between data values and index values is a many-to-one correspondence, with 16,384 ($2^{14}=2^{24}-2^{10}$) different possible data values mapping to each index location. Thus, as already described, the incoming data value must be compared with the value of the previous occurrence (stored in the hash RAM) to confirm that the stored occurrence does actually match the current data.

In at least some example embodiments, if the hash index values are generated using an irreducible polynomial that is of the same order as the index produced, it is not necessary to store and subsequently compare all of the data bits to determine a match. Thus, for example, if hash index generators 1304 and 1306 of FIG. 13A implement an irreducible polynomial of size 10 to generate the 10 bit index previously described, at most 14 bits of the original data need be stored in the hash RAM and later compared to determine an exact match between the incoming lane data and the data that generated the most recent occurrence of the index identified by the hash RAM entry. In the example embodiment of FIG. 13D, only lane data bits 0-13 are stored and used in the data match determination. Regardless of whether the incoming lane data and the stored lane data match, the incoming lane data is always written to the corresponding index location in the hash RAM for that lane. Thus, the hash RAM always stores the data and location values for the data that most recently produced the hash index value corresponding to that hash RAM address. As with the validity bits of validity table 1330, because the data for a lane is always written to the hash RAM for that lane, an even distribution of the incoming data results across the two data lanes, and thus across the two hash RAMs.

Although data and location values for only one hash index value is store at each index value location of the hash RAM embodiment of FIG. 11D, those of ordinary skill in the art will recognize that any number of hash values may be concurrently maintained for each index value. In at least some example embodiments, a plurality of entries are maintained, and each is output and compared in parallel so that a match can still be determined in a single processing cycle. If there is a match, the write is directed to the matching entry (e.g., via a de-multiplexer connected to the data inputs of the hash RAM). If there is no match, a rotation algorithm may be used to determine which location is overwritten (e.g., a round-robin algorithm). Many variations in the number of hash locations and types of rotation algorithms will become apparent to those or ordinary skill in the art, and all such variations are contemplated by the present disclosure.

Figure 14:
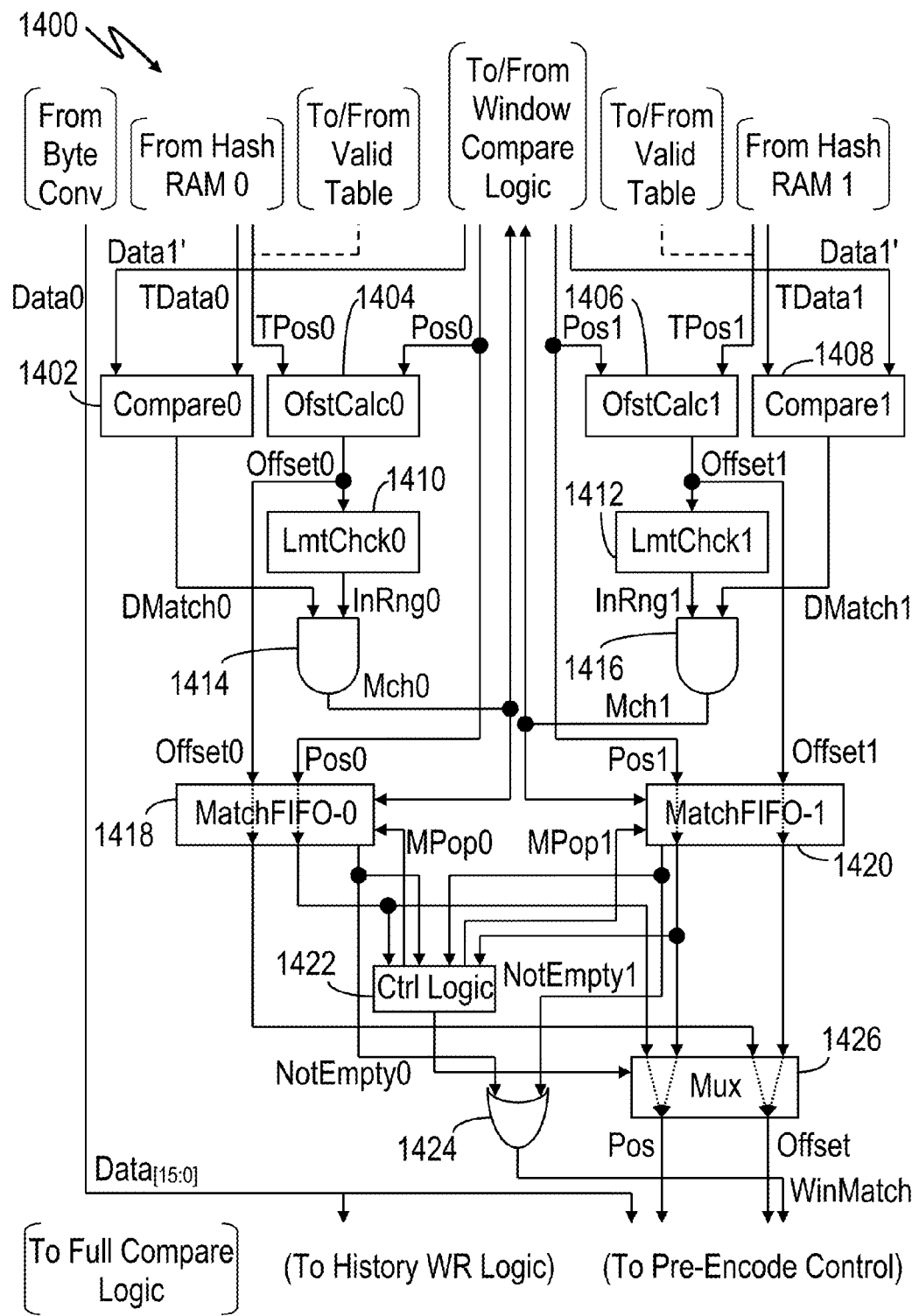
FIG. 14 shows a block diagram of window compare logic 1400 of FIGS. 13A and 17A, in accordance with at least some example embodiments.

Referring again to FIG. 13A, if data from hash RAM 0 and/or hash RAM 1 and is available for comparison, the data and position values read from the hash RAM(s), as well as the corresponding data and position values for the incoming chunk data, are all forwarded to window compare logic 1400. FIG. 14 illustrates a more detailed functional block diagram of window compare logic 1400, in accordance with at least some example embodiments. Data read from the hash RAMs in each lane are compared to the corresponding incoming data (Compare0 1402 and/or Compare1 1408) to determine if the data matches. Also, each stored location for each lane is subtracted from the corresponding current data position within the chunk (OfstCalc0 1404 and/or OfstCalc1 1406) to produce an offset value (Offset0/1), which is compared against the maximum offset value that can be represented by a code word (LmtChck0 1410 and/or LmtChck1 1412).

If the data matches (as indicated by DMatch0 and/or DMatch1) and the offset is within a range that can be represented by a code word (as indicated by InRng0 and/or InRng1), a match is signal is asserted (Mch0 and/or Mch1) by AND gate 1414 and/or 1416, which is used by hash RAM read/write logic 1330(as previously described) and by window compare logic 1400 to control further processing. The match signals are also used to load both the calculated offsets (Offset0/1) and the incoming data position (Pos0/1) for each lane into a corresponding match FIFO (MatchFIFO-0 1418 and/or MatchFIFO-1 1420). The match and position signals for each lane are used by control logic (Ctrl Logic) 1422 to determine which match FIFO output is output by window compare logic 1400 (via multiplexer 1426), and to generate the control signals to pop the match FIFOs (MPop0 and/or MPop1). In at least some embodiments, when both match FIFOs signal that data is available (via the NotEmpty0 and NotEmpty1 signals), control logic 1422 selects the data with the lowest position value (i.e., the oldest data). The two match FIFO not empty signals (NotEmpty0 and/or NotEmpty1) are further combined by OR gate 1424 to signal a valid window match (WinMatch) and that data indicating the position of a match and the offset to the previous occurrence of the matching data is available, thus outputting the match position and offset data in the proper order.

Referring again to FIG. 13A, match position and offset data output by window compare logic 1400, together with the window match indication signal, are all presented to pre-encode control 1322, which transitions the history read (HRd) signal to read data from history RAM 1326 and extend the comparison of the incoming data to data beyond the first three matching bytes. The comparison is performed by full compare logic 1328, which generates a full match signal (FullMatch) that is monitored by pre-encode control 1322. While a full match is detected between the incoming data stream and the data in the history buffer, no data is sent to encoder 1390. When a mismatch is identified, the end of the chunk is reached, the offset position of the start of the incoming data within the history buffer is reached, or the maximum length match length that can be represented by a code word is reached, the offset value provided by window compare logic and the length of the matching sequence are transmitted by pre-encode control 1322 to encoder 1390 as part a match command (described below). Subsequent non-matching data bytes are forwarded to encoder 1390 as part of a literal command (also described below). Up to three non-matching data bytes immediately following the match may be appended to the end of the match command (described further below). At the end of the chunk an EOF command is sent to the encoder.

In parallel to the full match detection, incoming data (Data0$_{[15:0]}$) is also presented by window compare logic 1400 to history write logic 1320, which writes the data to history RAM 1326. For each processing cycle two data bytes are concurrently written to history RAM 1326 and compared by full compare logic 1328. Data from lane 0 is used because it includes the first byte from both lane 0 and lane 1, the two bytes being processed within a given processing cycle. In at least some example embodiments, history data is maintained in history RAM 1326 within a circular buffer that is sized to be, at most, equal to the maximum offset that can be represented by a code word. Thus, even though a chunk could be as large as 64 Kbytes, if the maximum offset that can be represented by a code word is, for example, 4096, the circular buffer is configured to be 4096 bytes in length.

Pre-encode control 1322 (FIG. 13A) and/or 1722 (FIG. 17A) transmits literal commands, match commands and EOF commands to encoder 1390/1790. These commands are transferred from pre-encode control 1322/1722 to encoder 1390/1790 as a 34-bit command. FIG. 15A shows an example of how such commands may be formatted, in accordance with at least some example embodiments. The literal command shown includes between 1 and 4 bytes of uncompressed incoming chunk data, with the L field encoded as shown to indicate which of the byte fields include valid data. In at least some example embodiments, encoder 1390/1790 combines groups of literal commands into longer, multi-byte literal records for storage to the pLUN that include a length field at the beginning of the record (for later decoding of the data when read from the pLUN). In order to provide the total number of successive literal bytes to encoder 1390/1790, the literal data bytes must be buffered until a match sequence is encountered, or until the maximum number of bytes that can be encoded within a single literal record are processed. Referring to both FIGS. 13A and 17A, in at least some example embodiments, pre-encode control 1322/1722 may include an output FIFO (not shown) to buffer the literal data bytes. Once the full match length is determined and is transmitted to encoder 1390/1790 (e.g., via a separate dedicated connection), the literal bytes may be transmitted as literal commands to encoder 1390/1790 for inclusion in a literal record.

The match command shown includes the offset value output by window compare logic 1400 to pre-encode control 1322/1722 (indicating the start of the previous occurrence of the sequence) and the length of the matching string as determined from the full compare described above using full compare logic 1328/1728 and history RAM 1326/1726. The match command also includes X and Y flags that are used to indicate to encoder 1390/1790 whether certain thresholds for the length and offset fields have not been exceeded. If these fields are sufficiently small, smaller code words may be used, resulting in a higher compression efficiency. Thus, for example, in at least some embodiments a two byte code word is used to represent matches of between 3 and 8 bytes if the offset values between 1 and 2048 bytes, a three byte code word is used to represent matches of between 9 and 127 bytes for offset values between 1 and 4096 bytes, and a four byte code word is used to represent matches of between 3 and 1023 bytes for offset values between 1 and 4096 bytes. The threshold flags X and Y enable the use of simple and fast static decoders within encoder 1390/1790 to determine which code word to use, thus avoiding the need for the encoder to perform multiple compare operations on the offset and length values of the match command.

Figure 15B:
FIG. 15B shows the format of various literal and match records generated by the encoder of FIGS. 13A and 17A, in accordance with at least some example embodiments.
Figure 15B:
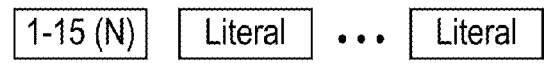
Figure 15B:
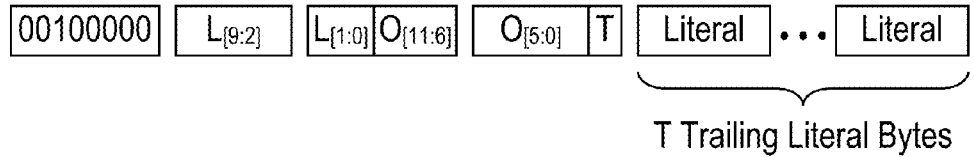
Figure 15B:
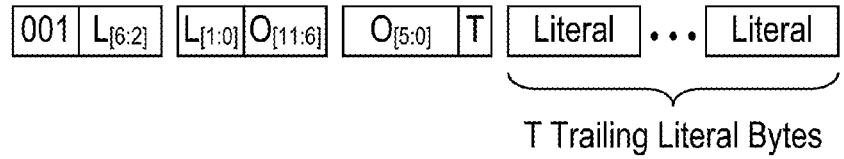
Figure 15B:
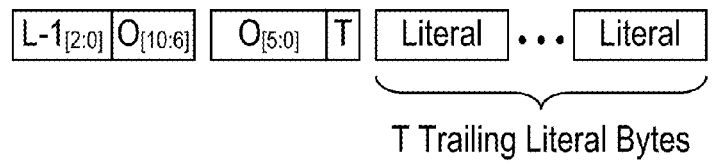

Each match command and literal command are converted by encoder 1390/1790 into corresponding match records and literal records that together make up the encoded data (EncodedData) output by encoder 1390/1790 for storage as a compressed chunk on a backend pLUN. FIG. 15B shows examples of such records, in accordance with at least some embodiments. Literal records with both one and two byte headers are shown, as well as three types of match records. The match records include records with two, three or four header bytes (depending on the length of the match and the range of the offset to the previous occurrence), and each type of match record can include up to 3 additional trailing literal bytes. The inclusion of trailing literal bytes avoids the need to create additional literal records for small numbers of literals that may occur between match sequences, or at the end of the data. The end of the data within a chunk is marked by an EOF record. Each record is identified by the record type values shown and indicated within the first byte of the record, and is used to determine how the data is decompressed and reconstructed by the data decompression engine (described below).

Figure 16:
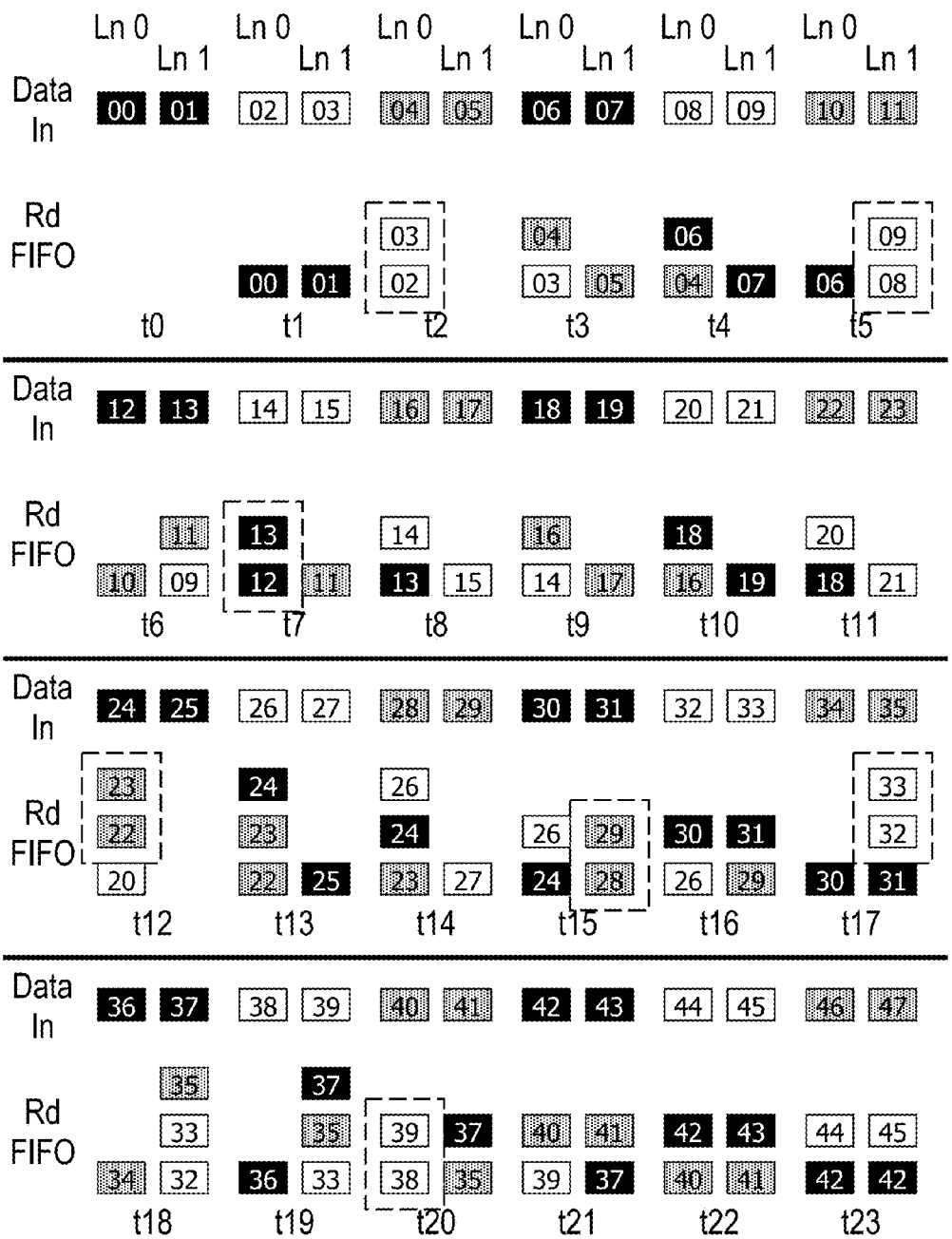
FIG. 16 shows an example of the flow and distribution of data through the read FIFOs of FIGS. 13C and 17C, in accordance with at least some embodiments.

As can be seen from the above description, once a set of values is loaded onto the read FIFOs within hash RAM read/write logic 1340 of FIG. 13A, the processing of the values for that set within a given lane is independent of the processing of values for that set (or any other set) being processed in the other lane. The processing performed within one lane does not depend upon or affect the processing performed in the other lane. Processing of data within one lane continues uninterrupted as long as data is available, regardless of whether data is being processed in the other lane, and regardless of which data sequence is being processed in the other lane. Because of this processing independence between lanes, at least some of the extra processing cycles used for back-to-back hash RAM reads in one lane can be recovered by subsequent back-to-back reads in the other lane. FIG. 16 illustrates an example of such processing cycle recovery for a series of back-to-back hash RAM reads executed by the sequence detector embodiment of FIG. 13A. In this example 24 processing cycles are shown (t0 through t23) in which preliminary matches are indicated in all 24 cycles, but none are an exact match. As a result, hash RAM reads are required in all 24 cycles.

The first row (Data In) shows the incoming lane data (Data0, Idx0, Data1 and Idx1) that is loaded into registers 1308 and 1310 of FIG. 13A. The data for each lane is identified by the least recent byte of the three bytes within the lane window. Thus, block 00 identified the byte sequence $B_0$-$B_2$ and block 01 identifies byte sequence $B_1$-$B_3$. The second row (Rd FIFO) shows the contents of the read FIFOs of FIG. 13C (Read FIFO-0 1354 and Read FIFO-1 1356), with data exiting the FIFOs (i.e., available for a hash RAM read) shown at the bottom of an entry, just above the processing cycle identifier (e.g., just above t0). Because the registers and the read FIFOs are in different pipeline stages of sequence detector 1380, there is at least a one processing cycle skew between the load of registers 1308 and 1310 and the output of index values by the read FIFOs for hash RAM reads.

The example of FIG. 16 shows six distinct back-to-back hash RAM reads. The dashed boxes indicate where the lane data for each back-to-back read is loaded into a read FIFO. In this example, sequence pairs 02-03, 12-13 and 22-23 will each result in back-to-back hash RAM reads in lane 0. Similarly, sequence pairs 08-09, 28-29 and 32-33 will each result in back-to-back hash RAM reads in lane 1. The first back-to-back hash RAM read (02-03 in lane 0 at t2 and t3) results in an additional processing cycle skew in lane 0, wherein lane 0 data for at least one of the hash RAM reads isn't available until two processing cycles after being loaded into the previous pipeline stage, rather than just one processing cycle. After a subsequent back-to-back read in the opposite lane (sequence 08-09 in lane 1 at t5 and t6), the situation is reversed, wherein lane 0 has recovered the lost processing cycle, but lane 1 is now skewed by one cycle. Two subsequent, back-to-back reads in lane 0 (12-13 at t7 and t8, and 22-23 at t13 and t14) result in a recovery of the lost cycle in lane 1, but a 3 cycle skew in lane 0. Thus, for example, sequence 23 is loaded into the previous pipeline stage during cycle t11, but is not available for a hash RAM read until cycle t14. A subsequent back-to-back hash RAM read in lane 1 (28-29 at t15/t16) results in a recovery of a lost cycle in lane 1 and a loss of one cycle in lane 0, leaving both lanes skewed by two cycles. Later back-to-back reads in alternating lanes (e.g., 32-33 at t18/t19 and 38-39 at t20/t21) result in no additional net skew.

From the above, those of ordinary skill in the art will recognize that with a relatively random distribution of the incoming data over time, on average only a few processing cycles will be lost per chunk for the worst case scenario of continuous preliminary matches, with no actual matches. Thus, for at least some example embodiments, the two byte per processing cycle throughput is maintained for a significant majority of the time for such a worst case scenario. The described scenario is a worst case because, as previously described, read cycles are not needed for sequences without a preliminary index match, or for sequences that include bytes shared with a previously matching sequence. These cases thus do not result in back-to-back reads, and in some cases may provide additional unused cycles available for the recovery of lost processing cycles.

As already noted, different code words of varying lengths may be used to represent a matched sequence, depending upon the number of matching bytes and upon the size of the offset value between the current sequence and the previous occurrence of the sequence. If both lanes match, but one lane indicates an offset value that fits within a smaller code word, greater compression efficiencies can be achieved if the smaller code word is used. Data compression engine 1700, illustrated in FIGS. 17A through 17D, implements such an offset selection scheme, in accordance with at least some example embodiments. Data compression engine 1700 is similar to data compression engine 1300 of FIG. 13A through 13D (and uses corresponding reference numbers), and in the discussion that follows only the differences are described.

In the example embodiment of FIGS. 17A through 17D, the position information for the previous occurrence of a sequence (TPos$0_0$, TPos$0_1$, TPos$1_0$ and TPos$1_1$) is stored within validity table 1730, rather than hash RAMs 1770-0 and 1770-1. If validity table 1730 indicates that the indices of both lanes have each only occurred in the same, single lane (and thus back-to-back hash RAM reads may be needed), the hash RAM read/write logic can compare both position values provided by the validity table. This enables hash RAM read/write logic 1730 to read the hash RAM value with the smallest offset first. If the hash RAM data value read results in a match, the offset value used for the code word will be the smaller value, and the hash RAM read corresponding to the larger offset value will be skipped.

Figure 17A:
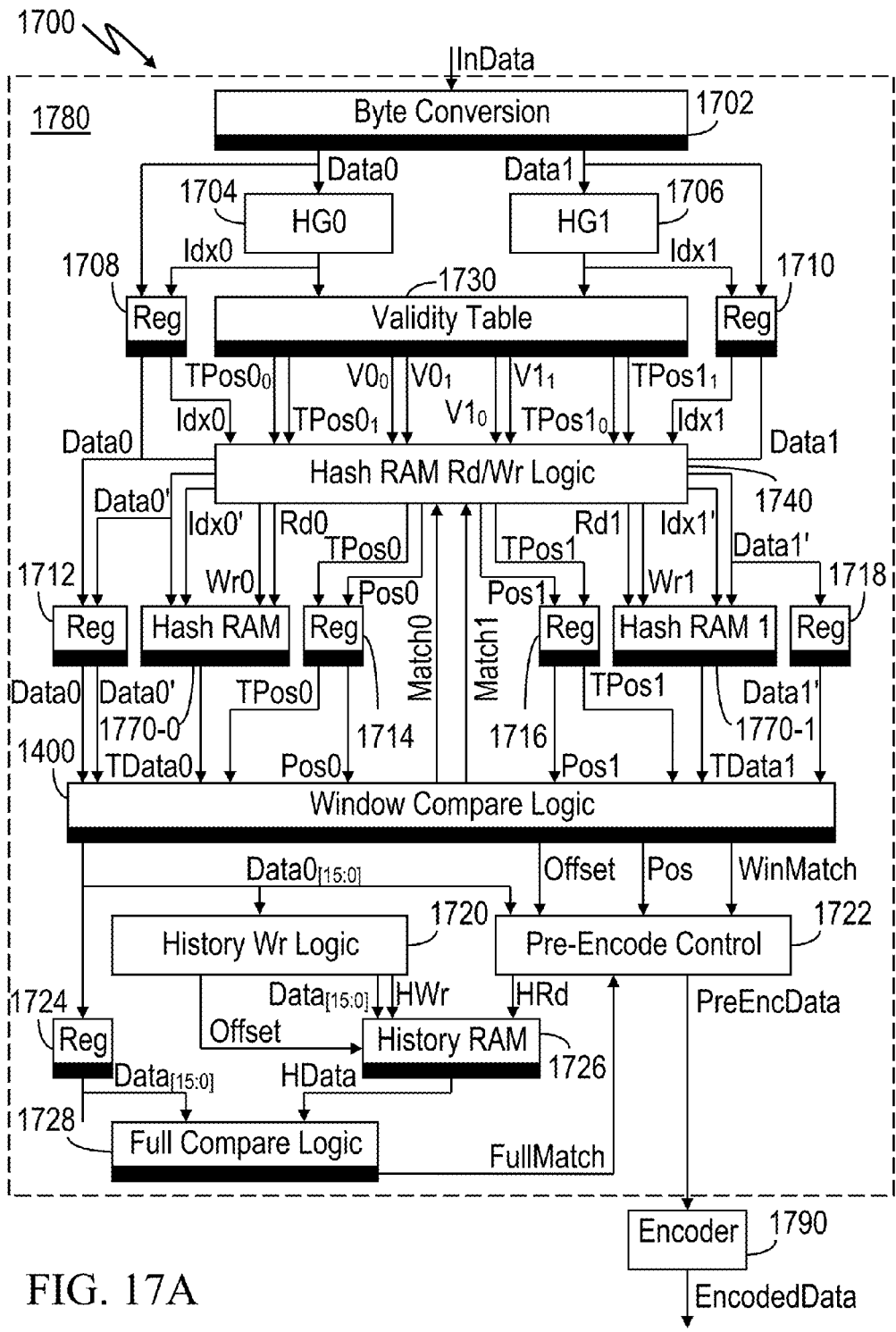
FIG. 17A shows a detailed functional block diagram of a compression engine, with position information stored within validity table 1730, in accordance with at least some example embodiments.
Figure 17B:
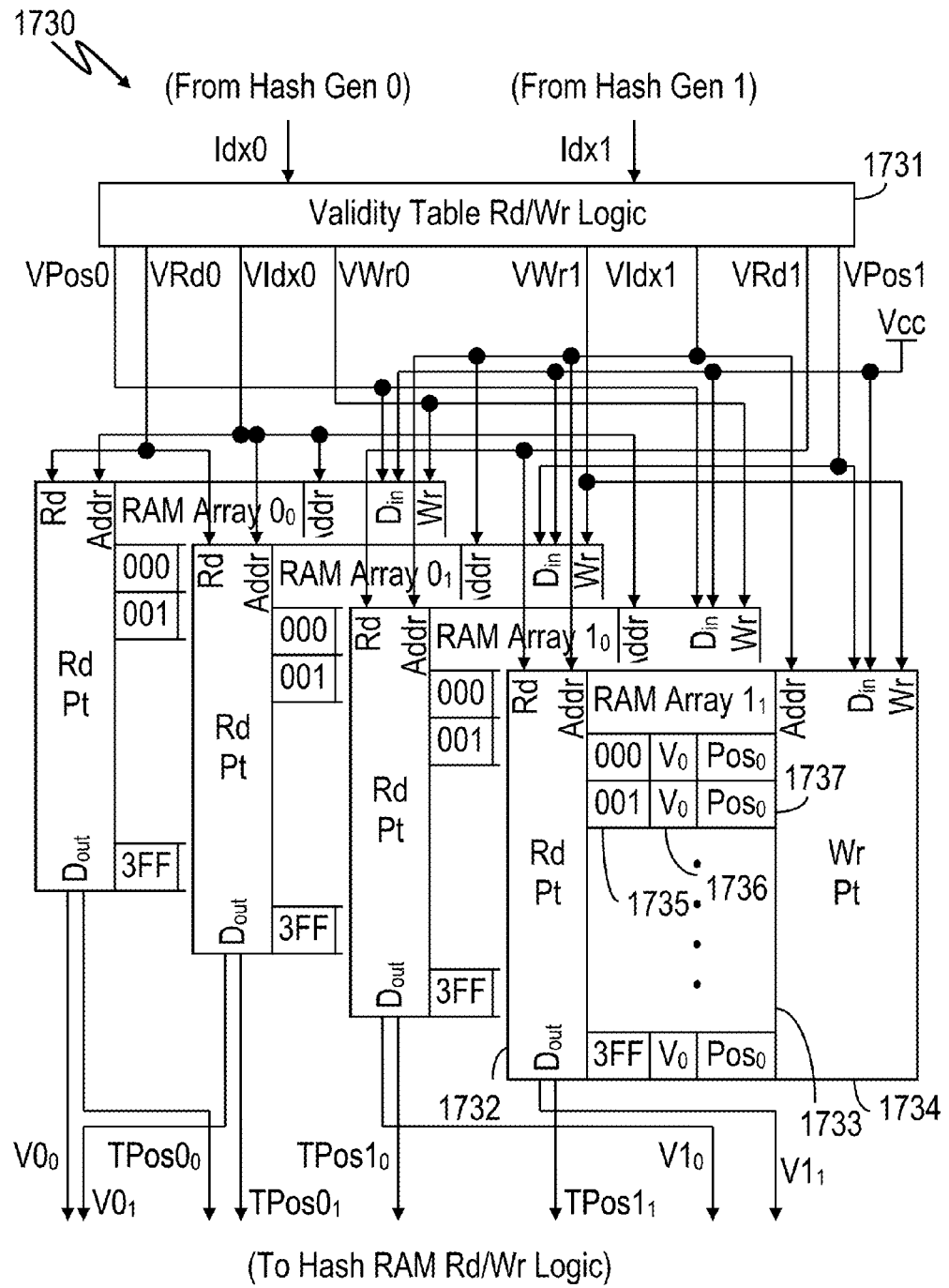
FIG. 17B shows a block diagram of validity table 1730 of FIG. 17A, implemented as four dual-port RAMs, in accordance with at least some example embodiments.

FIG. 17B illustrates an example embodiment of validity table 1730 of FIG. 17A. Because validity table 1730 includes significantly more information than validity table 1330 of FIG. 13A, in at least some example embodiments validity table 1730 of FIGS. 17A and 17B is implemented using four, dual-port RAM arrays rather than flip-flops (e.g., using FPGAs that include RAM arrays). Two arrays are read and written using the index and data from the same lane, while the other two arrays are read using the index from one lane, but written using the index and data of the opposing lane. Thus, RAM array $0_0$ is read and written to using validity table index 0 (VIdx0) and validity table position data 0 (VPos0); RAM array $0_1$ is read using index 0, but written to using index 1 (VIdx1) and position data 1 (VPos1); RAM array $1_0$ is read using index 1, but written to using index 0 and position data 0;

and RAM array $1_1$ is read and written to using index 1 and position data 1. In this manner, all reads of the arrays are performed in parallel, and all writes to the array are also performed in parallel.

Figure 17C:
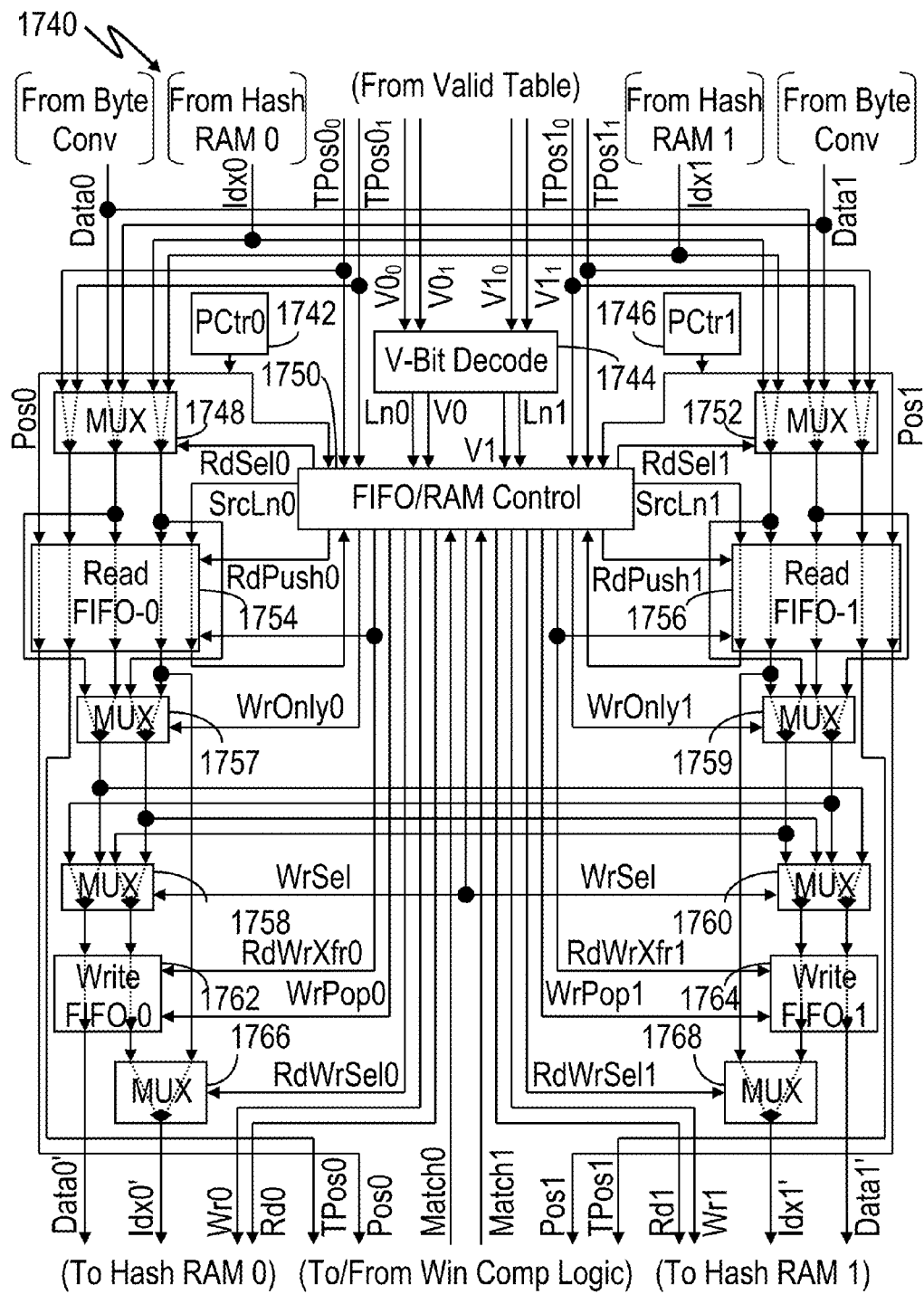
FIG. 17C shows a block diagram of hash RAM read/write logic 1740 of FIG. 17A, in accordance with at least some example embodiments.
Figure 17D:
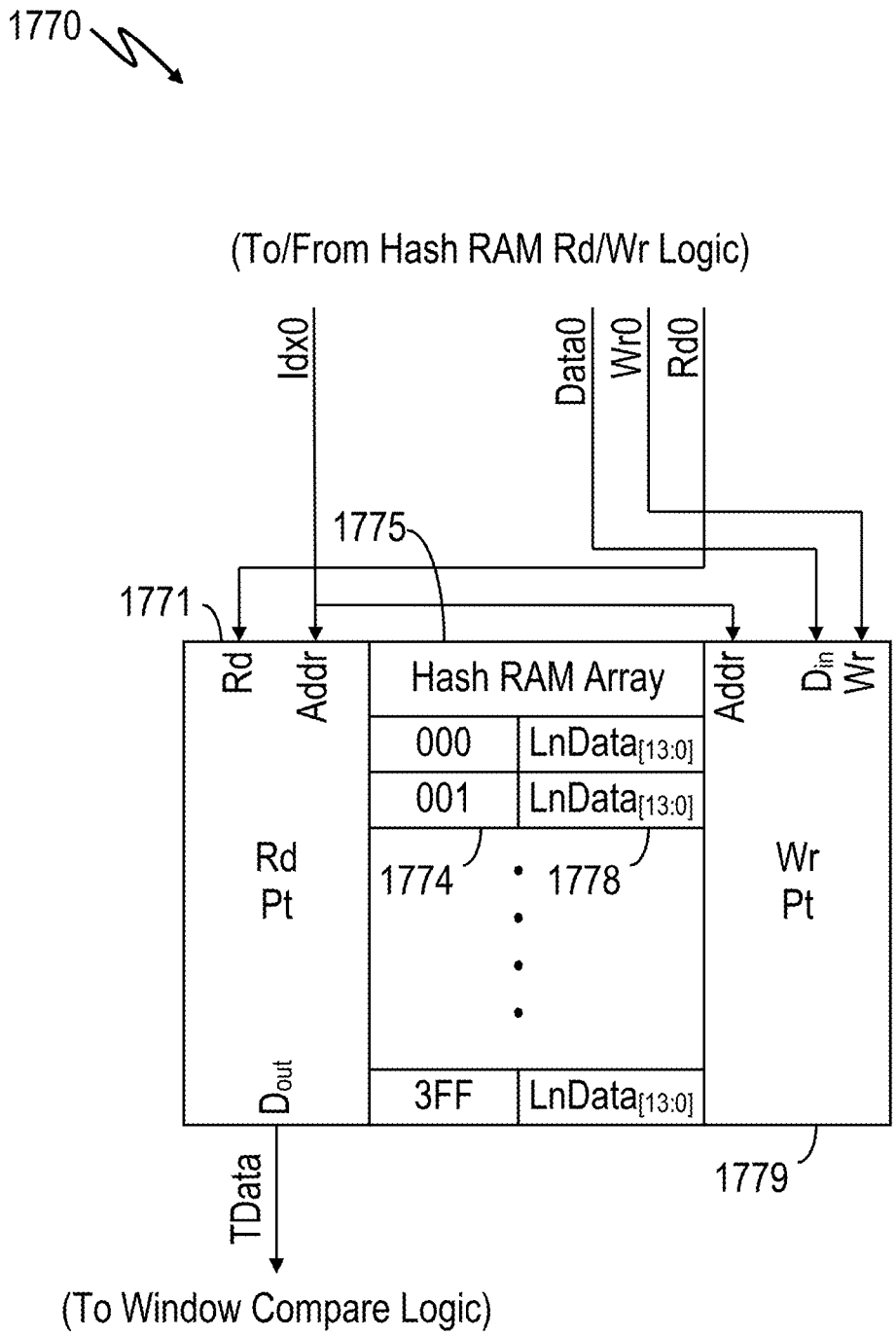
FIG. 17D shows a block diagram of a hash RAM 1770 (corresponding to hash RAMs 1770-0 and 1770-1 of FIG. 17A), in accordance with at least some example embodiments.

Referring now to FIG. 17C, the four table position values are presented to FIFO/RAM control 1750 of hash RAM read/write logic 1740. If the validity bits indicate that two back-to-back hash RAM reads may be required, the offset values between the current position and the table position for each lane are calculated by FIFO/RAM control 1750, and the index, position, table position, data and source lane information for the lane with the smallest offset is loaded into the appropriate read FIFO first, followed by the set of values for the other lane. This will cause the hash RAM read corresponding to the smaller offset value to be performed first, thus favoring smaller offset values (and potentially smaller code words) in cases where both hash RAM lane locations store matching values. Because the position information is not stored in the hash RAMs, only the index and data values are forwarded to the write FIFOs. FIG. 17D shows hash RAM 1770 (representative of hash RAMs 1770-0 and 1770-1 of FIG. 17A), which contains only lane data (LnData$_{[13:0]}$).

Figure 18:
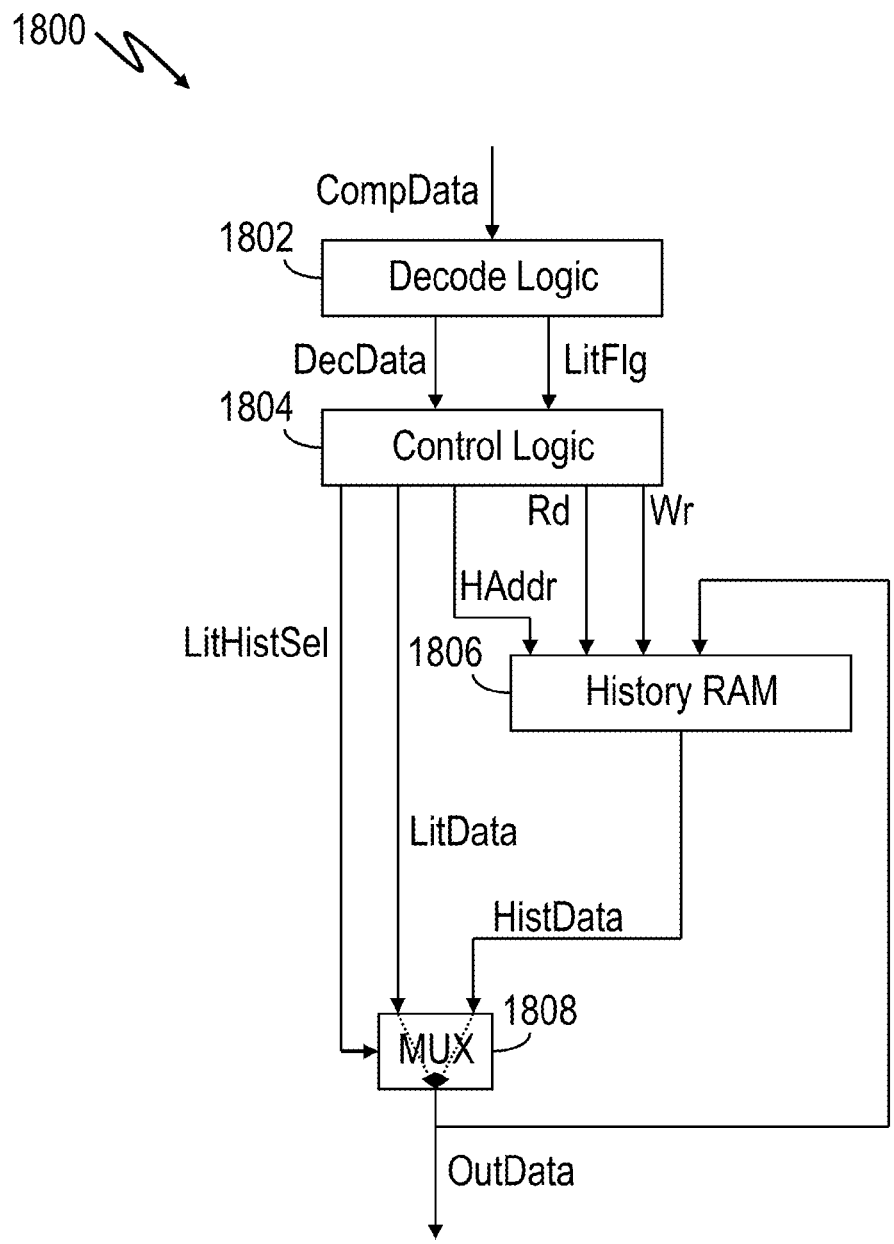
FIG. 18 shows a block diagram of decompression engine 1800, in accordance with at least some example embodiments.

Chunk data decompression engine 1800 is shown in FIG. 18, in accordance with at least some example embodiments. Compressed data (CompData), formatted as described above and shown in FIG. 15B, is received and decoded by decode logic 1802. If a literal record is identified, the literal data is output as the decoded data (DecData), and the literal flag (LitFlg) is asserted. If a match record is identified by decode logic 1802, the offset and length parameters of the match record are output as the decoded data, and the literal flag is de-asserted. The decoded data and the literal flag are provided to control logic 1804. If the literal flag is asserted, control logic 1804 configures multiplexer (MUX) 1808 (via the literal/history select (LitHistSel) signal) to output the literal data (LitData) as the output data (OutData). The output data is fed back to the input of history RAM 1806, where the output data is written by control logic 1804 to history RAM 1806 (via the Write (Wr) signal). The current location within the chunk being de-compressed is used as the history RAM address (HAddr). If the literal flag is not asserted, control logic 1804 configures multiplexer 1808 to output historical data (HistData) read from history RAM 1606 by control logic 1804 (via the read (Rd) signal). The offset value included in the decoded data is used as the initial history RAM address, which is incremented until all of the matching bytes have been output, as indicated by the length value included in the decoded data. Data is decoded and output until an EOF record for the chunk is encountered. The EOF record is not output. As with the literal data case, output data is fed back to the input of history RAM 1806, where the output data is written by control logic 1804 to history RAM 1806 (via the Write (Wr) signal).

Hardware and Software Implementation Example

Figure 19:
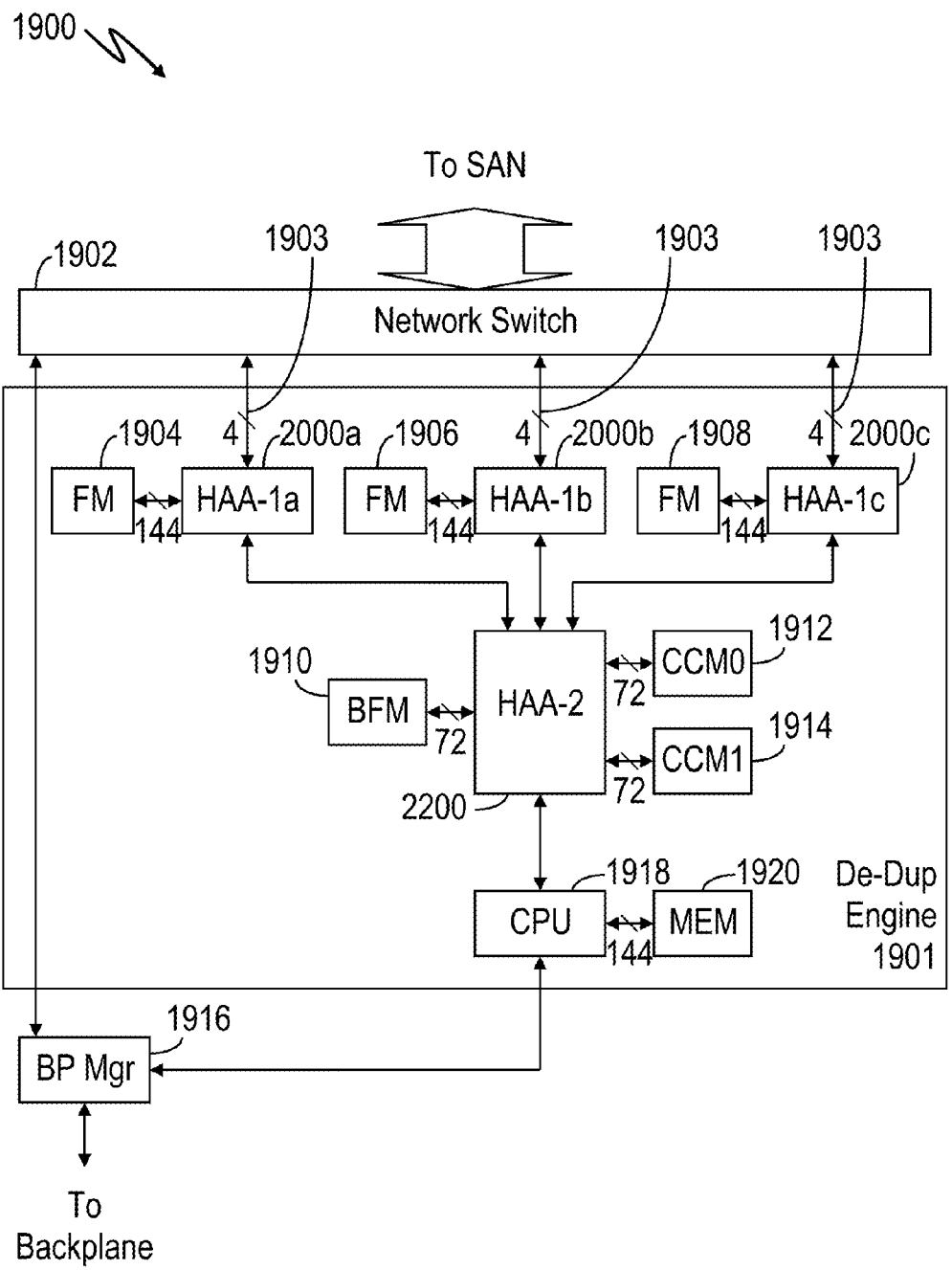
FIG. 19 shows a high-level block diagram of a hardware implementation of deduplication blade 300 of FIG. 2, in accordance with at least some example embodiments.

FIG. 19 shows an example of a data deduplication and compression system 1900, constructed in accordance with at least some embodiments, which is configured for installation within a director-level switch used to form at least part of the SAN. Although the system shown and described in FIG. 19 does not include the partitioning scheme previously described, such partitioning has been omitted from the example solely for simplicity. The examples presented are equally applicable to embodiments that implement partitioning.

The embodiment shown implements a deduplication engine 1901 using a combination of hardware and software. The example system 1900 includes a network switch 1902 that provides connectivity between deduplication engine 1901 and a SAN. The network switch 1902 couples to each of three hardware assist application specific integrated circuits or hardware assist ASIC modules within deduplication engine 1901 (HAA-1a module 2000a, HAA-1b module 2000b, and HAA-1c module 2000c) via four, 4-Gbps Fibre Channel ports, through which data is received from and transmitted to both storage devices and hosts. Each HAA-1 module couples to an associated frame memory module (FM 1904, FM 1906 and FM 1908 respectively), and all of the HAA-1 modules couple to a single HAA-2 module 2000. HAA-2 module 2000 also couples to three memory modules: Bloom filter memory (BFM) module 1910, CAS cache memory 0 (CCM0) module 1912, and CAS cache memory 1 (CCM1) module 1914. HAA-2 module 2200 also couples to CPU 1918, which executes the deduplication engine software modules described herein. CPU 1918 further couples to both memory module (MEM) 1920 and backplane manager (BP Mgr) 1916. Backplane manager 1916 couples to both network switch 1902 and the backplane of the director-level switch in which example system 1900 is installed.

Each of the HAA-1 modules provides hardware implementations of both deduplication functions and compression/decompression functions that require processing all of the data within a frame. These functions include the Rabin Fingerprint generation used to define chunks, the SHA-256 and CRC-64 generation used to produce chunk identifiers, the CRC-64 checking used to verify data integrity at various points during chunk processing, and both the compression and decompression of the data within the chunks. The HAA-2 module provides hardware implementations of deduplication functions that only require processing metadata associated with the frame data, including the Bloom filter and the CAS cache. Each of the different types of hardware assist ASIC modules, as well as their interfaces to the software modules executing on the CPU, are explained in more detail below.

Hardware Assist ASIC 1

Figure 20:
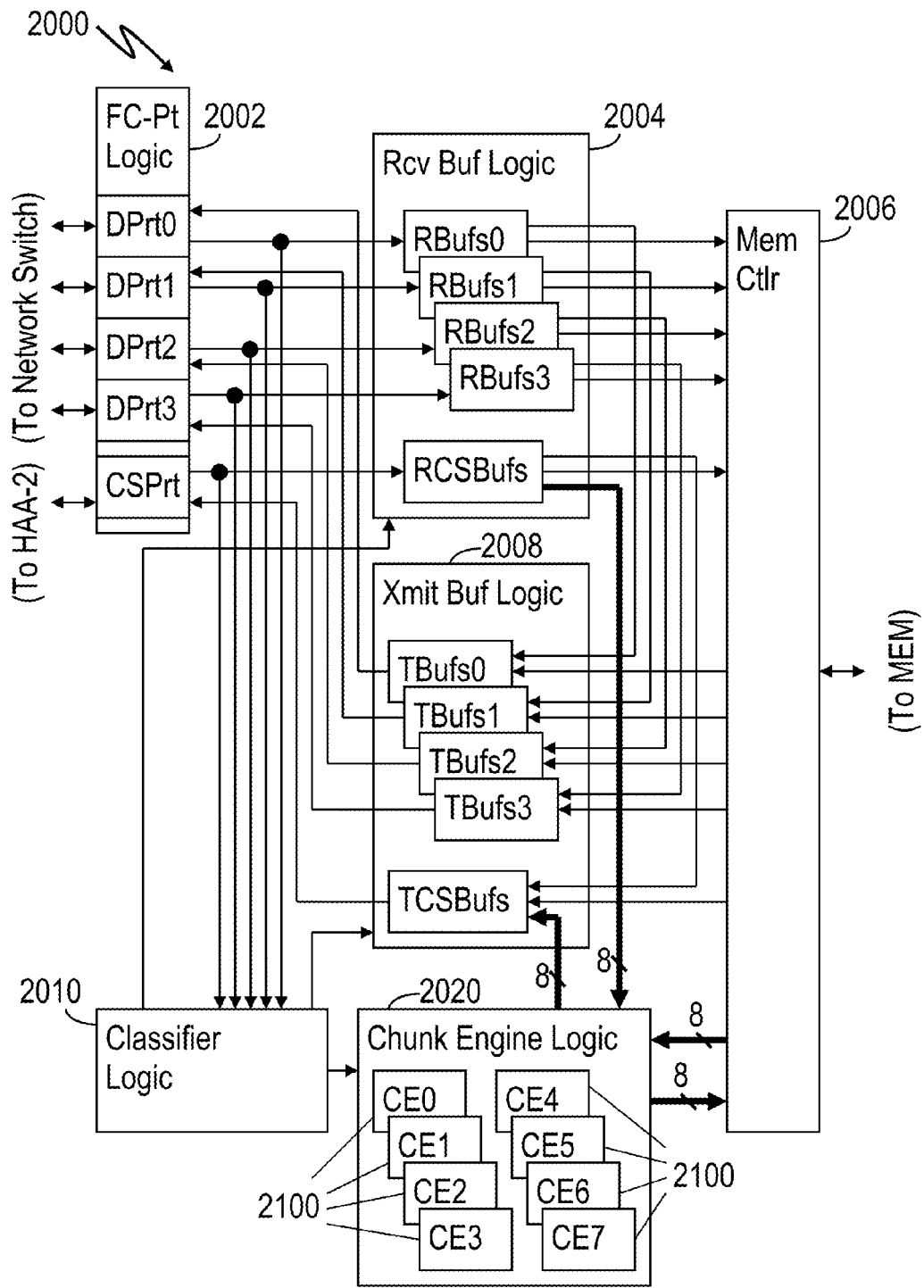
FIG. 20 shows a block diagram of a hardware assist ASIC 1 (corresponding to HAA-1a, HAA-1b and HAA-1c of FIG. 19), in accordance with at least some example embodiments.

FIG. 20 shows a block diagram of a hardware assist ASIC module 2000, representative of HAA-1 modules 2000a, 2000b and 2000 and constructed in accordance of at least some example embodiments. HAA-1 module 2000 includes Fibre Channel port logic (FC-Pt Logic) 2002, which includes four, 4-Gbps Fibre Channel data ports (data port 0 (DPort0) through data port 3 (DPort3)) that provide connectivity to network switch 1902 of FIG. 19. HAA-1 module 2200 also includes a fifth, 4-Gbps Fibre Channel command and status port (CSPrt) that provides connectivity to HAA-2 module 2200 of FIG. 17. All five ports of FC port logic 2002 couple to both receive buffer logic (Rcv Buf Logic) 2004 and transmit buffer logic (Xmit Buf Logic) 2008. Incoming serial data is converted to 32-bit parallel data, and the data from each data port of FC port logic 2002 is transferred from a receive port to a corresponding set of receive data buffers (RBufs0-3), and incoming control and status frames are transferred from the control and status port of FC port logic 2002 to the receive control and status buffers (RCSBufs) of receive buffers 2004.

The headers for incoming data frames, as well as for incoming control and status frames, are also transferred to classifier logic 2010. Classifier logic 2010 decodes the headers and performs various internal control functions, including identifying incoming data frames, sequencing of the incoming frames, and instructing the receive buffer logic to extract frame payloads and store the extracted payloads in the external frame memory coupled to the HAA-1 module (via memory controller (Mem Ctrl) 2006, which couples to receive buffer logic 2004). Classifier 2010 also recognizes CPU-originated commands (received on the command and status port from the HHA-2 module), which are decoded as either commands directed to the HHA-1 module (e.g., a command to compress a data chunk), or frames to be forwarded to a data port for transmission to either a host or a storage device. Classifier 2010 also performs at least part of the management of the receive buffers of receive buffer logic 2004.

Extracted payload data stored in external frame memory is transferred (via memory controller 2006) from the frame memory module to chunk engine (CE) logic 2020, which includes eight independent chunk engines (CE0 through CE7) 2100 for processing frame data. Each individual chunk engine has two separate data paths from the frame memory module (via memory controller 2006). One path provides extracted frame data from the frame memory module for processing by the chunk engine, the other provides processed frame data from the chunk engine back to the frame memory module. These paths are shown in the example of FIG. 20 as 8 data paths from chunk engine logic 2020 to memory controller 2006, and 8 data paths from memory controller 2006 to chunk engine logic 2020. If the extracted frame data originates from a host, the frame data may optionally be processed for deduplication, data compression, or both, before being written to a storage device. If the extracted frame data originates from a storage device, the frame data may optionally be decompressed before being transmitted to a requesting host.

Once the data is processed by a chunk engine within chunk engine logic 2020, the resulting processed data is stored back into the frame memory module via memory controller 2006. Chunk engine logic couples to the receive control and status buffer of receive buffer logic 2004 via 8 separate data paths (one for each chunk engine within chunk engine logic 2020), and similarly couples to the transmit control and status buffer of transmit buffer logic 2008, also via 8 separate data paths (also one for each chunk engine). The receive buffer paths provide control data from the CPU to each chunk engine, and the transmit buffer paths provide status data from each chunk engine back to the CPU.

Continuing to refer to the example embodiment of FIG. 20, each of the data ports, as well as the control and status port, couple to transmit buffer logic 2008, which includes transmit buffer sets 1 through 3 (TBufs0 through TBufs3), as well as a set of control and status transmit buffers (TCSBufs). Data processed by system 1900 and stored in the corresponding HAA-1 frame memory module is transferred from the frame memory module to the transmit buffer within transmit buffer logic 2008 corresponding to the data port coupled to the destination of the processed frame data. The data is subsequently transferred to the corresponding data port for serialization, formatting and transmission to its destination (host or device) via network switch 1902 of FIG. 19.

Figure 21:
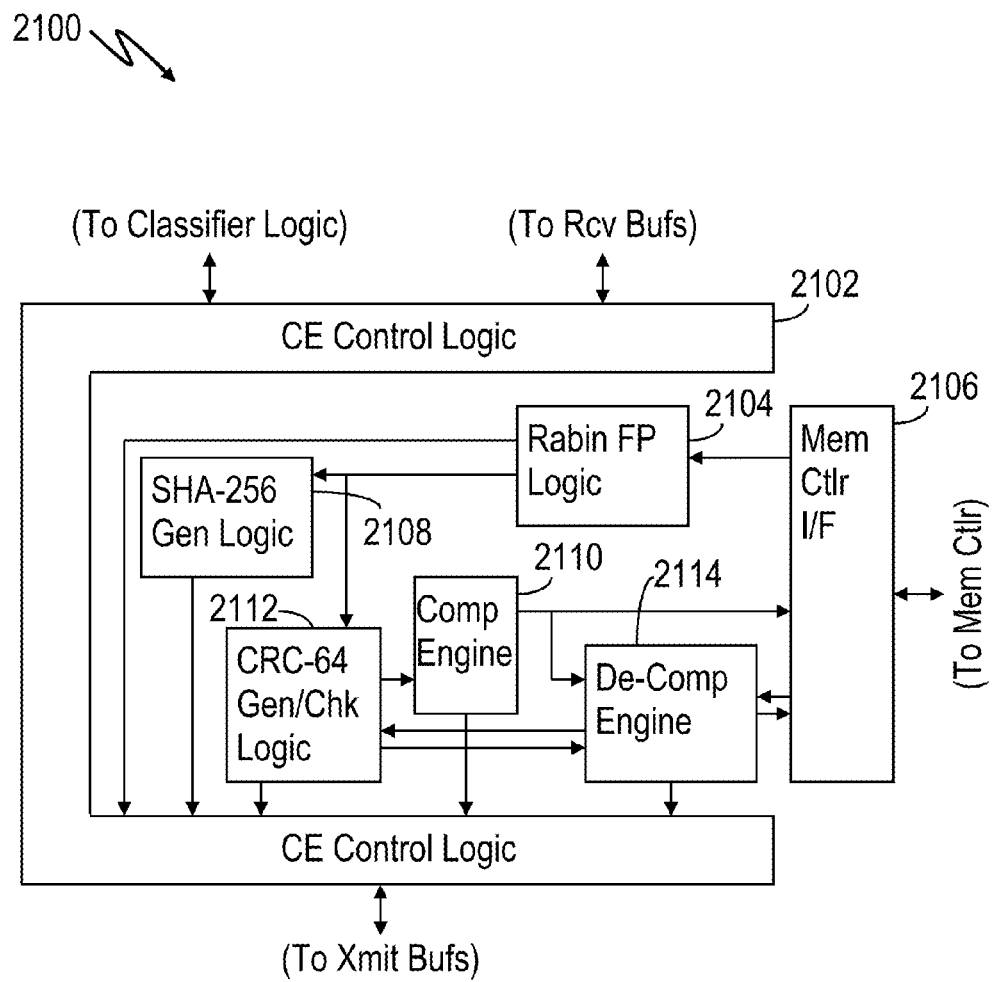
FIG. 21 shows a block diagram of one of the chunk engines of FIG. 19, in accordance with at least some example embodiments.

FIG. 21 shows a more detailed block diagram of a chunk engine 2100, constructed in accordance with at least some example embodiments. Extracted frame data destined for a storage device is received by memory controller interface (Mem Ctlr I/F) 2106 from the frame memory and is forwarded to Rabin fingerprint logic (Rabin FP Logic) 2104. Rabin fingerprint logic 2104 couples to memory controller interface 2106, secure hash algorithm 256 generation logic (SHA-256 Gen Logic) 2108, and cyclic redundancy check 64 generation and check logic (CRC-64 Gen/Chk Logic) 2112, and applies the Rabin fingerprint calculation previously described to the frame data to determine the boundaries that define each chunk. The data for each chunk is forwarded by Rabin fingerprint logic 2104 to both SHA-256 generation logic 2108 and CRC-64 generation and check logic 2112, which each applies its respective algorithm to the chunk data to derive SHA-256 and CRC-64 values for the chunk. The chunk boundary information, SHA-256 value and the CRC-64 value for each chunk are all forwarded to chunk engine control logic 2102 (coupled to Rabin fingerprint logic 2104, SHA-256 generation logic 2108 and CRC-64 generation and check logic 2112), which forwards the data to transmit buffer logic 2008 of FIG. 20 for subsequent transmission to CPU 1918 of FIG. 19.

Continuing to refer to FIG. 21, the data is forwarded by CRC-64 generation and check logic 2112 to data compression engine (Comp Engine) 2110 (which are coupled to each other) for data compression as previously described. Data compression engine 2110 couples to both data decompression engine (De-Comp Engine) 2114 and memory controller interface 2106, and forwards the compressed data to both. The compressed data is forwarded by memory controller interface 2106 to memory controller 2006 of FIG. 20 for subsequent storage in the frame memory (e.g., frame memory 1906 of FIG. 19). Concurrently, the compressed data is decompressed by data decompression engine2114, which couples to, and forwards the decompressed data to, CRC-64 generation and check logic 2112. The CRC-64 value is calculated for the decompressed data and compared to the CRC-64 value calculated before compression of the data to verify that no errors were introduced by the compression of the data. Data compression engine 2110 and data decompression engine 2114 are each coupled to chunk engine control logic 2102, and each provides the status of their operations for each chunk upon completion. This status, together with the results of the CRC-64 verification check of the chunk, is combined with the Rabin fingerprint, SHA-256 and CRC-64 data for the chunk, which is all forwarded by chunk engine control logic 2102 for subsequent transmission to CPU 1918, as previously described.

Data decompression engine 2114 also couples to memory controller interface 2106, from which data decompression engine 2114 receives compressed chunk data, stored in the frame memory, for decompression. The decompressed chunk data is forwarded back to memory controller interface 2106 for subsequent storage in the frame memory, and is also forwarded to CRC-64 generation and check logic 2112 to calculate the CRC-64 value for each chunk, and to compare the value with the stored CRC-64 value for the chunk. The results of the decompression and CRC-64 check are forwarded to chunk engine control logic 2102 for subsequent transmission to CPU 1918, as previously described.

Chunk engine control logic 2102 also couples to classifier logic 2010 of FIG. 20, which controls at least part of the configuration and operation of chunk engine control logic 2102 based upon command messages received from CPU 1918 of FIG. 19, and decoded by classifier logic 2010. These commands are forwarded to chunk engine control logic 2102 from the receive control and status buffers of receive buffer logic 2004, to which chunk engine control logic 2102 also couples.

Hardware Assist ASIC-2

Figure 22:
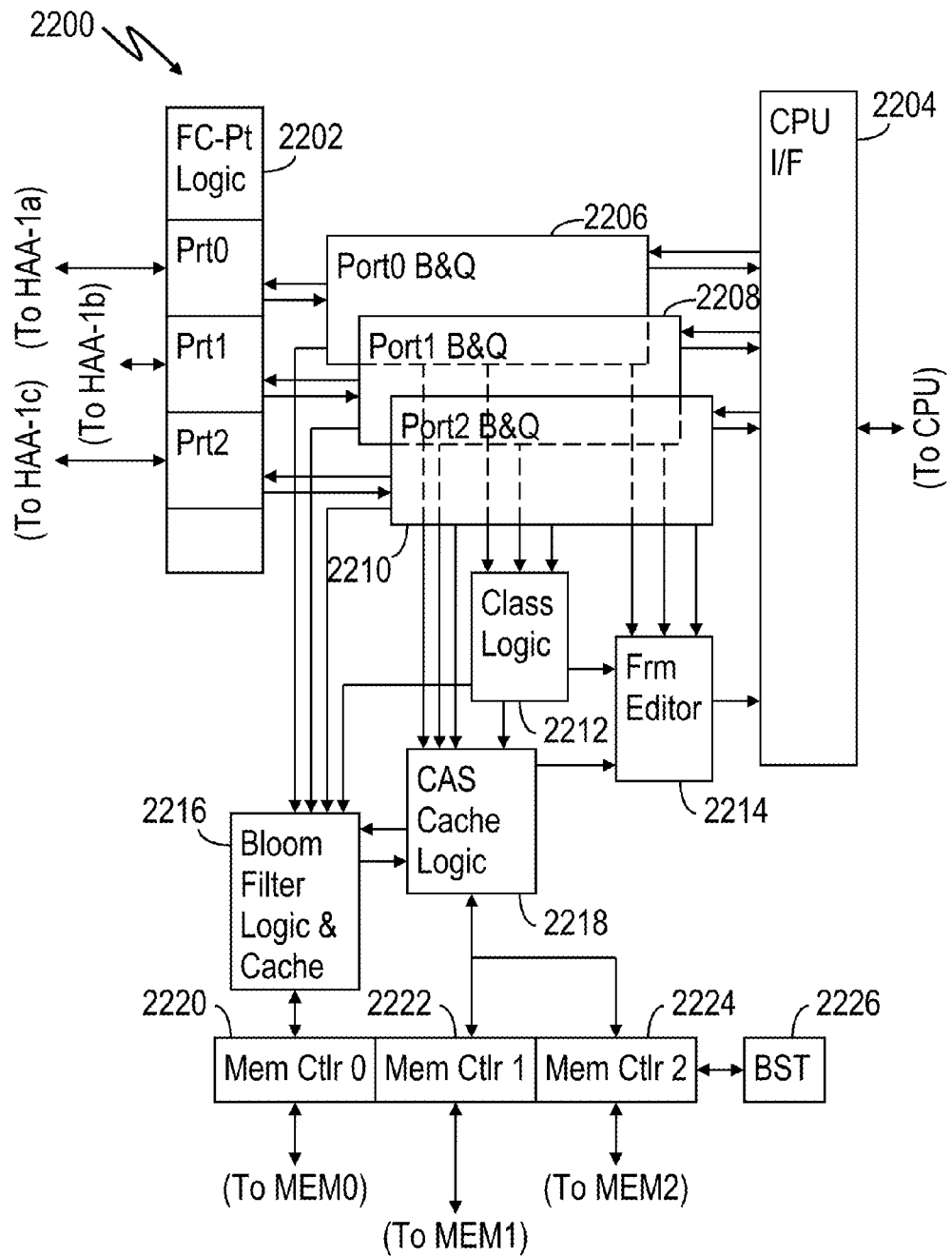
FIG. 22 shows a block diagram of hardware assist ASIC 2 of FIG. 19, in accordance with at least some example embodiments.

FIG. 22 shows a block diagram of a hardware assist ASIC 2 module 2200, constructed in accordance with at least some example embodiments. Fibre Channel port logic 2202 provides connectivity to each of the three HAA-1 modules of FIG. 19 through ports 0 through 2 (Prt0 through Prt2). Each port couples to a corresponding port buffers and queues module (Port0 B&Q 2206, Port1B&Q 2208 and Port2 B&Q 2210), and each port buffers and queues module couples to CPU interface (CPU I/F) 2204, Bloom filter logic and cache 2216, CAS cache logic 2218, classifier logic (Class Logic) 2212 and Frame editor (Frm Editor) 2214. Data, command and status frames received from the HAA-1 modules and/or the CPU are initially stored in a corresponding receive buffer, and the frame header is decoded by classifier logic 2218. If the frame is not directed to the HAA-2 module, classifier logic 2212 causes frame editor 2214 to forward the frame to its destination (e.g., a command frame directed to HAA-1b and received from the CPU is forwarded to port 1 for transmission to HAA-1b).

If a frame received by HAA-2 module 2200 is a command frame from the CPU directed to the HAA-2 module, classifier logic 2218 causes the frame to be forwarded to the appropriate module. Thus, for example, if the CPU issues a CAS cache write command, classifier logic 2218 causes the command frame (which includes the relevant updated CAS entry and/or metadata information to be written) to be forwarded to CAS cache logic 2218. If a frame received by HAA-2 module 2200 is a frame that includes chunk information from an HAA-1 module (e.g., the chunk boundaries, SHA-256 data and CRC-64 data for a processed chunk to be stored), classifier logic 2212 cause frame editor 2214 to forward the frame received from the HAA-1 module to both Bloom filter logic and cache 2216 and to CPU 1918 of FIG. 19. This triggers a Bloom filter lookup, and a corresponding CAS cache lookup if the Bloom filter indicates that the chunk identified in the received frame already exists on the relevant storage device. The results of the Bloom filter lookup and CAS cache lookup (if performed) are subsequently appended to the received frame as it is forwarded to CPU 1918, thus providing the software executing on the CPU with the information necessary to process the chunk.

Bloom filter logic and cache 2216 couples to memory controller 0 (Mem Ctlr 0) 2220, and CAS cache logic 2218 couples to both memory controller 1 (Mem Ctlr 1) 2222 and memory controller 2 (Mem Ctlr 2) 2224. Each memory controller couples to a corresponding memory module (BFM, CCM0 and CCM1 of FIG. 19), and also to built-in self test (BST) module 2226 (used to initialize blocks of memory within each of BFM, CCM0 and CCM1, e.g., as part of a Bloom filter reconstruction). Memory controller 0 (2220) operates to control and provide access to the BFM module, which stores the status bits for the Bloom filter arrays corresponding to each of the physical LUNs managed by data deduplication and compression system 1900 of FIG. 19. The Bloom filter cache is maintained in a smaller, separate area of memory within Bloom filter and cache 2216. Memory controllers 1 and 2 (2222 and 2224) similarly operate to control and provide access to the CCM0 and CCM1 modules, which store the CAS cache entries for the CAS caches corresponding to each of the physical LUNs managed by data deduplication and compression system 1900 of FIG. 19.

CPU and Software

Referring now to both FIGS. 3 and 19, CPU 1918 executes the software modules that perform the remaining storage-related operations not performed by the hardware assist ASIC modules, which are shown as components of De-Dup Engine S/W 350 in FIG. 3. These include I/O engine 352, volume manager 354, metadata management module 356, thin provisioning module 358, read/write engine 360 and defragmentation module 362, each already described above. By using dedicated hardware to implement at least some of the deduplication and/or compression functions as previously described, these software modules require significantly less time to perform their functions, when compared to what would be required if the functions implemented in hardware were instead implemented in software executing on the CPU (given the same CPU operating at the same clock rate). When such hardware off-loading is combined with the previously described data/metadata organization and caching, significant performance improvements may be achieved over systems that do not implement such hardware off-loading and data/metadata organization and caching, as shown in more detail below.

Example Data Flow

The following description illustrates how data is processed by data deduplication and compression system (DCS) 1900 of FIG. 19. A high level overview of the example data flow is first presented, followed by a more detailed description of the same data flow.

In the present example, a request to write data to a virtual LUN managed by DCS 1900 is received from a host at an input port of one of the HAA-1 modules. The HAA-1 module identifies the write request, configures the HAA-1 module hardware to receive the data frames associated with the request, and signals to the requesting host that it is ready to receive the data frames. Once the data frames begin to arrive at an HAA-1 module input port, hardware within the HAA-1 module subdivides the incoming frames into chunks, calculates chunk identifiers on the fly for each chunk, and compresses and stores the chunks in memory for later retrieval. As the processing of each chunk is completed, information for each corresponding chunk, including the chunk identifier generated by the HAA-1 module, is forwarded to the HAA-2 module for further processing. The HAA-2 module uses the chunk identifiers received from the HAA-1 module to determine whether the chunk is a duplicate of another chunk already stored on the system. The result of this determination is forwarded to the CPU where software executing on the CPU takes action appropriate action in response.

If a chunk is a duplicate, the software updates the metadata of the corresponding chunk already stored on the system and the corresponding vLUN location map, and a command is issued by the CPU to the appropriate HAA-1 module (via the HAA-2 module) to discard the buffered chunk. Updates to the CAS info (part of the CAS index) are also provided to the HAA-2 module, which maintains the CAS cache. If the information received by the HAA-2 module from the HAA-1 module indicates that the chunk is a new, unique chunk, the software allocates storage space for the data, creates the corresponding metadata, commands the HAA-2 module to update the CAS cache, and commands the HAA-1 module to transmit the buffered chunk across the SAN to the storage device where the storage space has been allocated. Upon completion of the write operation, the software executing on the CPU causes a message to be transmitted to the host node that originated the write request, which indicates the completion status of the write operation.

Examining the above-described write operation in more detail, and referring to the example intelligent storage system of FIG. 1A, the example data flow presented in FIG. 1C, the example software modules shown in FIG. 3, the example metadata structures and engines of FIG. 5A, and the example hardware embodiment of FIGS. 19-22, four new blocks (B3 through B6) each within one of virtual data units 3 through 6 (U3 through U6) are to be written to vLUN 152 of FIG. 3. vLUN 152 is presented by volume manager software 354 (FIG. 3), executing on CPU 1918 of DCS 1900 (FIG. 19), to hosts coupled to SAN 102 (FIG. 1A). A write request message is received from a host by DCS 1900, and is routed by network switch 1902 (FIG. 19) to a data port of an HAA-1 module (FIG. 19). For purposes of this example, the received message is routed to port 0 of HAA-1b module 2000*b*, which has previously been configured to receive data addressed to vLUN 152. In this example, vLUN 152 is configured to store deduplicated and compressed data on pLUN 160 (FIG. 1C).

The write request message for blocks 3 through 6 is initially stored within the receive buffers for port 0 of receive buffer logic 2004 (FIG. 20). Classifier logic 2010 (FIG. 20) decodes the header of the received message, identifies it as a write request, and causes the message to be forwarded to HAA-2 2200 (FIG. 19), which in turn forwards the message to CPU 1918. Metadata management module software 356 (FIG. 3) executing on CPU 1918 responds to the forwarded write request by directing a command to HAA-1b 2000*b* (via HAA-2 2200) that causes classifier logic 2010 to prepare frame buffers in frame memory 1906 (FIG. 19) to receive and extract the incoming data (blocks 3 through 6 of FIG. 3). Classifier logic 2010 then causes a message to be sent back to the host (via the port 0 transmit buffers of transmit buffer logic 2008 (FIG. 20)), that indicates to the host that vLUN 152 is ready to accept the data to be written. The host transmits one or more messages containing data block 3, which are received and stored within the port 0 receive buffers of receive buffer logic 2004. Classifier logic 2010 identifies the received message(s) as (a) data message(s) and when a buffering threshold is reached, causes a message to be sent to CPU 1918 (via HAA-2 2200), which notifies metadata management module software 356 that the threshold has been reached. Metadata management module software 356 responds by sending a command to HAA-1b 2000*b* (via HAA-2 2200) to generate a fingerprint, which causes classifier logic 2010 to instruct receive buffer logic 2004 to extract the payload (block 3), and to store the extracted payload within the buffers previously reserved within frame memory 1906.

As the block is transferred into frame memory 1906, classifier logic 2010 further instructs one of the chunk engines 2100 within chunk engine logic 2020 (FIG. 20) to start reading in the extracted data for block 3 from frame memory 1906. The chunk engine 2100 reads in the extracted data for block 3, which is first processed by Rabin fingerprint logic 2104, and then forwarded to both SHA-256 generation logic 2108 and CRC-64 generation and check logic 2112 (FIG. 21). Data is forwarded through each module of the chunk engine as it is received in a continuous stream so as to reduce any processing-related latency. Rabin fingerprint logic 2104 defines a single chunk for block 3 since the block is 1,492 bytes long (see vLUN location map 162, FIG. 1C), which is less than the 2,048 bytes required before Rabin fingerprint logic 2104 begins to search for a chunk anchor point. After identifying and compressing the one chunk for block 3, and completing the SHA-256 and CRC-64 value calculations, the chunk boundaries, SHA-256 and CRC-64 information are all forwarded by the chunk engine to chunk engine control logic 2102 (FIG. 21) for subsequent transmission to HAA-2 2200.

HAA-2 2200 receives the information for the one chunk of block 3 on port 1, which is stored within Buffers and Queues 2208 (FIG. 22). Classifier logic 2212 (FIG. 22) concurrently receives the header for the received message, identifying the message as a chunk information message. Classifier 2212 instructs Bloom filter logic and cache 2216 (FIG. 22) to perform a Bloom filter look up for the chunk based upon the chunk ID provided within the body of the message (i.e., the concatenation of the SHA-256 and CRC-64 values for the chunk). Because block 3 includes the same data as block 1, which is already stored on the system, Bloom filter logic and cache 2216 returns an indication that the chunk may already exist on pLUN 160. The positive indication from the Bloom filter triggers a CAS index lookup (FIG. 5A) by CAS cache logic 2218 (FIG. 22), which performs the functions of fingerprint lookup engine 520 of FIG. 5A. If the bucket for the CAS bucket block is already loaded within the CAS cache for pLUN 160 (e.g., CAS cache 540 of FIG. 5A, stored within CCM0 1912 of FIG. 19), the bucket data is read. The results of the Bloom filter lookup, the success/failure status of the CAS cache lookup (if performed), and the CAS bucket data (if a performed lookup is successful) are subsequently appended to the chunk information message previously received, and the modified chunk information message is transmitted to CPU 1918 for further processing.

Upon receipt of the modified chunk information message, metadata management module software 356 examines the received chunk information message. In this example, the received chunk information for block 3 indicates a possible match from the Bloom filter lookup, and a confirmed match from the CAS cache read. If the status value within the received chunk information indicates that the CAS cache read was not successful, the CPU sends a message to one of the HAA-1 modules to read the required CAS buck block from the CAS pLUN (e.g., pLUN 544 of FIG. 5A). In at least some example embodiments, each CAS bucket block is implemented as a B+ search tree (not shown), wherein the root node is store in memory and includes 16 keys corresponding to 16 leaves, with each leaf including 16 CAS cache entries. When a CAS pLUN read is needed, the B+ tree is used to identify which group of 16 CAS cache entries (i.e., which leaf) to read into the CAS cache. The response to the read request is subsequently sent by the HAA-1 module to the HAA-2 module, which forwards the message to CPU 1918 to provide Metadata management module software 356 with the requested CAS B+ tree leaf.

If the CAS entry is located within the B+ leaf read from the CAS pLUN, a message is sent by metadata management module software 356 to the HAA-2 module, which uses the entry to update the least recently used entry for the corresponding bucket block within the CAS cache (if the bucket block is already loaded in the CAS cache). If the entry is not found, it is added to the bucket block, the B+ tree is updated, and a message is sent by metadata management module software 356 to the HAA-2 module, which uses the new entry to update the least recently used entry for the corresponding bucket block within the CAS cache if the bucket block is already loaded in the CAS cache. If the bucket block is not already loaded in the CAS cache, it is loaded into the cache with the new entry as Entry[0]. A message is also transmitted by the CPU to an HAA-1 module (via the HAA-2 module) to update the CAS pLUN with the new entry.

Metadata management module software 356 uses the metadata record pointer (included in the bucket data added to the chunk information message by HAA-2 2200) to locate the corresponding metadata record for the chunk data already stored on pLUN 160. Metadata management module software 356 first attempts to locate the metadata page containing the required metadata record in the metadata cache (e.g., metadata cache 550 of FIG. 5A), which is maintained within CPU memory 1920 (FIG. 19). If the required metadata page is not already loaded in the metadata cache, the CPU reads the required metadata page from the CAS metadata pLUN (e.g., pLUN 554 of FIG. 5A) into the metadata cache. The chunk information is read from the metadata record corresponding to the chunk already stored on pLUN 160 that matches the chunk from block 3, and the entry within vLUN location map 162 (also maintained within CPU memory 1920) corresponding to block 3 is updated by volume manager software 354 to reflect the metadata record pLUN location information. The compressed chunk data for block 3 stored in frame memory 1906 is thus ignored, and will later be discarded when the allocated resources within HAA-1b 200*b* are released upon completion of the processing of the write request.

While the chunk information message for block 3 is being processed by CPU 1918, HAA-1b 2000*b* continues to receive data messages from the host, and to process the remaining blocks stored within frame memory 1906 as they are extracted from each received message or set of messages corresponding to each block. After processing block 3, one or more data messages that include block 4 is received, and the data for block 4 is extracted from the payload of the corresponding message(s) and stored within frame memory 1906. Classifier 2010 causes a chunk engine 2100 to process block 4 in the same manner as block 3, which forwards the chunk engine processing results for transmission to HAA-2 2200 as a chunk information message for block 4. Unlike block 3, however, the one chunk for block 4 (which is also less than 2,048 bytes) does not match any chunk already stored on the system, which is indicated by the results from the Bloom filter. As a consequence, no CAS cache lookup is performed, since the Bloom filter does not produce false negatives and verification of the Bloom filter results is not required.

The modified chunk information message for block 4 is received by metadata management module software 356, which recognizes from the Bloom filter results that the chunk for block 4 is a new chunk and passes the chunk information to volume manager software 354. Volume manager software 354 in turn passes the chunk information to thin provisioning module software 358 (FIG. 3; also executing on CPU 1918), which allocates a physical unit on pLUN 160 for the data if a physical unit corresponding to virtual unit 4 (U4) hasn't already been allocated (e.g., due to a previous write of other data within virtual unit 4). Once allocated, or if the unit is already allocated, data space is assigned for the compressed chunk of block 4 and the start pLUN LBA is provided by thin provisioning module software 358 to volume manager software 354. Volume manager software 354 in turn uses the information to create a new entry within vLUN location map 162 that maps the corresponding vLUN LBA of the chunk for block 4 to the assigned pLUN data space.

The pLUN location information for the block 4 chunk is passed by volume manager software 354 to metadata management module software 356, which creates a new metadata record for the new chunk, which is stored within either an existing metadata page, or a newly allocated metadata page. The chunk data and metadata allocation information is then passed by metadata management module software 356 to read/write engine software 360 (FIG. 3; also executing on CPU 1918), which generates a data transfer message and a metadata update message, both of which are forwarded to HAA-2 2200. Upon receipt of each of these messages, classifier logic 2212 of HAA-2 2200 causes frame editor 2214 to forward both messages to HAA-1b 2000*b*.

Upon receipt of metadata update message forwarded by HAA-2 2200, classifier logic 2010 of HAA-1b 2000*b* causes the CAS index data provided in the message to be written to the both the hash index table pLUN and the CAS info pLUN (e.g., hash index table pLUN 534 and CAS info pLUN 544 of FIG. 5), and further causes the metadata provided in the message to be written to the CAS metadata pLUN (e.g., CAS metadata pLUN 554 of FIG. 5). Upon receipt of the data transfer message forwarded by HAA-2 2200, classifier 2010 of HAA-1b 2000*b* causes the compressed data for the block 4 chunk, stored in frame memory 1906, to be written to the location on pLUN 160 indicated by the location information provided in the data transfer message. After both the metadata update and the data transfer have completed, classifier logic 2010 causes a completion status message to be sent back to CPU 1918 (via HAA-2 2200).

Processing continues for blocks 5 and 6, wherein block 5 (which includes a single, duplicate chunk) is processed in a manner similar to block 3, and block 6 (which includes a single, non-duplicated chunk) is processed in a manner similar to block 4. Upon completion of the processing of all four blocks, metadata management module software 354 transmits a command message to HAA-1b 2000*b* (via HAA-2 2200) that causes classifier 2010 to release all resources within HAA-1b 2000*b* associated with the transaction (e.g., the chunk engine(s) used to process the data, as well as the buffers within receive buffer logic 2004, frame memory 1906, and transmit buffer logic 2008). Classifier 201 further causes a write status message to be sent back to the host that originated the original write request, completing the processing of the request.

Throughput Performance

By offloading onto dedicated hardware operations that would otherwise be computationally intensive for a processor, and by organizing both the data and the metadata so as to initially store and subsequently maintain related data and metadata clustered together on the storage media and thus in cache memory, at least some embodiments of the deduplication and compression system of the present application can perform the operations described herein at the wire speed of the links that couple the system to a SAN. For example, DCS 1900 of FIG. 19 couples to a SAN through network switch 1902 via twelve, 4 Gbps Fibre Channel links 1903, thus providing an aggregate bandwidth of 48-Gbps for the system. Taking into account the encoding used in the Fibre Channel links (8B/10B encoding) as well as other associated overhead, each 4 Gbps link is actually capable of a wire speed data throughput of 3.32 Gbps (425 MBps), resulting in an actual aggregate bandwidth of 39.84 Gbps (4.98 GBps) for the system.

In order to process data at least as fast as it is received on a given Fibre Channel link, each data stream processed through a given HAA-1 port (e.g., port 0 of FIG. 20) transfers the de-serialized incoming data, 32 bits at a time, at a rate of 106.25 MHz. In the embodiments of FIGS. 19-21, chunk engines 2100 each have two data lanes and operate at 212.5 MHz. Because two bytes (one for each lane) are processed during each chunk engine processing cycle at twice the rate of the incoming de-serialized data, the chunk engines can process the incoming data at the full wire speed of 425 MBps. In other example embodiments, chunk engines 2100 each have four data lanes and operate at 106.25 MHz, and thus four bytes are processed during each chunk engine processing cycle at the same rate as the incoming de-serialized data. In each of these embodiments, even if data is being input and output concurrently on all four ports of an HAA-1 module, because eight chunk engines are available, four chunk engines are available to actively process data for each of the four links 1903 associated with a single HAA-1 module, while the other four chunk engines are each available to be configured to process another chunk without having to wait for the current processing of chunks by any of the first four chunk engines to complete. Thus, data can continue to be processed by each HAA-1 module at the full, aggregate wire speed data rate of 13.6 Gbps in each direction without introducing interruptions or pauses in the data stream caused by delays introduced while the HHA-1 module is set up to process additional chunks.

Further, 800 MHz DDR2 RAMs are used for frame memories 1904, 1906 and 1908 and a 144-bit data bus (16 bytes of data plus 1 bit of parity per data byte), and data with parity is written to and read from the RAMs 288-bits at a time (256 of data, 32 of parity) at the 212.5 MHz rate. This memory configuration produces a 53.13 Gbps (6.64 GBps) burst data transfer rate both in and out of the frame memories. This burst rate is higher than the full aggregate data rate of 39.84 Gbps (4.98 GBps) of the four links 1903, and thus enabling data to be transferred in and out of the frame memories at the SAN wire speed data rate.

In order to sustain the wire speed data rates described above, the metadata associated with the streams for all three HAA-1 modules must also be processed within the time allotted. Using as an example a DCS 1900 used to deduplicate and compress data stored by one or more backup servers, a deduplication ratio of 10:1 is assumed. Thus, 10% of the incoming data is unique, and 90% is duplicated. Also, because the chunk engines s of the example embodiment of FIG. 21 implement the random irreducible polynomial of equation (1) within Rabin fingerprint logic 2104, the average chunks size is 8 Kbytes. As a result, on average 652,800 chunks must be processed by HAA-2 2200 and CPU 1918 per second (4.98 GBps/8,192 bytes per chunk) in order to sustain an aggregate throughput of 48 Gbps for the system. Of these 652,800 chunks, 65,280 are unique chunks (10%), while 587,520 chunks are duplicates (90%). Assuming a CAS cache hit rate of 98%, 575,770 chunks will be located within the CAS cache, while 11,750 chunks will not be located within the CAS cache and will need to be read from the CAS pLUN (e.g., pLUN 544 of FIG. 5A). Table 4 summarizes these results:

TABLE 4

| | |
|---|---|
| Input Traffic Processed by DCS 1900 (FIG. 19) | 5,347,737,600 Bytes/sec |
| Average Chunk Size | 8,192 Bytes |
| Total Chunks/Second | 652,800 Chunks/sec |
| Duplicate Traffic % | 90% |
| Unique Traffic % | 10% |
| Unique Chunks/Second | 65,280 Chunks/sec |
| Duplicate Chunks/Second | 587,520 Chunks/sec |
| CAS Cache Hit Rate | 98% |
| CAS Cache Miss Rate | 2% |
| Duplicate Chunks/Second already in CAS Cache | 575,770 Chunks/sec |
| Duplicate Chunks/Second not already in CAS Cache | 11,750 Chunks/sec |

Table 5 provides a set of estimated instructions performed by CPU 1918 for the operations listed, and the resulting processing power required for CPU 1918 in order to process the above-described data at 48 Gbps:

TABLE 5

| | |
|---|---|
| # of Instructions to Process a Unique Chunk | 31,200 Instr. |
| Total Instructions/Second Unique Chunk Processing | 1,962,934,274 Instr./sec |
| # of Instructions to Process Duplicate Chunks already in CAS cache | 9,700 Instr. |
| Total Instructions/Second for Duplicate Chunks already in CAS cache | 5,382,592,266 Inst./sec |
| # of Instructions to Process Duplicate Chunks not already in CAS cache | 23,300 Instr. |
| Total Instructions/Second for Duplicate Chunks not already in CAS cache | 263,863,665 Inst./sec |
| Total # of Instructions/Second to Process All Chunks | 7,609,390,203 Inst./sec |
| I/O Operations (IOP)/Second | 78,643 Ops./sec |
| # of Instructions/IOP | 5,600 Inst. |
| Total # of Instructions/Second for IOPs | 440,401,920 Inst./sec |
| Total # Instructions/Second for Chunk-Related Operations | 8,049,792,123 Inst./sec |
| Processing Power Required in Billions of Instructions per Second (BIPS) | 8.05 BIPS |
| Additional Processing Power for Overhead and Additional Tasks | 25% |
| Total Processing Power Required for CPU 1918 to support 48 Gbps Deduplication and Compression | 10.06 BIPS |

In at least some example embodiments of DCS 1900, an Octeon Plus CN5750 processor, manufacture by Cavium Networks, is used for CPU 1918. This processor is a 750 MHz, 12-core MIPS processor that is rated at a maximum performance of 19.2 BIPS, and which supports interfacing with 800 MHz DDR2 RAMs using up to 144-bits of combined data and parity.

To achieve the desired hit rates, the CAS cache is sized to store a predetermined percentage of the total number of CAS entries associated with a given backend data pLUN (e.g., pLUN 564 of FIG. 5A). In at least some example embodiments, because the metadata record pointer stored within a CAS entry is 32 bits wide, a maximum of 4,294,967,296 chunks can be represented (and thus stored) on the pLUN. Given that the average chunk size is 8 Kbytes, the total storage capacity of the pLUN is 32 Tbytes. To achieve the desired 98% hit rate for a CAS cache associated with a 32 Tbyte pLUN, the CAS cache is sized to accommodate 26,214,400 entries (i.e., a cache ratio of 0.61035%). Because each CAS entry is 64 bytes, a total of 1,677,721,600 bytes of CAS cache memory is required for the CAS cache associated with each CAS partition, and thus with each 32 Tbyte pLUN. In at least some example embodiments CAS cache memories CCM0 and CCM1 of FIG. 19 together provide up to 16 Gbytes of cache memory space. With 16 Gbytes reserved for CAS cache, DCS 1900 of FIG. 19 can thus support up to 8, 32 Tbyte pLUNs that operate at the full, aggregate wire speed data rate of 48 Gbps. At a 10:1 deduplication ratio, this represents as much as 2.56 Pbytes of storage, a number that is increased even further by the data compression provided by the chunk engines s 2100 of FIG. 19.

Conclusion

The systems and methods described herein thus provide on-the-fly deduplication and compression of data written to one or more storage devices by processing the data at the full line rate of an intervening SAN fabric between the storage device(s) and one or more host systems. Because data deduplication and compression are both performed at the full line rate, such systems and methods can be embedded within devices used to form the SAN fabric itself, such as the example director-level switch of FIG. 1A. Such embedding allows the deduplication and compression operations to be performed in a manner that is transparent to the host computer(s), thus avoiding the need for changes to either the application software storing the data or the operating systems of the hosts that access the data. The systems and methods described also may be scaled to accommodate faster fabric line rates, for example, by increasing the number of bytes processed in parallel by the chunk engines and/or by increasing the bit width of the Bloom filter (thus decreasing the number of false positives).

The above discussion is meant to illustrate the principles of at least some embodiments. Other variations and modifications will become apparent to those of ordinary skill in the art once the above disclosure is fully appreciated. It is intended that the following claims be interpreted to include all such variations and modifications.

What is claimed is:

1. A data compression apparatus, comprising:
a plurality of hash memories each associated with a different lane of a plurality of lanes, and each lane comprising data bytes of an incoming data stream being received by the data compression apparatus;
validity table comprising array elements each comprising a plurality of validity bits, wherein each validity bit within an array element corresponds to a different lane of the plurality of lanes;
control logic, coupled to the plurality of hash memories and the validity table, that initiates a read of a hash memory entry if a validity bit that corresponds to the lane associated with the hash memory entry indicates that said hash memory entry is valid; and
an encoder, coupled to the plurality of hash memories and the control logic, that compresses at least the data bytes for the lane associated with the hash memory comprising the valid hash entry if said valid hash entry comprises data that matches the data bytes for the lane.

2. The data compression apparatus of claim 1,
wherein at least some received data comprising the lane data bytes is compressed by replacing the at least some received data with a code word that points to a location within the data stream comprising previously received data; and
wherein the valid hash memory entry further comprises the location of the previously received data.

3. The data compression apparatus of claim 2, wherein the encoder compresses the lane data bytes if a location within the data stream of the lane data bytes is offset from the location of the previously received data by no more than a maximum value.

4. The data compression apparatus of claim 1, wherein the control logic initiates concurrent hash memory entry reads for at least two of the plurality of hash memories if the validity bit corresponding to the hash memory entry and lane of each of the at least two hash memories indicates that each of said hash memory entries is valid in different lanes.

5. The data compression apparatus of claim 1, further comprising:
a plurality of index generators, each coupled to the array, each associated with a different lane of the plurality of lanes, and each producing a hash index for the associated lane based on the associated lane data bytes;
wherein each hash index operates as an address of one of a plurality of array elements read by the control logic, the plurality of array elements being read within a time needed for the data compression apparatus to receive a number of bytes equal to a number of the plurality of lanes; and
wherein if at least two array elements read each indicates a corresponding valid hash memory entry in one same lane, and a read of at least one hash memory entry corresponding to one of the at least two array elements is performed if data from a preceding read of a hash memory entry corresponding to another of the at least two array elements does not match the lane data bytes.

6. The data compression apparatus of claim 5,
wherein each of the at least two array elements further comprises a location within the data stream of previously received data; and
wherein each read of a hash memory entry is performed in ascending location order based at least in part upon the locations stored within the at least two array elements.

7. The data compression apparatus of claim 5,
wherein each of the at least two array elements further comprises a location within the data stream of previously received data; and
wherein each valid hash memory entry is read if a corresponding array element of the at least two array elements includes a location within the data stream associated with the same one lane that is offset from the location within the data stream of the lane data bytes by no more than a maximum value.

8. The data compression apparatus of claim 1, further comprising:
a plurality of index generators, each coupled to the array, each associated with a different lane of the plurality of lanes, and each producing a hash index for the associated lane based on the associated lane data bytes;
wherein each hash index operates as an address of a hash memory entry for the associated lane; and
wherein the data read from the valid hash memory entry comprises at least some of the bits of the previously received data.

9. The data compression apparatus of claim 8,
wherein each of the plurality of index generators implements an irreducible polynomial; and
wherein the number of bits of data stored within the valid hash memory entry is equal to or greater than the bit-width of the associated lane minus the number of bits of the hash index.

10. The data compression apparatus of claim 1, wherein the array comprises one or more devices selected from the group consisting of a flip-flop, a random access memory and a field programmable gate array.

11. A data compression method performed by a compression engine, the data compression method comprising:
associating a plurality of hash memories each with a different lane of a plurality of lanes, each lane comprising data bytes of an incoming data stream being received by a compression apparatus;
storing a plurality of validity bits within each of a plurality of array elements, wherein each validity bit within an array element corresponds to a different lane of the plurality of lanes;
initiating a read of a hash memory entry if a validity bit that corresponds to the lane associated with the hash memory entry indicates that said hash memory entry is valid; and
compressing at least the data bytes for the lane associated with the hash memory comprising the valid hash memory entry if said valid hash memory entry comprises data that matches the data bytes for the lane.

12. The method of claim 11, further comprising compressing at least some received data comprising the lane data bytes by replacing the at least some received data with a code word that points to a location within the data stream comprising previously received data, wherein the valid hash memory entry further comprises the location of the previously received data.

13. The method of claim 12, further comprising compressing the lane data bytes if a location within the data stream of the lane data bytes is offset from the location of the previously received data by no more than a maximum value.

14. The method of claim 11, further comprising initiating concurrent hash memory entry reads for at least two of the plurality of hash memories if the validity bit corresponding to the hash memory entry and lane of each of the at least two hash memories indicates that each of said hash memory entries is valid in different lanes.

15. The method of claim 11, further comprising:
producing a hash index for each of the plurality of lanes based on the associated lane data bytes; and
reading an array element for each of the plurality of lanes using each hash index as an address of the array element within a corresponding lane;
wherein each of the plurality of array elements is read within the time needed for the data compression apparatus to receive a number of bytes equal to a number of the plurality of lanes; and
wherein if at least two array elements read each indicates a corresponding valid hash memory entry in one same lane, a read of at least one hash memory entry corresponding to one of the at least two array elements is performed if data from a preceding read of a hash memory entry corresponding to another of the at least two array elements does not match the lane data bytes.

16. The method of claim 15, further comprising performing each read of a hash memory entry in ascending location order based at least in part upon a location stored within each of the at least two array elements, wherein each location comprises a location within the data stream of previously received data.

17. The method of claim 15, further comprising reading each valid hash memory entry if a corresponding array element of the at least two array elements includes a location within the data stream associated with the same one lane that is offset from the location within the data stream of the lane data bytes by no more than a maximum value, wherein each location comprises a location within the data stream of previously received data.

18. The method of claim 11, further comprising:
producing a hash index for each of the plurality of lanes based on the associated lane data bytes; and
reading a hash memory entry for a corresponding lane using each hash index as an address of the entry, the data read from the valid hash memory entry comprising at least some of the bits of the previously received data.

19. The method of claim 18,
wherein each hash index is produced by an irreducible polynomial; and
wherein the number of bits of data stored within the valid hash memory entry is equal to or greater than a bit-width of the associated lane minus the number of bits of the hash index.

* * * * *